(12) United States Patent
Yamazaki et al.

(10) Patent No.: US 7,528,418 B2
(45) Date of Patent: May 5, 2009

(54) LIGHT-EMITTING DEVICE

(75) Inventors: Shunpei Yamazaki, Tokyo (JP);
Junichiro Sakata, Kanagawa (JP);
Takahiro Kawakami, Kanagawa (JP);
Yoshiaki Yamamoto, Kanagawa (JP);
Miki Katayama, Kanagawa (JP); Kohei Yokoyama, Kanagawa (JP); Yasuyuki Arai, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 142 days.

(21) Appl. No.: 11/707,414

(22) Filed: Feb. 16, 2007

(65) Prior Publication Data

US 2007/0200112 A1 Aug. 30, 2007

(30) Foreign Application Priority Data

Feb. 24, 2006 (JP) ............................. 2006-049322

(51) Int. Cl.
*H01L 33/00* (2006.01)
(52) U.S. Cl. .................... 257/96; 257/79; 257/E33.013
(58) Field of Classification Search .................. 257/96, 257/79, 183, E33.013
See application file for complete search history.

(56) References Cited

U.S. PATENT DOCUMENTS

| 5,548,127 | A  | * | 8/1996  | Shakuda ....................... 257/13 |
| 6,013,384 | A  |   | 1/2000  | Kido et al.                           |
| 6,423,429 | B2 |   | 7/2002  | Kido et al.                           |
| 6,872,472 | B2 |   | 3/2005  | Liao et al.                           |
| 2001/0046611 | A1 |   | 11/2001 | Kido et al.                         |
| 2002/0134989 | A1 | * | 9/2002  | Yao et al. .................... 257/103 |
| 2002/0173068 | A1 | * | 11/2002 | Kido et al. ..................... 438/99 |
| 2003/0107311 | A1 | * | 6/2003  | Radigan et al. ............. 313/495 |
| 2003/0127967 | A1 |   | 7/2003  | Tsutsui et al.                      |
| 2003/0189401 | A1 |   | 10/2003 | Kido et al.                         |
| 2003/0218173 | A1 |   | 11/2003 | Nishi et al.                        |
| 2004/0027059 | A1 |   | 2/2004  | Tsutsui                             |
| 2004/0150333 | A1 |   | 8/2004  | Tsutsui                             |
| 2004/0263499 | A1 |   | 12/2004 | Tanada et al.                       |
| 2005/0123751 | A1 |   | 6/2005  | Tsutsui et al.                      |
| 2005/0134173 | A1 |   | 6/2005  | Tsutsui et al.                      |
| 2005/0156197 | A1 |   | 7/2005  | Tsutsui et al.                      |
| 2005/0184659 | A1 | * | 8/2005  | Ibe ............................. 313/506 |
| 2006/0214152 | A1 |   | 9/2006  | Seo et al.                          |
| 2007/0138637 | A1 | * | 6/2007  | Prakash ...................... 257/752 |

FOREIGN PATENT DOCUMENTS

JP   2003-045676   2/2003
JP   2005-336275   12/2005

* cited by examiner

*Primary Examiner*—Victor A Mandala
(74) *Attorney, Agent, or Firm*—Cook Alex Ltd.

(57) ABSTRACT

It is an object of the present invention to provide a light-emitting device with high current efficiency and high display quality, in which a change in luminance with time is suppressed. The light-emitting device is provided with a plurality of light-emitting elements in each of which a plurality of light-emitting units each including at least one light-emitting layer are connected in series between a pair of electrodes. Between one of light-emitting units and the other light-emitting unit, an intermediate conductive layer is provided in the light-emitting unit. The light-emitting layer includes base material which is a compound containing an element belonging to group 2 and an element belonging to group 16 or a compound containing an element belonging to group 12 and an element belonging to group 16, and an impurity element which is an emission center. This structure makes it possible to increase light emission luminance without increasing current density.

49 Claims, 23 Drawing Sheets

250

208

303

350

LIGHT-EMITTING DEVICE

BACKGROUND OF THE INVENTION

1. Field of the Invention

The present invention relates to a light-emitting device utilizing electroluminescence. In particular, the present invention relates to a structure of a pixel portion which forms a display screen.

2. Description of the Related Art

Conventionally, an organic EL (Electro Luminescence) element which emits light at a luminance of 100 to 1000 $cd/m^2$ by application of a voltage of approximately 10 V between a pair of electrodes has been known. The organic EL element can be formed to be thin and light; therefore, the organic EL element has been expected to be applied to a display device or a lighting device. However, the need for further increase in luminance or suppression of deterioration has been pointed out for practical use of the organic EL element.

A light-emitting element has been proposed, in which luminance per unit area is substantially increased by a stacked plurality of light-emitting units and application of a current with the same current density as in a case of a single-layered light-emitting unit in an organic EL element, whereby current efficiency is increased and luminance per unit area is increased (see Patent Document 1: Japanese Published Patent Application No. 2003-45676).

According to this light-emitting element in which the light-emitting units are stacked, the same luminance as that of a regular light-emitting element including a single-layered light-emitting unit can be obtained even if current density is reduced by half. For example, when luminance of n times is desired to be obtained at desired current density, if the number of light-emitting units having the same structure between electrodes is n, it is considered that the luminance of n times can be realized without increasing the current density. At this time, a driving voltage of n times or more is required; however, the light-emitting element is highly advantageous in that it can realize the luminance of n times without sacrificing the life.

SUMMARY OF THE INVENTION

However, crosstalk between adjacent pixels becomes problematic in a display device in which a pixel is formed of a light-emitting element including a plurality of light-emitting units that are stacked and the pixels are aligned in matrix at a pitch of several ten micrometers. That is to say, current flows through adjacent light-emitting elements due to an intermediate conductive layer provided between one of light-emitting units and the other light-emitting unit. Since the intermediate conductive layer is conductive, if the intermediate conducive layer is exposed from the light-emitting unit, a short circuit defect occurs with increased frequency in the portion.

It is an object of the present invention to provide a light-emitting device in which generation of crosstalk between adjacent light-emitting elements is suppressed. It is another object of the present invention to suppress generation of a short circuit defect in a light-emitting device in which a pixel is formed of a light-emitting element including a plurality of light-emitting units that are stacked. It is another object of the present invention to provide a light-emitting device with high current efficiency and high display quality.

One feature of the present invention is a light-emitting device provided with a plurality of light-emitting elements in each of which a plurality of light-emitting units each including at least one light-emitting layer are connected in series between a pair of electrodes. Between one of the light-emitting units and the other light-emitting unit, an intermediate conductive layer is provided in the light-emitting unit. The light-emitting layer includes a base material which is a compound containing an element belonging to group 2 and an element belonging to group 16 or a compound containing an element belonging to group 12 and an element belonging to group 16, and an impurity element which is an emission center.

Another feature of the present invention is a light-emitting device, in which a light-emitting element in which a plurality of light-emitting units each including at least one light-emitting layer are connected in series between a pair of electrodes is provided in each pixel and a pixel portion including the pixels aligned in matrix is provided. An intermediate conductive layer is provided between one of the light-emitting units and the other light-emitting unit. The light-emitting layer includes a base material which is a compound containing an element belonging to group 2 and an element belonging to group 16 or a compound containing an element belonging to group 12 and an element belonging to group 16, and an impurity element which is an emission center. The light-emitting layer is formed continuously between adjacent pixels and the intermediate conductive layer is formed in each pixel.

Another feature of the present invention is a light-emitting device, in which a light-emitting element in which a plurality of light-emitting units each including at least one light-emitting layer are connected in series between a pair of electrodes is provided in each pixel and a pixel portion including the pixels aligned in matrix is provided. An intermediate conductive layer is provided between one of the light-emitting units and the other light-emitting unit. The pixel portion has a partition layer which covers peripheral edges of one of the pair of electrodes. The light-emitting layer includes a base material which is a compound containing an element belonging to group 2 and an element belonging to group 16 or a compound containing an element belonging to group 12 and an element belonging to group 16, and an impurity element which is an emission center. The light-emitting layer is continuously formed over one of the pair of electrodes and the partition layer. The intermediate conductive layer is formed over one of the pair of electrodes, and edges of the intermediate conductive layer are positioned over the partition layer.

In the present invention, a light-emitting unit typically includes one or plural layers including a base material containing an element belonging to group 12 and an element belonging to group 16 of the periodic table and an impurity element which forms an emission center. The light-emitting unit indicates an element in which a pair of electrodes and an intermediate conductive layer are removed. For example, the light-emitting unit may include a light-emitting layer including a base material containing an element belonging to group 12 and an element belonging to group 16 of the periodic table and an impurity element which forms an emission center and carrier transporting layers (such as a hole transporting layer and an electron transporting layer) or carrier injecting layers (such as a hole injecting layer and an electron injecting layer) between which the light-emitting layer is interposed.

The intermediate conductive layer is interposed between one of light-emitting units and the other light-emitting unit, and has a function of injecting holes into a cathode direction of an element and injecting electrons into an anode direction thereof when one of a pair of electrodes is an anode and the other is a cathode.

A light-emitting device includes a device provided with a light-emitting element and a function of controlling light emission and non light emission of the light-emitting element, and includes a display medium in which a pixel is formed of the light-emitting element and an image or the like is displayed and a light source (including a lighting device) in the category. In addition, the light-emitting element also includes a module in which a connector such as an FPC (Flexible Printed Circuit), a TAB (Tape Automated Bonding) tape, or a TCP (Tape Carrier Package) is attached to a panel where a light-emitting element shown in this specification is formed, a module where an end of the TAB tape or the TCP is provided with a printed wiring board, or a module where an IC (Integrated Circuit) is directly mounted on a light-emitting element by a COG (Chip On Glass) method.

According to the present invention, by the provision of an intermediate conductive layer between one of light-emitting units and the other light-emitting unit, light emission luminance can be increased without increasing current density. In addition, by the provision of the intermediate conductive layer in one of the light-emitting units and the other light-emitting unit, a leak current between adjacent light-emitting elements can be suppressed. That is to say, in a display device in which pixels are aligned in matrix, generation of crosstalk between the pixels can be suppressed.

DETAILED DESCRIPTION OF THE INVENTION

Embodiment Mode

Hereinafter, embodiment modes of the present invention will be explained with reference to the drawings. However, the present invention can be carried out in many different modes, and it is easily understood by those skilled in the art that modes and details of the present invention can be modified in various ways without departing from the scope and the purpose of the present invention. Therefore, the present invention is not interpreted as being limited to the description of the embodiment modes.

Embodiment Mode 1

Figure 1A:
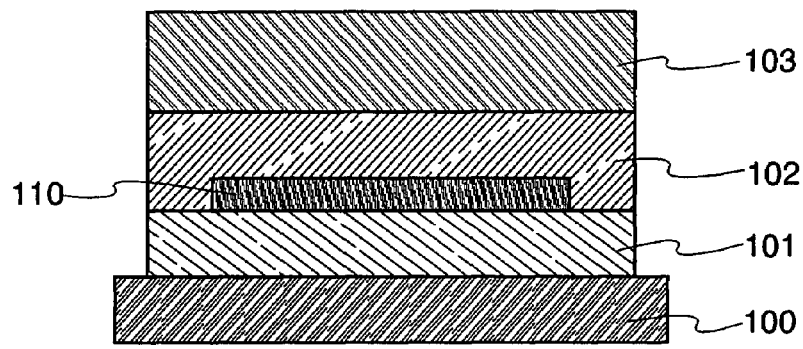
FIGS. 1A to 1C are cross-sectional views of a light-emitting device of the present invention.
Figure 1B:
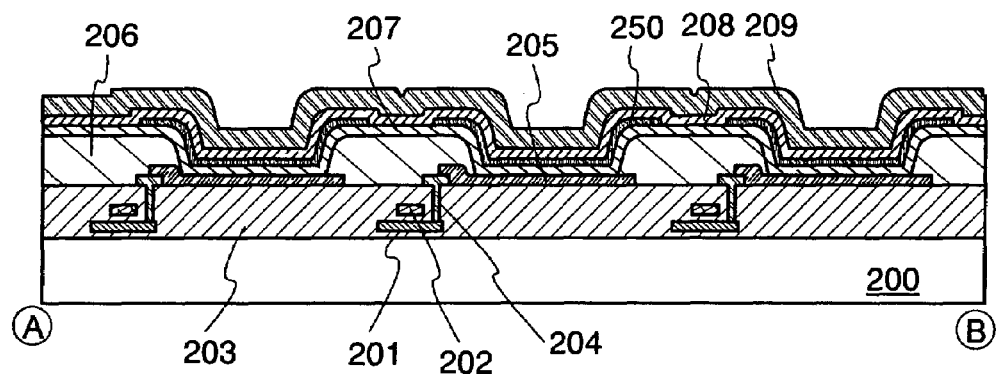
Figure 1C:
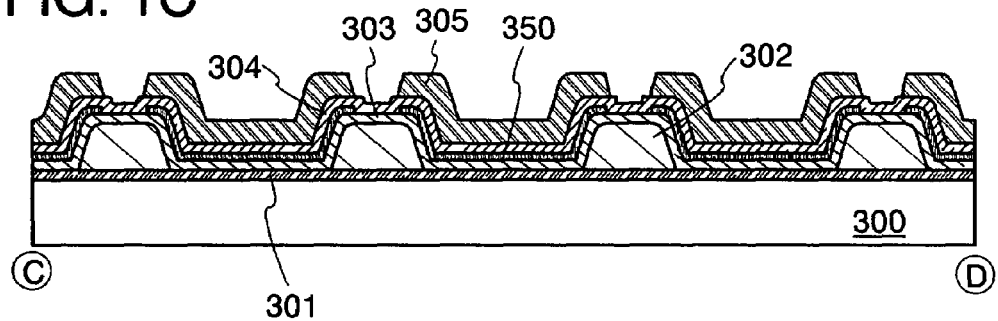

FIGS. 1A to 1C are views each explaining a structure of a light-emitting device of this embodiment mode. FIG. 1A shows a structure of a light-emitting element which forms a pixel in the light-emitting device. This light-emitting element includes a first electrode 100, a first light-emitting unit 101, a second light-emitting unit 102, a second electrode 103, and an intermediate conductive layer 110. The intermediate conductive layer 110 is provided between the first light-emitting unit 101 and the second light-emitting unit 102. Edges of the intermediate conductive layer 110 are covered with the first light-emitting unit 101 or the second light-emitting unit 102 to be separated in each pixel.

The first electrode 100 and the second electrode 103 can be formed using a metal, an alloy, an electric conductive compound, a mixed metal, compound, or alloy of these. For example, a conductive metal such as aluminum (Al), silver (Ag), gold (Au), platinum (Pt), nickel (Ni), tungsten (W), chromium (Cr), molybdenum (Mo), lithium (Li), cesium (Cs), magnesium (Mg), calcium (Ca), strontium (Sr), or titanium (Ti); an alloy of these such as aluminum-silicon (Al—Si), aluminum-titanium (Al—Ti), or aluminum-silicon-copper (Al—Si—Cu); a nitride of a metal material such as titanium nitride (TiN); a conductive metal oxide formed by a sputtering method using a target such as indium oxide-tin oxide (ITO: indium tin oxide) or indium oxide-zinc oxide in which 2 to 20 wt % of zinc oxide (ZnO) is mixed into indium oxide (IZO: indium zinc oxide); or the like can be used. It is to be noted that one of the first electrode 100 and the second electrode 103 serves as an anode and the other serves as a cathode.

The first light-emitting unit 101 and the second light-emitting unit 102 include at least a light-emitting layer containing a light-emitting substance.

A light-emitting material which is suitable for the light-emitting layer of the light-emitting unit will be explained. The light-emitting material shown here is a base material and a material including at least one or more kinds of impurity elements which become an emission center. It is to be noted that these impurity elements do not include an element included in the base material.

As an inorganic material, the following can be used for the base material used for the light-emitting material: a sulfide, an oxide, and a nitride. As a sulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As an oxide, for example, zinc oxide (ZnO), yttrium oxide ($Y_2O_3$), or the like can be used. As a nitride, for example, aluminum nitride (AlN), gallium nitride (GaN), indium nitride (InN), or the like can be used. In addition, zinc selenide (ZnSe), zinc telluride (ZnTe), or the like can be used. Moreover, ternary mixed crystal such as calcium gallium sulfide ($CaGa_2S_4$), strontium gallium sulfide ($SrGa_2S_4$), or barium gallium sulfide ($BaGa_2S_4$) may be used.

As the impurity element, a metal element such as manganese (Mn), copper (Cu), samarium (Sm), terbium (Th), erbium (Er), thulium (Tm), europium (Eu), cerium (Ce), or praseodymium (Pr) can be used for a material which forms an emission center utilizing inner-shell electron transition in a metal ion. Further, a halogen element such as fluorine (F) or chlorine (Cl) may be added for charge compensation.

A light-emitting material containing a first impurity element and a second impurity element can be used as an emission center utilizing donor-acceptor recombination. As the first impurity element, for example, a metal element such as copper (Cu), silver (Ag), gold (Au), or platinum (Pt); silicon; or the like can be used. As the second impurity element, for example, fluorine (F), chlorine (Cl), bromine (Br), iodine (I), boron (B), aluminum (Al), gallium (Ga), indium (In), thallium (Tl), or the like can be used.

In the light-emitting material, the impurity element is contained in the base material through a solid phase reaction, that is, by a method in which the base material and the impurity element are weighed, mixed in a mortar, and the mixture is heated in an electronic furnace to be reacted. For example, each of the base material, the first impurity element or a compound containing the first impurity element, and the second impurity element or a compound containing the second impurity element is weighed, mixed in a mortar, and then, the mixture is heated and baked in an electronic furnace. A baking temperature is preferably 700 to 1500° C. This is because the solid reaction does not proceed when the temperature is too low and the base material is decomposed when the temperature is too high. Although the baking may be performed in powder form, the baking is preferably performed in pellet form.

As an impurity element in a case of utilizing a solid phase reaction, a compound containing the first impurity element and the second impurity element may be used. In this case, the impurity element is easily dispersed and the solid phase reaction easily proceeds; therefore, a uniform light-emitting material can be obtained. Furthermore, since an unnecessary impurity element is not contained, a light-emitting material with high purity can be obtained. As the compound containing the first impurity element and the second impurity element, for example, copper fluoride ($CuF_2$), copper chloride (CuCl), copper iodide (CuI), copper bromide (CuBr), copper nitride ($Cu_3N$), copper phosphide ($Cu_3P$), silver fluoride (AgF), silver chloride (AgCl), silver iodide (AgI), silver bromide (AgBr), gold chloride ($AuCl_3$), gold bromide ($AuBr_3$), platinum chloride ($PtCl_2$), or the like can be used. In addition, a light-emitting material containing a third impurity element instead of the second impurity element may be used.

As the third impurity element, for example, lithium (Li), sodium (Na), potassium (K), rubidium (Rb), cesium (Cs), nitrogen (N), phosphorus (P), arsenic (As), antimony (Sb), bismuth (Bi), or the like can be used. A concentration of these impurity elements may be in a range of 0.01 to 10 mol %, preferably, in a range of 0.1 to 5 mol % with respect to the base material.

As a light-emitting material having high electric conductivity, a light-emitting material in which the above-described material is used as a base material and the above-described first to third impurity elements are contained can be used. A concentration of these impurity elements may be in a range of 0.01 to 10 mol %, preferably, in a range of 0.1 to 5 mol % with respect to the base material.

As a compound including the second impurity element and the third impurity element, for example, alkali halide such as lithium fluoride (LiF), lithium chloride (LiCl), lithium iodide (LiI), copper bromide (CuBr), or sodium chloride (NaCl); boron nitride (BN), aluminum nitride (AlN), aluminum antimonide (AlSb), gallium phosphide (GaP), gallium arsenide (GaAs), indium phosphoride (InP), indium arsenide (InAs), indium antimonide (InSb), or the like can be used.

A light-emitting layer using the light-emitting material in which the above-described material is used as the base material and the above-described first to third impurity elements can emit light without a hot electron accelerated by a high electric field. That is to say, it is not necessary to apply a high voltage to the light-emitting element; therefore, a light-emitting element which can be operated at a low driving voltage can be obtained. In addition, light emission is possible at a low driving voltage, and thus, a light-emitting element with reduced power consumption can be obtained. Moreover, the element which becomes another emission center may be contained.

In addition, a light-emitting material in which the above-described material is used as the base material and the second and third impurity elements and the emission center utilizing inner-shell electron transition of the metal ion described above are contained can be used. In this case, it is preferable that the metal ion which becomes the emission center be 0.05 to 5 atomic % with respect to the base material. In addition, the concentration of the second impurity element is preferably 0.05 to 5 atomic % with respect to the base material. Moreover, the concentration of the third impurity element is preferably 0.05 to 5 atomic % with respect to the base material. The light-emitting material having such a structure can emit light at a low voltage. Therefore, a light-emitting element which can emit light at a low driving voltage can be obtained, and thus, a light-emitting element with reduced power consumption can be obtained. Moreover, the element which becomes another emission center may be contained.

For example, as the light-emitting material disclosed in Japanese Published Patent Application No. 2005-336275, it is possible to use a light-emitting material which contains ZnS as a base material, Cu as a first impurity element, Cl and Ga as second impurity elements, and As as a third impurity element, and further contains Mn as another emission center. The following method can be used for forming such a light-emitting material. Mn is added to a luminous body (ZnS:Cu, Cl) in which copper sulfate (CuS), sulfur, and zinc oxide (ZnO) are mixed in ZnS, and baking is performed in vacuum for about 2 to 4 hours. The baking temperature is preferably 700 to 1500° C. This baked material is ground to have a grain diameter of 5 to 20 μm, and GaAs having a grain diameter of 1 to 3 μm is added thereto, and the mixture is agitated. This mixture is baked in a nitrogen gas stream containing a sulfur gas at approximately 500 to 800° C. for 2 to 4 hours, whereby a light-emitting material can be obtained. When a thin film is formed with the use of this light-emitting material by an evaporation method or the like, the thin film can be used as a light-emitting layer of a light-emitting element.

An impurity element is further added to the above-described light-emitting material, whereby a crystal system of the light-emitting material can be controlled. As for an impurity which can control the crystal system, GaP, GaAs, GaSb, InP, InAs, InSb, Si, Ge, or the like can be given as a cubic system. As a hexagonal system, GaN and InN can be given. In addition, AlP, AlN, AlSb, or the like can be used. By controlling the crystal system of the light-emitting material, light emission efficiency can be improved.

Figure 21A:
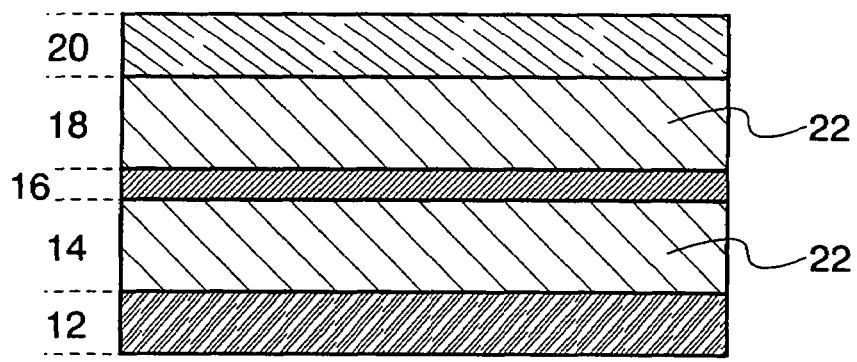
FIGS. 21A to 21C are views each showing a light-emitting cell in which a first electrode, a first light-emitting unit, an intermediate conductive layer, a second light-emitting unit, and a second electrode are stacked.

FIG. 21A shows a light-emitting element in which a first electrode 12, a first light-emitting unit 14, an intermediate conductive layer 16, a second light-emitting unit 18, and a second electrode 20 are stacked. This light-emitting element can emit light by application of a voltage between the first electrode 12 and the second electrode 20.

The first electrode 12 can be formed using various metals, an alloy, a conductive compound, a mixture thereof, or the like. When the first electrode 12 is a transparent electrode, the first electrode 12 is formed using indium oxide-tin oxide (ITO: indium tin oxide), indium oxide-tin oxide containing silicon or silicon oxide, indium oxide-zinc oxide (IZO: indium zinc oxide), indium oxide-tin oxide containing tungsten oxide and zinc oxide, or the like. These conductive metal oxide films can be formed by sputtering. For example, indium oxide-zinc oxide can be formed by sputtering using a target in which 1 to 20 wt % of zinc oxide is mixed with indium oxide. Indium oxide-tin oxide containing tungsten oxide and zinc oxide can be formed by sputtering using a target in which 0.5 to 5 wt % of tungsten oxide and 0.1 to 1 wt % of zinc oxide are mixed with indium oxide. When the first electrode 12 is a metal electrode, aluminum (Al), silver (Ag), gold (Au), platinum (Pt), nickel (Ni), tungsten (W), chromium (Cr), molybdenum (Mo), titanium (Ti), titanium nitride (TiN), or the like can be used.

The second electrode 20 can be formed in a similar manner to the first electrode 12. The second electrode 20 is formed to be paired with the first electrode 12, and thus, when one of the electrodes is a transparent electrode, the other may be formed as a metal electrode. Alternatively, both electrodes may be formed as transparent electrodes.

The first light-emitting unit 14 and the second light-emitting unit 18 are formed of a light-emitting layer 22. This light-emitting layer 22 can be formed using the above-described light-emitting material.

It is preferable that the intermediate conductive layer 16 be formed of a transparent conductive film material such as indium oxide, indium oxide-tin oxide, zinc oxide, or indium oxide-zinc oxide. This is because light emitted from the first light-emitting unit and the second light-emitting unit can be efficiently extracted through the intermediate conductive layer 16.

As another structure of the intermediate conductive layer, a structure in which a hole generating layer and an electron generating layer are stacked may be employed. The hole generating layer can be formed of a composite material of an inorganic compound and an organic compound. As the material which forms the hole generating layer, the inorganic compound shows an electron accepting property to the organic compound, and the organic compound has an excellent hole transporting property. The inorganic compound is not particularly limited; however, a transition metal oxide is preferably used, such as titanium oxide, zirconium oxide, hafnium oxide, vanadium oxide, niobium oxide, tantalum oxide, chromium oxide, molybdenum oxide, tungsten oxide, manganese oxide, or rhenium oxide. An aromatic amine compound typified by TDATA, MTDATA, m-MTDAB, TPD, NPB, DNTPD, or TCTA easily generates holes and is a suitable compound group for the organic compound.

The electron generating layer may contain an organic compound having an electron transporting property and a substance showing an electron donating property to the organic compound. As the organic compound having the electron transporting property, $Alq_3$, $Almq_3$, $BeBq_2$, BAlq, $Zn(BOX)_2$, $Zn(BTZ)_2$, BPhen, BCP, PBD, OXD-7, TPBI, TAZ, p-EtTAZ, or the like can be used. In addition, as the substance showing the electron donating property, an alkali metal or an alkaline earth metal such as lithium, magnesium, calcium, or barium, or an alloy of these is given. Moreover, an alkali metal compound or an alkaline earth metal compound such as lithium oxide, barium oxide, lithium nitride, magnesium nitride, or calcium nitride can be used.

In any event, the intermediate conductive layer 16 interposed between the first light-emitting unit 14 and the second light-emitting unit 18 is acceptable as long as it injects electrons to one of the light-emitting units and injects holes to the other light-emitting unit when a voltage is applied to the first electrode 12 and the second electrode 20.

In FIG. 21A, although the light-emitting element having two light-emitting units is explained, in a similar manner, the explanation can be applied to a light-emitting element in which three or more light-emitting units are stacked. A plurality of light-emitting units are connected to each other by an intermediate conductive layer between a pair of electrodes, whereby light can be emitted with high luminance while keeping current density low and deterioration can be suppressed.

Figure 21B:
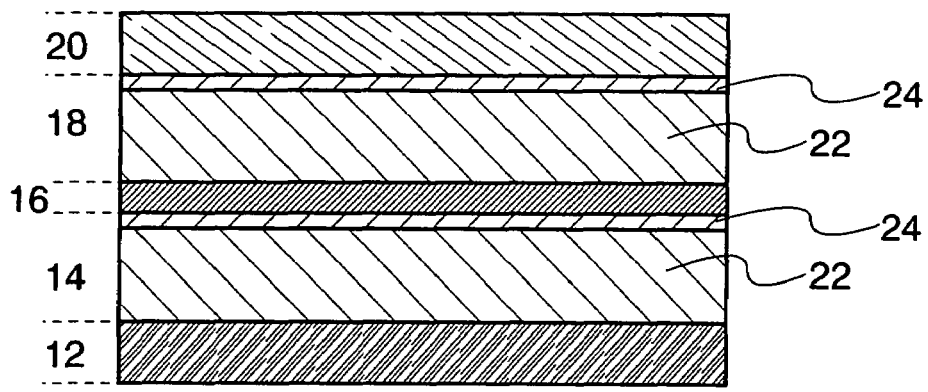

FIG. 21B shows a structure of the first light-emitting unit 14 and the second light-emitting unit 18 in which the light-emitting layer 22 and a barrier layer 24 are combined. It is preferable that the barrier layer 24 be disposed at a cathode side of the light-emitting layer 22. The barrier layer 24 is formed with a thickness of approximately 0.1 to 2 nm, which is the thickness through which a tunnel current flows.

The barrier layer 24 can be formed using an insulating or semi-insulating metal oxide or metal nitride. For example, an oxide or nitride of aluminum, tungsten, chromium, molybdenum, titanium, or the like can be used. A thin film of such a metal oxide or metal nitride can be formed by a sputtering method. Alternatively, the barrier layer 24 can be formed by a method in which a surface of a metal electrode is anodized.

By the provision of the barrier layer 24, recombination of carriers at an interface between the electrode and the light-emitting layer can be prevented. In addition, the barrier layer 24 becomes a barrier against carriers injected into the light-emitting layer, thereby being able to suppress probability that carriers flow into the electrode or the intermediate conductive layer without contributing to light emission. With such a structure, light emission efficiency can be increased. It is to be noted that FIG. 21B shows a case where the first electrode 12 is an anode and the second electrode 20 is a cathode. In a case where the first electrode 12 is a cathode and the second electrode 20 is an anode, the position of the barrier layer 24 is reversed.

Figure 21C:
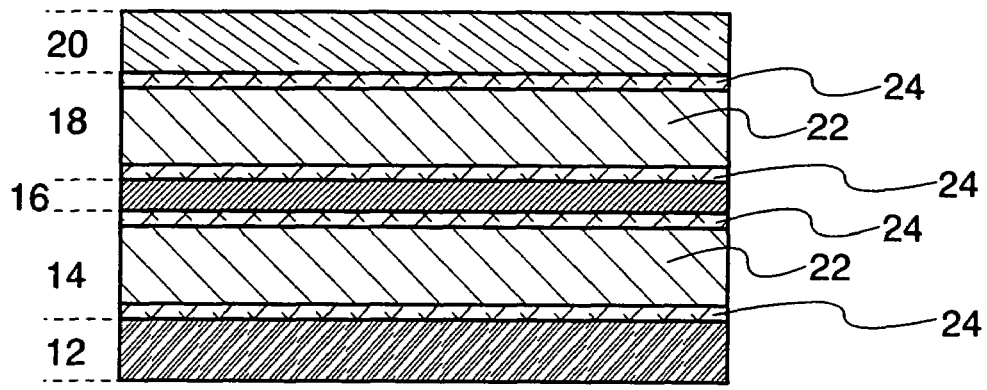

FIG. 21C shows a structure of the first light-emitting unit 14 and the second light-emitting unit 18 in which the barrier layer 24 is provided at each side of the light-emitting layer 22. When the barrier layer 24 is formed with a thickness of approximately 0.1 to 2 nm which is the thickness through which a tunnel current flows, an effect similar to that of FIG. 21B can be obtained. Alternatively, when the barrier layer 24 is formed with a thickness of 10 to 1000 nm, light can be emitted by AC drive.

Figure 22A:
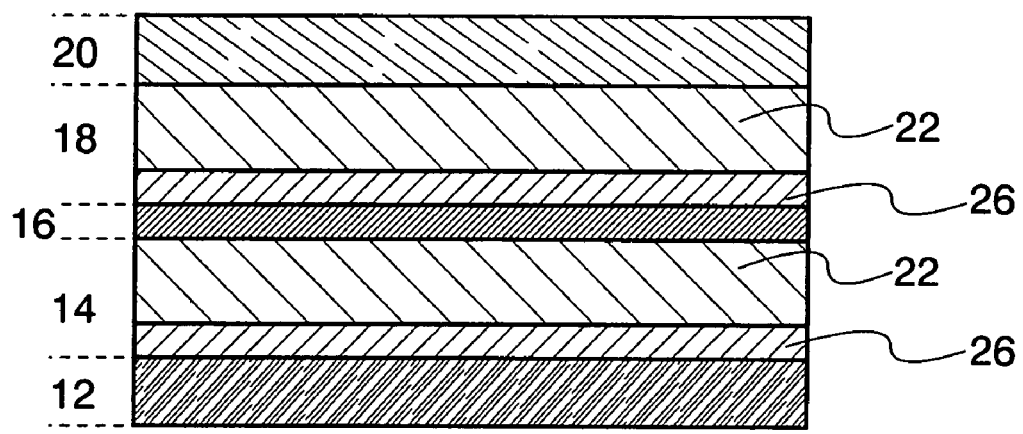
FIGS. 22A and 22B are views each showing a light-emitting cell in which a first electrode, a first light-emitting unit, an intermediate conductive layer, a second light-emitting unit, and a second electrode are stacked.
Figure 22B:
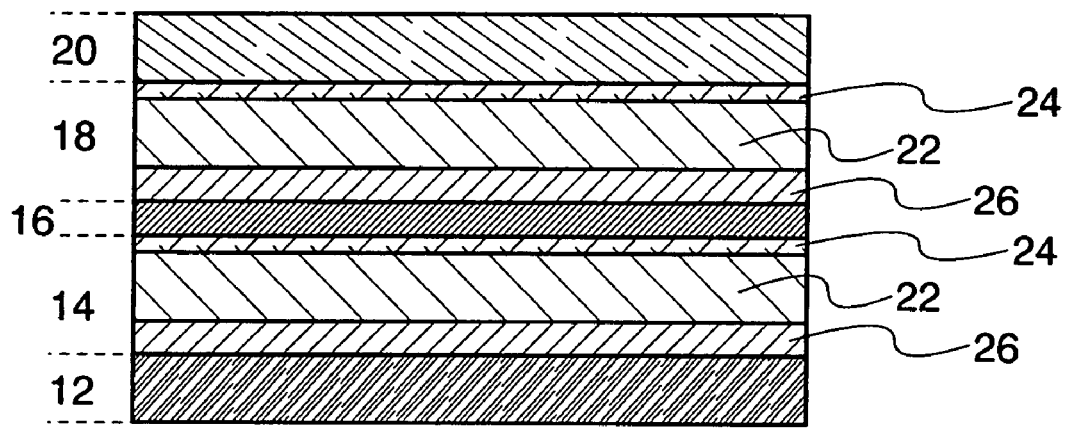

FIGS. 22A and 22B each show a mode in which, in a light-emitting element, an organic-inorganic composite material layer is combined with a light-emitting layer formed of an inorganic material in order to increase a carrier injecting property. In this case as well, the light-emitting element includes a first electrode 12, a first light-emitting unit 14, an intermediate conductive layer 16, a second light-emitting unit 18, and a second electrode 20.

FIG. 22A shows a structure of the first light-emitting unit 14 and the second light-emitting unit 18 in which a light-emitting layer 22 and an organic-inorganic composite material layer 26 are combined. It is preferable that, as a layer injecting holes, the organic-inorganic composite material layer 26 be provided at an anode side of the light-emitting layer 22. FIG. 22A shows a case where the first electrode 12 is an anode and the second electrode 20 is a cathode. In a case where the first electrode 12 is a cathode and the second electrode 20 is an anode, the position of the organic-inorganic composite material layer 26 may be reversed.

The organic-inorganic composite material layer 26 is formed of an organic-inorganic composite material in which an organic compound and an inorganic compound are combined. As an organic compound used for the organic-inorganic composite material, an aromatic amine compound, a carbazole derivative, aromatic hydrocarbon, a high molecular compound (oligomer, dendrimer, polymer, or the like) can be used. Further, it is preferable to use an organic compound having a high hole transporting property as the organic compound used for the organic-inorganic composite material. Specifically, it is preferable to use a substance having a hole mobility of greater than or equal to $1 \times 10^{-6}$ cm$^2$/V·sec. However, other substances may also be used as long as the substances have higher hole transporting property than an electron transporting property. Hereinafter, the organic compound that can be used for the organic-inorganic composite material is exemplified.

As the aromatic amine compound, the following can be given: 4,4'-bis[N-(1-naphthyl)-N-phenylamino]biphenyl (abbreviation: NPB); 4,4'-bis[N-(3-methylphenyl]-N-phenylamino]biphenyl (abbreviation: TPD); 4,4',4"-tris(N,N-diphenylamino)triphenylamine (abbreviation: TDATA), 4,4', 4"-tris[N-(3-methylphenyl)-N-phenylamino]triphenylamine (abbreviation: MTDATA), and the like.

In addition, an organic-inorganic composite material which does not have an absorption peak in a wavelength region of 450 to 800 nm can be obtained by using the following organic compound: for example, N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As a carbazole derivative, the following can be given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Moreover, 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 2,3,5,6-triphenyl-1,4-bis[4-(N-carbazolyl)phenyl]benzene; and the like can also be used.

As aromatic hydrocarbon that can be used for the organic-inorganic composite material which does not have the absorption peak in the wavelength region of 450 to 800 nm, the following can be used: 9,10-di(naphthalene-2-yl)-2-tert-butylanthracene (abbreviation: t-BuDNA); 9,10-di(naphthalene-1-yl)-2-tert-butylanthracene; 9,10-bis(3,5-diphenylphenyl)anthracene (abbreviation: DPPA); 9,10-di(4-phenylphenyl)-2-tert-butylanthracene (abbreviation: t-BuDBA); 9,10-di(naphthalene-2-yl)anthracene (abbreviation: DNA); 9,10-diphenylanthracene (abbreviation: DPAnth); 2-tert-butylanthracene (abbreviation: t-BuAnth); 9,10-di(4-methylnaphthalene-1-yl)anthracene (abbreviation: DMNA); 2-tert-butyl-9,10-bis[2-(naphthalene-1-yl)phenyl]anthracene; 9,10-bis[2-(naphthalene-1-yl)phenyl]anthracene; 2,3,6,7-tetramethyl-9,10-di(naphthalene-1-yl)anthracene; 2,3,6,7-tetramethyl-9,10-di(naphthalene-2-yl)anthracene; 9,9'-bianthryl; 10,10'-diphenyl-9,9'-bianthryl; 10,10'-di(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides, pentacene, coronene, and the like can also be used. It is particularly preferable to use such aromatic hydrocarbon that has a hole mobility of greater than or equal to $1 \times 10^{-6}$ cm$^2$/V·sec and that has 14 to 42 carbon atoms.

The aromatic hydrocarbon that can be used for the organic-inorganic composite material which does not have the absorption peak in the wavelength region of 450 to 800 nm may have a vinyl skeleton. As the aromatic hydrocarbon having a vinyl group, the following can be given, for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

A high molecular compound such as poly(N-vinylcarbazole) (abbreviation: PVK) or poly(4-vinyltriphenylamine) (abbreviation: PVTPA) can also be used.

As the inorganic compound used for the organic-inorganic composite material, a transition metal oxide is preferably used. Moreover, an oxide of metals belonging to groups 4 to 8 of the periodic table is preferably used. Specifically, it is preferable to use vanadium oxide, niobium oxide, tantalum oxide, chromium oxide, molybdenum oxide, tungsten oxide, manganese oxide, and rhenium oxide, because of their high electron accepting properties. Above all, molybdenum oxide is particularly preferable because it is stable in the air, has a low moisture absorption property, and is easily treated.

The organic-inorganic composite material which can be obtained by combining the organic compound and the inorganic compound as described above (making the organic compound and the inorganic compound interact with each other) has superior hole injecting property and hole transporting property. In addition, the organic-inorganic composite material has high conductivity. Accordingly, carriers are easily injected from an electrode and the carriers can be efficiently transported to a light-emitting layer. In addition, the organic-inorganic composite material can have an ohmic contact with a conductive metal oxide and various metals. Moreover, the organic-inorganic composite material which does not have the absorption peak in the wavelength region of 450 to 800 nm is used as the organic-inorganic composite material layer 26, whereby light emission of the light-emitting layer 22 is efficiently transmitted without being absorbed; accordingly, external extraction efficiency can be increased.

In addition, a layer containing the organic-inorganic composite material in which the organic compound and the inorganic compound are combined has high conductivity; therefore, increase in driving voltage can be suppressed even when the layer containing the organic-inorganic composite material is made thick. Thus, it is possible to optimize the thickness of the layer containing the organic-inorganic composite material so that the external extraction efficiency of light becomes high while suppressing increase in driving voltage. Moreover, improvement of color purity by an optical design can be realized without increasing driving voltage.

Any methods can be used as a formation method of the layer containing the organic-inorganic composite material regardless of a wet method and a dry method. For example, the layer containing the organic-inorganic composite material can be formed by co-evaporation of the above-described organic compound and inorganic compound. In addition, the layer containing the organic-inorganic composite material can be formed by application of a solution containing the above-described organic compound and metal alkoxide and by baking. It is to be noted that molybdenum oxide is preferable also in terms of a manufacturing process because it is easily evaporated in vacuum.

In this manner, the organic-inorganic composite material layer 26 is provided between the first electrode 12 (anode) and the light-emitting layer 22 or between the intermediate conductive layer 16 and the light-emitting layer 22, whereby a hole injecting property to the light-emitting layer can be improved. Since a base material for forming the light-emitting layer 22 has n-type conductivity, a carrier injecting property can be increased by combination with the organic-inorganic composite material layer 26 which improves the hole injecting property. Accordingly, a lighting device is capable of lighting at a low voltage, and light emission efficiency can be increased. That is to say, low power consumption can be achieved.

FIG. 22B shows a structure in which one side of the light-emitting layer 22 is provided with the organic-inorganic composite material layer 26 and the other side thereof is provided with the barrier layer 24. The barrier layer 24 can prevent carriers from recombining at an interface between the electrode and the light-emitting layer. In addition, the barrier layer 24 becomes a barrier against carries injected into the light-emitting layer, thereby being able to suppress probability that carriers flow into the electrode or the intermediate conductive layer without contributing to light emission. As described above, the combination of the organic-inorganic composite material layer 26 and the barrier layer 24 makes it possible to increase light emission efficiency.

A transparent conductive film can be used for forming the intermediate conductive layer 110. Specifically, an inorganic conductive film such as indium oxide, indium oxide-tin oxide, or indium oxide-zinc oxide; a metal film which is thin enough to have transparency; a conductive organic compound; or the like is given.

In addition, the intermediate conductive layer 110 may be a stacked body including a layer generating holes and a layer generating electrons, from the side of a layer serving as a cathode. The layer generating holes is formed of a composite material of an inorganic compound and an organic compound. In this layer, the inorganic compound shows an electron accepting property to the organic compound and the organic compound is excellent in a hole transporting property. Although the inorganic compound is not particularly limited, a transition metal oxide is preferably used, and specifically, the following is preferably used: titanium oxide, zirconium oxide, hafnium oxide, vanadium oxide, niobium oxide, tantalum oxide, chromium oxide, molybdenum oxide, tungsten oxide, manganese oxide, or rhenium oxide.

Although the material given before as the material of the hole transporting layer can be used as the organic compound, above all, an aromatic amine compound typified by TDATA, MTDATA, m-MTDAB, TPD, NPB, DNTPD, BBPB, or TCTA easily generates holes, and thus, it is a preferable compound group as the organic compound. Although the layer generating electrons is not particularly limited as long as it can generate electrons, specifically, it is preferable that the layer generating electrons include a layer containing an organic compound having an electron transporting property and a substance showing an electron donating property to the organic compound. As the organic compound having the electron transporting property, $Alq_3$, $Almq_3$, $BeBq_2$, BAlq, $Zn(BOX)_2$, $Zn(BTZ)_2$, BPhen, BCP, PBD, OXD-7, TPBI, TAZ, p-EtTAZ, or the like can be used. As the substance showing the electron donating property, an alkali metal or alkaline earth metal such as lithium, magnesium, calcium, or barium, or an alloy thereof can be given. In addition, an alkali metal compound or alkaline earth metal compound such as lithium oxide, barium oxide, lithium nitride, magnesium nitride, or calcium nitride can be used.

Further, absorption in a visible light region of the intermediate conductive layer 110 is preferably as low as possible. Here, an organic material having a structure as shown by the following general formula is used for the organic compound in the layer generating holes, whereby absorption of visible light in a region generating holes can be decreased.

[Chemical Formula 1]

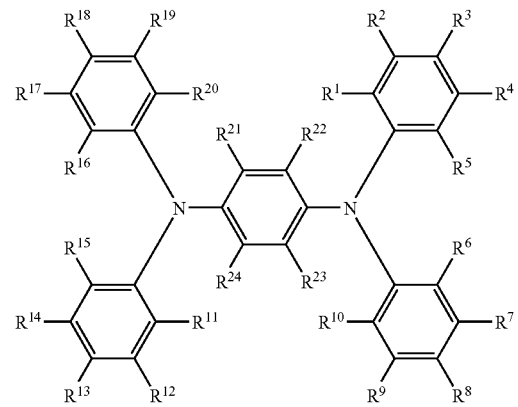

In the formula, R1 to R24 may be the same or different and each of R1 to R24 represents any of hydrogen, an alkyl group, an alkoxy group, an aryl group, or an aryl alkyl group.

[Chemical Formula 2]

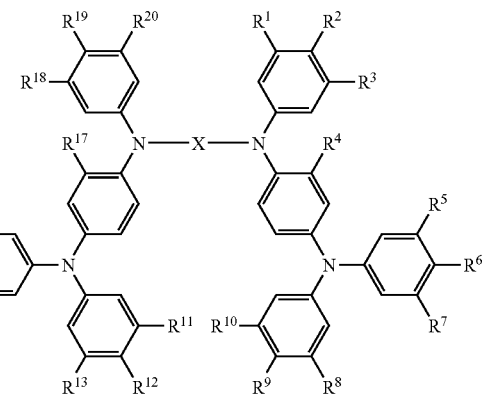

(2)

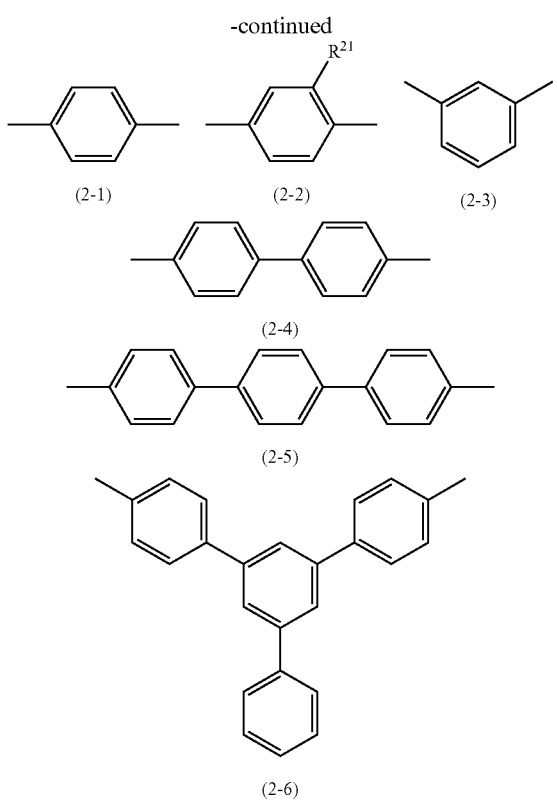

In the formula, X represents any of aromatic hydrocarbon groups represented by structural formulas (2-1) to (2-6), R1 to R20 may be the same or different, and each of R1 to R20 represents any of hydrogen, an alkyl group, an alkoxy group, or an aryl group, and R21 represents an alkyl group.

[Chemical Formula 3]

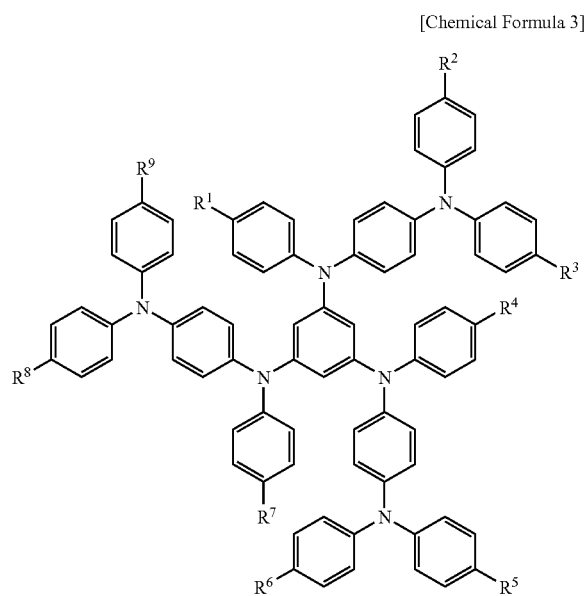

In the formula, R1 to R9 may be the same or different, and each of R1 to R9 represents any of hydrogen, an alkyl group, an alkoxy group, or an aryl group.

In addition, the intermediate conductive layer 110 may be a stacked body including a layer generating holes, a transparent conductive film, and a layer generating electrons, from the side of a layer serving as a cathode.

As described above, the intermediate conductive layer containing the organic compound is used in the light-emitting layer (inorganic light-emitting layer) containing a base material which is a compound containing an element belonging to group 2 and an element belonging to group 16 or a compound containing an element belonging to group 12 and an element belonging to group 16 and an impurity element which is an emission center, whereby a plurality of light-emitting units are connected to each other, and light can be emitted efficiently.

The intermediate conductive layer 110 is provided in each pixel, and edges thereof are covered with the first light-emitting unit 101 and the second light-emitting unit 102; accordingly, generation of crosstalk between pixels is suppressed, and thus, display quality of the light-emitting device is improved. Accordingly, the light-emitting device of this embodiment mode can have high light emission efficiency and high display quality. In addition, the intermediate conductive layer 110 is covered with the first light-emitting unit 101 and the second light-emitting unit 102; accordingly, the second electrode 103 and the intermediate conductive layer 110 are not short-circuited and an initial defect due to the short circuit of the second electrode 103 and the intermediate conductive layer 110 at the edges of the intermediate layer 110 can be eliminated.

It is preferable that the intermediate conductive layer 110 be formed so that edges thereof are disposed outside edges of a light-emitting region (a portion in which light emission is obtained, as seen from the substrate side) in the light-emitting element. In such a light-emitting element used in the light-emitting device of this embodiment mode, desired light emission is obtained only from a region in which the intermediate conductive layer 110 is formed, as seen from the substrate side, and light emission itself is not obtained from a region where the intermediate conductive layer 110 is not formed, or only light emission with very low luminance is obtained. Or, light emission with desired color cannot be obtained. Therefore, when the intermediate conductive layer 110 is formed to coincide with the light-emitting region, slight misalignment causes defects such as decrease in the light-emitting region and deterioration in display quality when forming the intermediate conductive layer 110. However, by when the intermediate conductive layer 110 is formed so that the edges thereof are outside the edges of the light-emitting region, deterioration in display quality can be reduced even if the intermediate conductive layer 110 is formed with a little misalignment. Especially, this is preferably applied to an active matrix light-emitting device or a high-definition passive matrix light-emitting device in which mask alignment has to be carried out very strictly. Thus, deterioration in display quality due to misalignment of a mask or the like can be suppressed.

FIG. 1B is a view showing an example of an active matrix light-emitting device. A thin film transistor including a semiconductor layer 201, a gate insulating film, and a gate electrode 202 is formed over a substrate 200, and a light-emitting element including a first electrode 205, a first light-emitting unit 207, an intermediate conductive layer 250, a second light-emitting unit 208, and a second electrode 209 is formed over the thin film transistor with an interlayer insulating film 203 interposed therebetween. Edges of the first electrode 205 of the light-emitting element are covered with a partition layer 206, and the light-emitting element is formed in a portion where the first electrode 205 is exposed from the partition layer 206. The light-emitting element is electrically connected to the thin film transistor through the electrode 204, and light emission is controlled.

The substrate 200 is used as a supporting body of the thin film transistor or the light-emitting element. As a material of the substrate 200, glass, quartz, plastic (such as polyimide, acrylic, polyethylene terephthalate, polycarbonate, polyacrylate, or polyether sulfone), or the like can be used; however, other materials may also be used for forming the substrate 200 as long as they can be used as the supporting body of the thin film transistor or the light-emitting element.

A single layer or multilayer of a base insulating film may be provided between the substrate 200 and the semiconductor layer 201. The base insulating film is provided in order to prevent elements which adversely affect the characteristic of the semiconductor film, such as an alkali metal or an alkaline earth metal in the substrate 200, from dispersing in the semiconductor layer. As a material of the base insulating film, silicon oxide, silicon nitride, silicon oxide containing nitrogen, silicon nitride containing oxygen, or the like can be used. It is to be noted that the base insulating film is not necessarily provided when dispersion of impurities is not a big problem.

In this embodiment, although the example in which the thin film transistor is a top gate type (staggered type) thin film transistor is shown, the thin film transistor may be a thin film transistor of other shapes such as a bottom gate type (inversely staggered type). This embodiment mode is not limited by a type or a driving method of the transistor which drives the light-emitting element.

The interlayer insulating film 203 is provided in order to prevent electrical contact between the thin film transistor and the light-emitting element in an unnecessary portion and may be a single layer or multilayer. It is preferable that the interlayer insulating film 203 be formed so that at least one layer is formed of a self-planarizing material capable of reducing unevenness generated by the thin film transistor provided in the lower portion. It is desirable that the interlayer insulating film 203 be formed using a material such as acrylic; polyimide; or so-called siloxane that is a material including a skeleton structure formed by a bond of silicon and oxygen, in which, as a substituent, an organic group containing at least hydrogen (such as an alkyl group or an aryl group), a fluoro group, or an organic group and a fluoro group containing at least hydrogen is included. In addition, as other materials, silicon oxide, silicon nitride, silicon oxide containing silicon nitride, silicon nitride containing silicon oxide, a Low-k material, or the like can be used.

The light-emitting element including the first electrode 205, the first light-emitting unit 207, the intermediate conductive layer 250, the second light-emitting unit 208, and the second electrode 209 has the same structure as that of the light-emitting element explained in FIG. 1A. The edges of the first electrode 205 of the light-emitting element are covered with the partition layer 206, and the portion where the first electrode 205 is exposed from the partition layer 206 becomes the light-emitting region of the light-emitting element. A material similar to the material given as the material of the interlayer insulating film 203 can be used for forming the partition layer 206.

The electrode 204 which electrically connects the first electrode 205 of the light-emitting element to the thin film transistor is formed of a single layer or multilayer of aluminum; copper; an alloy of aluminum, carbon, and nickel; an alloy of aluminum, carbon, and molybdenum; or the like. In a case of a multilayer structure, for example, a stacked-layer structure including molybdenum, aluminum, and molybdenum; titanium, aluminum, and titanium; or titanium, titanium nitride, aluminum, and titanium from the thin film transistor side can be applied.

In the light-emitting device of this embodiment mode as shown in FIG. 1B, the intermediate conductive layer 250 in the light-emitting element is provided in each pixel, and edges of the intermediate conductive layer 250 are covered with the first light-emitting unit 207 and the second light-emitting unit 208; therefore, generation of crosstalk between pixels is suppressed and display quality of the light-emitting device is improved. Accordingly, the light-emitting device of this embodiment mode can have high light emission efficiency and high display quality. In addition, the intermediate conductive layer 250 is covered with the first light-emitting unit 207 and the second light-emitting unit 208; therefore, the second electrode 209 and the intermediate conductive layer 250 are not short-circuited at the edges of the intermediate conductive layer 250, and an initial defect due to the short circuit of the second electrode 209 and the intermediate conductive layer 250 can be eliminated.

It is more preferable that the intermediate conductive layer 250 be formed so that edges thereof are disposed outside edges of a light-emitting region (a portion in which light emission is obtained, as seen from the substrate side) in the light-emitting element. In such a light-emitting element used in the light-emitting device of this embodiment mode, desired light emission is obtained only from a region in which the intermediate conductive layer 250 is formed, as seen from the substrate side, and light emission itself is not obtained from a region where the intermediate conductive layer 250 is not formed, or only light emission with low luminance is obtained. Or, light emission with desired color cannot be obtained. Therefore, when the intermediate conductive layer 250 is formed to coincide with the light-emitting region, slight misalignment causes defects such as decrease in the light-emitting region and deterioration in display quality when forming the intermediate conductive layer 250. However, when the intermediate conductive layer 250 is formed so that the edges thereof are outside the edges of the light-emitting region, deterioration in display quality can be reduced even if the intermediate conductive layer 250 is formed with a little misalignment. Especially, this is preferably applied to an active matrix light-emitting device in which mask alignment has to be carried out very strictly. Thus, deterioration in display quality due to misalignment of a mask or the like can be suppressed.

FIG. 1C is a view showing an example of a passive matrix light-emitting device, in which a light-emitting element including a first electrode 301, a first light-emitting unit 303, an intermediate conductive layer 350, a second light-emitting unit 304, and a second electrode 305 is formed over a substrate 300. The light-emitting elements each having the same first electrode 301 are separated from each other by partition layers 302. The substrate 300, the first electrode 301, the first light-emitting unit 303, the intermediate conductive layer 350, the second light-emitting unit 304, the second electrode 305, and the partition layer 302 correspond to, respectively, the substrate 200, the first electrode 205, the first light-emitting unit 207, the intermediate conductive layer 250, the second light-emitting unit 208, the second electrode 209, and the partition layer 206 in FIG. 1B, and a similar material can be used.

In the light-emitting device of this embodiment mode as shown in FIG. 1C, the intermediate conductive layer 350 in the light-emitting element is provided in each pixel, and edges of the intermediate conductive layer 350 are covered with the first light-emitting unit 303 and the second light-emitting unit 304; therefore, generation of crosstalk between pixels is suppressed and display quality of the light-emitting device is improved. Accordingly, the light-emitting device of this embodiment mode can have high light emission efficiency and high display quality. In addition, the intermediate conductive layer 350 is covered with the first light-emitting unit 303 and the second light-emitting unit 304; therefore, the second electrode 305 and the intermediate conductive layer 350 are not short-circuited at the edges of the intermediate conductive layer 350, and an initial defect due to the short circuit of the second electrode 305 and the intermediate conductive layer 350 can be eliminated.

It is more preferable that the intermediate conductive layer 350 be formed so that edges thereof are disposed outside edges of a light-emitting region (a portion in which light emission is obtained, as seen from the substrate side) in the light-emitting element. In such a light-emitting element used in the light-emitting device of this embodiment mode, desired light emission is obtained only from a region in which the intermediate conductive layer 350 is formed, as seen from the substrate side, and light emission itself is not obtained from a region where the intermediate conductive layer 350 is not formed, or only light emission with very low luminance is obtained. Or, light emission with desired color cannot be obtained. Therefore, when the intermediate conductive layer 350 is formed to coincide with the light-emitting region, slight misalignment causes defects such as decrease in the light-emitting region and deterioration in display quality when forming the intermediate conductive layer 350. However, when the intermediate conductive layer 350 is formed so that the edges thereof are outside the edges of the light-emitting region, deterioration in display quality can be reduced even if the intermediate conductive layer 350 is formed with a little misalignment. Especially, this is preferably applied to a high-definition passive matrix light-emitting device in which mask alignment has to be carried out very strictly. Thus, deterioration in display quality due to misalignment of a mask or the like can be suppressed.

Embodiment Mode 2

Figure 2A:
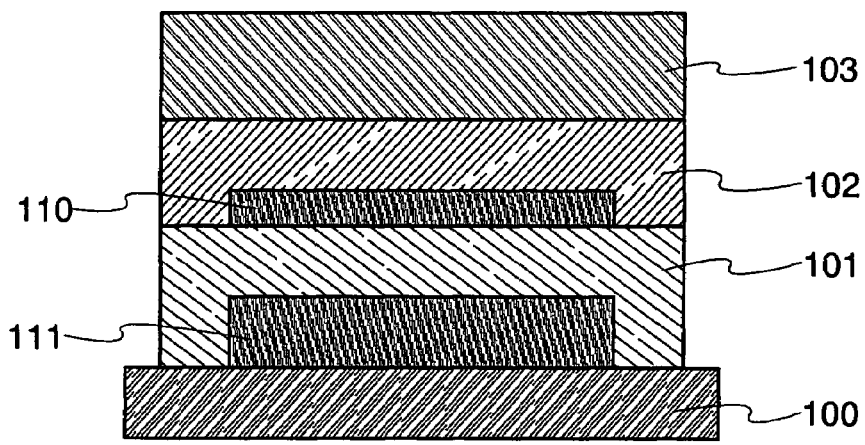
FIGS. 2A to 2C are cross-sectional views of a light-emitting device of the present invention.
Figure 2B:
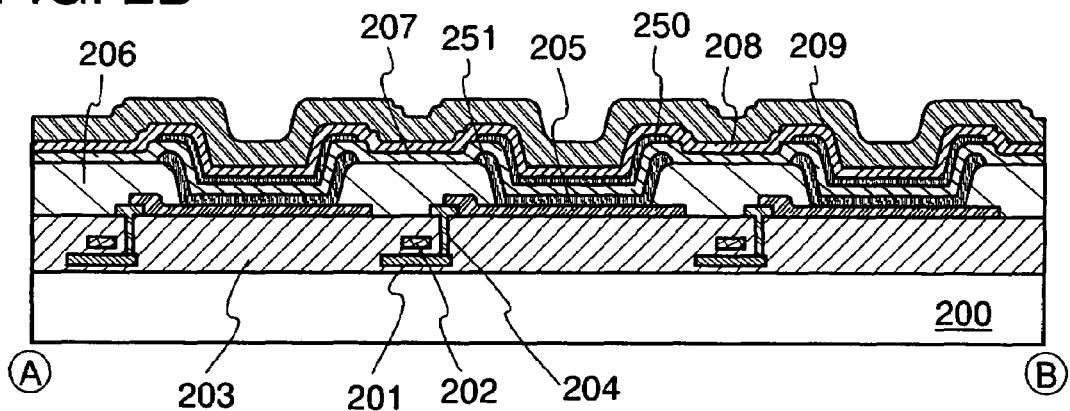
Figure 2C:
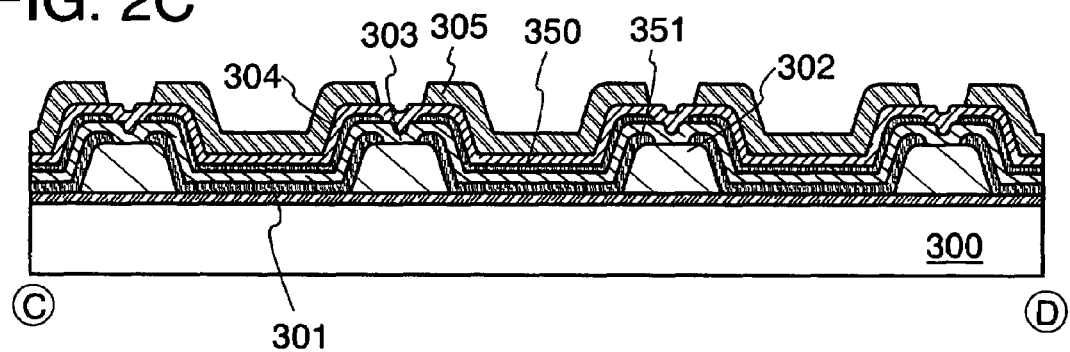

FIGS. 2A to 2C are views each explaining a structure of a light-emitting device of this embodiment mode. FIG. 2A shows one pixel in the light-emitting device, in which a first electrode 100, a first light-emitting unit 101, a second light-emitting unit 102, a second electrode 103, and intermediate conductive layers 110 and 111 are included. In FIG. 2A, each of the first electrode 100, the first light-emitting unit 101, the second light-emitting unit 102, the second electrode 103, and the intermediate conductive layer 110 has exactly the same structure as that in FIG. 1A; therefore, the explanation in FIG. 1A is used. The intermediate conductive layer 111 is separated in each pixel, and the same structure and material as those of the intermediate conductive layer 110 can be used for the intermediate conductive layer 111. Alternatively, the intermediate conductive layer 111 may be formed of only the layer generating holes and the layer generating electrons explained for the structure of the intermediate conductive layer 110 in Embodiment Mode 1.

The light-emitting device of this embodiment mode has a structure in which a plurality of light-emitting units including the first light-emitting unit 101 and the second light-emitting unit 102 are included in a light-emitting element. Therefore, the same luminance can be obtained with less current density in comparison with a case of a single light-emitting unit.

Even if the thickness of the intermediate conductive layer 111 is made large, increase in driving voltage of the light-emitting element is small because the intermediate conductive layer 111 has low resistance in comparison with the light-emitting unit. Therefore, by the provision of the intermediate conductive layer 111 with an appropriate thickness, a light path of light emitted from the light-emitting unit to the first electrode 100 can be controlled. The light path to the first electrode 100 can be controlled, whereby an optical design such as control of color purity or view angle dependency of light emission is possible by a microcavity effect with the use of reflected light generated at an interface of the first electrode 100; thus, display quality can be further improved. Furthermore, the intermediate conductive layer 111 can be made thick; therefore, even when unevenness is generated on a surface of the first electrode 100 for some reason or when there is a foreign substance on the first electrode, unevenness can be reduced and the foreign substance can be covered. Accordingly, a defect (such as a short circuit) caused by unevenness or a foreign substance on the first electrode 100 can be reduced.

The intermediate conductive layer 110 is provided in each pixel, and edges thereof are covered with the first light-emitting unit 101 and the second light-emitting unit 102; therefore, generation of crosstalk between pixels is suppressed and display quality of the light-emitting device is improved. Accordingly, the light-emitting device of this embodiment mode can have high light emission efficiency and high display quality. In addition, the intermediate conductive layer 110 is covered with the first light-emitting unit 101 and the second light-emitting unit 102; accordingly, the second electrode 103 and the intermediate conductive layer 110 are not short-circuited at the edges of the intermediate conductive layer 110, and an initial defect due to the short circuit of the second electrode 103 and the intermediate conductive layer 110 can be eliminated.

It is preferable that the intermediate conductive layer 110 be formed so that edges thereof are disposed outside edges of a light-emitting region (a portion in which light emission is obtained, as seen from the substrate side) in the light-emitting element. In such a light-emitting element used in the light-emitting device of this embodiment mode, desired light emission is obtained only from a region in which the intermediate conductive layer 110 is formed, as seen from the substrate side, and light emission itself is not obtained from a region where the intermediate conductive layer 110 is not formed, or only light emission with very low luminance is obtained. Or, light emission with desired color cannot be obtained. Therefore, when the intermediate conductive layer 110 is formed to coincide with the light-emitting region, slight misalignment causes defects such as decrease in the light-emitting region and deterioration in display quality when forming the intermediate conductive layer 110. However, when the intermediate conductive layer 110 is formed so that the edges thereof are outside the edges of the light-emitting region, deterioration in display quality can be reduced even if the intermediate conductive layer 110 is formed with a little misalignment. Especially, this is preferably applied to an active matrix light-emitting device or a high-definition passive matrix light-emitting device in which mask alignment has to be carried out very strictly. Thus, deterioration in display quality due to misalignment of a mask or the like can be suppressed.

In a similar manner, it is preferable that the intermediate conductive layer 111 be formed so that edges thereof are disposed outside the edges of the light-emitting region (a portion in which light emission is obtained, as seen from the substrate side) in the light-emitting element. Accordingly, even if the intermediate conductive layer 111 is formed with a little misalignment, deterioration in display quality can be suppressed because the intermediate conductive layer 111 can keep covering the light-emitting region.

FIG. 2B is a view showing an example of an active matrix light-emitting device, in which a thin film transistor including a semiconductor layer 201, a gate insulating film, and a gate electrode 202 is formed over a substrate 200, and a light-emitting element including a first electrode 205, an intermediate conductive layer 251, a first light-emitting unit 207, an intermediate conductive layer 250, a second light-emitting unit 208, and a second electrode 209 is formed over the thin film transistor, with an interlayer insulating film 203 interposed therebetween. Edges of the first electrode 205 of the light-emitting element are covered with a partition layer 206, and the light-emitting element is formed in a portion where the first electrode 205 is exposed from the partition layer 206. The light-emitting element is electrically connected to the thin film transistor through an electrode 204, and light emission is controlled. Since the structure of the light-emitting device shown in FIG. 2B is the same as that of the light-emitting device shown in FIG. 1B except the intermediate conductive layer 251, the explanation of FIG. 1B is used. The intermediate conductive layer 251 is separated in each pixel, and the same structure and material as those of the intermediate conductive layer 250 can be used for the intermediate conductive layer 251. Alternatively, the intermediate conductive layer 251 may be formed of only the layer generating holes and the layer generating electrons explained for the structure of the intermediate conductive layer 110 in Embodiment Mode 1.

Even if the thickness of the intermediate conductive layer 251 is made large, increase in driving voltage of the light-emitting element is small because the intermediate conductive layer 251 has low resistance in comparison with the light-emitting unit. Therefore, by the provision of the intermediate conductive layer 251 with the appropriate thickness, a light path of light emitted from the light-emitting unit to the first electrode 205 can be controlled. The light path to the first electrode 205 can be controlled, whereby an optical design such as control of color purity or view angle dependency of light emission is possible by a microcavity effect with the use of reflected light generated at an interface of the first electrode 205; thus, display quality can be further improved. Furthermore, the intermediate conductive layer 251 can be made thick; therefore, even when unevenness is generated on a surface of the first electrode 205 for some reason or when there is a foreign substance on the first electrode, unevenness can be reduced and the foreign substance can be covered. Accordingly, a defect (such as a short circuit) caused by unevenness or a foreign substance on the first electrode 100 can be reduced.

In the light-emitting device of this embodiment mode as shown in FIG. 2B, the intermediate conductive layer 250 in the light-emitting element is provided in each pixel, and edges of the intermediate conductive layer 250 are covered with the first light-emitting unit 207 and the second light-emitting unit 208; therefore, generation of crosstalk between pixels is suppressed and display quality of the light-emitting device is improved. Accordingly, in the light-emitting device of this embodiment mode, light emission efficiency is high and display quality can be improved. In addition, the intermediate conductive layer 250 is covered with the first light-emitting unit 207 and the second light-emitting unit 208; therefore, the second electrode 209 and the intermediate conductive layer 250 are not short-circuited at the edges of the intermediate conductive layer 250, and an initial defect due to the short circuit of the second electrode 209 and the intermediate conductive layer 250 can be eliminated.

It is more preferable that the intermediate conductive layer 250 be formed so that edges thereof are disposed outside edges of a light-emitting region (a portion in which light emission is obtained, as seen from the substrate side) in the light-emitting element. In such a light-emitting element used in the light-emitting device of this embodiment mode, desired light emission is obtained only from a region in which the intermediate conductive layer 250 is formed, as seen from the substrate side, and light emission itself is not obtained from a region where the intermediate conductive layer 250 is not formed, or, only light emission with very low luminance is obtained. Or, light emission with desired color cannot be obtained. Therefore, when the intermediate conductive layer 250 is formed to coincide with the light-emitting region, slight misalignment causes defects such as decrease in the light-emitting region and deterioration in display quality when forming the intermediate conductive layer 250. However, when the intermediate conductive layer 250 is formed so that the edges thereof are outside the edges of the light-emitting region, deterioration in display quality can be reduced even if the intermediate conductive layer 250 is formed with a little misalignment. Especially, this is preferably applied to an active matrix light-emitting device or a high-definition passive matrix light-emitting device in which mask alignment has to be carried out very strictly. Thus, deterioration in display quality due to misalignment of a mask or the like can be suppressed.

In a similar manner, it is preferable that the intermediate conductive layer 251 be formed so that edges thereof are disposed outside the edges of the light-emitting region (a portion in which light emission is obtained, as seen from the substrate side) in the light-emitting element. Accordingly, even if the intermediate conductive layer 251 is formed with a little misalignment, deterioration in display quality can be suppressed because the intermediate conductive layer 251 can keep covering the light-emitting region.

FIG. 2C is a view showing an example of a passive matrix light-emitting device, in which a light-emitting element including a first electrode 301, an intermediate conductive layer 351, a first light-emitting unit 303, an intermediate conductive layer 350, a second light-emitting unit 304, and a second electrode 305 is formed over a substrate 300. The light-emitting elements each having the same first electrode 301 are separated from each other by partition layers 302. In the light-emitting device shown in FIG. 2C, the structure is the same as that of FIG. 1C except the intermediate conductive layer 351; therefore, the explanation of FIG. 1C is used. The intermediate conductive layer 351 is separated in each pixel, and the same structure and material as those of the intermediate conductive layer 350 can be used for the intermediate conductive layer 351. Alternatively, the intermediate conductive layer 351 may be formed of only the layer generating holes and the layer generating electrons explained for the structure of the intermediate conductive layer 110 in Embodiment Mode 1.

In the light-emitting device of this embodiment mode as shown in FIG. 2C, the intermediate conductive layer 350 in the light-emitting element is provided in each pixel, and edges of the intermediate conductive layer 350 are covered with the first light-emitting unit 303 and the second light-emitting unit 304; therefore, generation of crosstalk between pixels is suppressed, and display quality of the light-emitting device is improved. Accordingly, the light-emitting device of this embodiment mode can have high light emission efficiency and high display quality. In addition, the intermediate conductive layer 350 is covered with the first light emitting unit 303 and the second light-emitting unit 304; therefore, the second electrode 305 and the intermediate conductive layer 350 are not short-circuited at the edges of the intermediate conductive layer 350, and an initial defect due to the short circuit of the second electrode 305 and the intermediate conductive layer 350 can be eliminated.

It is more preferable that the intermediate conductive layer 350 be formed so that edges thereof are disposed outside edges of a light-emitting region (a portion in which light emission is obtained, as seen from the substrate side) in the light-emitting element. In such a light-emitting element used in the light-emitting device of this embodiment mode, desired light emission is obtained only from a region in which the intermediate conductive layer 350 is formed, as seen from the substrate side, and light emission itself is not obtained from a region where the intermediate conductive layer 350 is not formed, or only light emission with very low luminance is obtained. Or, light emission with desired color cannot be obtained. Therefore, when the intermediate conductive layer 350 is formed to coincide with the light-emitting region, slight misalignment causes defects such as decrease in the light-emitting region and deterioration in display quality when forming the intermediate conductive layer 350. However, when the intermediate conductive layer 350 is formed so that the edges thereof are outside the edges of the light-emitting region, deterioration in display quality can be reduced even if the intermediate conductive layer 350 is formed with a little misalignment. Especially, this is preferably applied to an active matrix light-emitting device or a high-definition passive matrix light-emitting device in which mask alignment has to be carried out very strictly. Thus, deterioration in display quality due to misalignment of a mask or the like can be suppressed.

In a similar manner, it is preferable that the intermediate conductive layer 351 be formed so that edges thereof are disposed outside the edges of the light-emitting region (a portion in which light emission is obtained, as seen from the substrate side) in the light-emitting element. Accordingly, even if the intermediate conductive layer 251 is formed with a little misalignment, deterioration in display quality can be suppressed because the intermediate conductive layer 251 can keep covering the light-emitting region.

Embodiment Mode 3

Figure 3A:
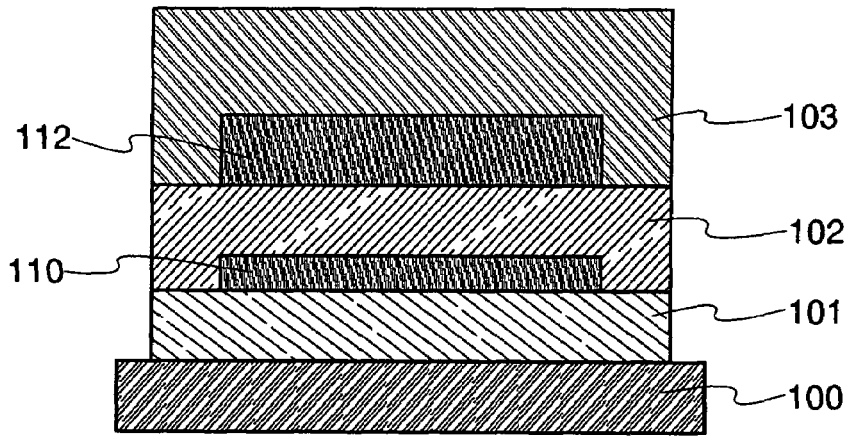
FIGS. 3A to 3C are cross-sectional views of a light-emitting device of the present invention.
Figure 3B:
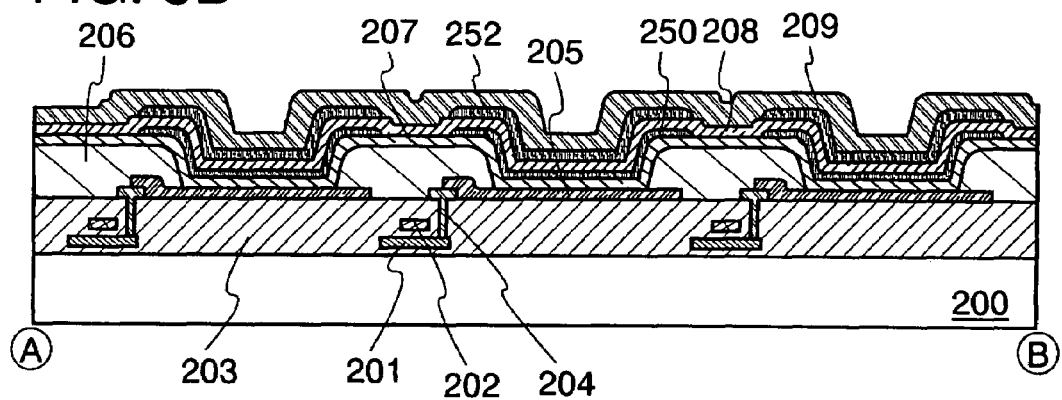
Figure 3C:
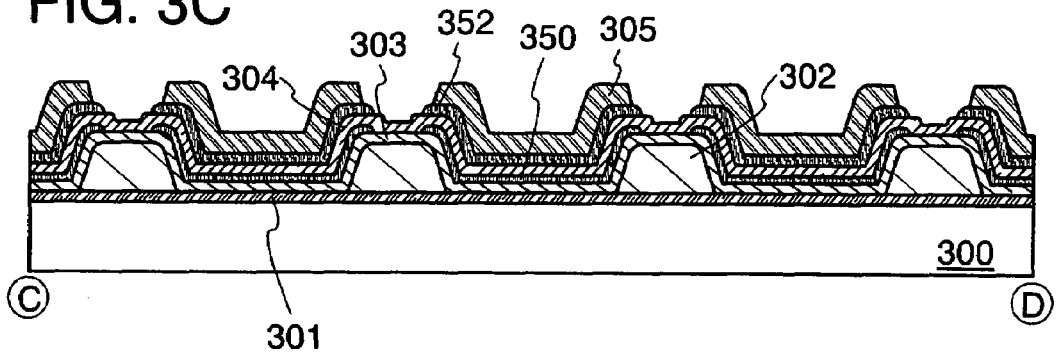

FIGS. 3A to 3C are views each showing a light-emitting device of this embodiment mode. FIG. 3A shows one pixel in the light-emitting device, in which a first electrode 100, a first light-emitting unit 101, a second light-emitting unit 102, a second electrode 103, and intermediate conductive layers 110 and 112 are included. In FIG. 3A, each of the first electrode 100, the first light-emitting unit 101, the second light-emitting unit 102, the second electrode 103, and the intermediate conductive layer 110 has the same structure as that of FIG. 1A; therefore, the explanation of FIG. 1A is used. The intermediate conductive layer 112 is provided between the second light-emitting unit 102 and the second electrode 103, edges thereof are covered with the second light-emitting unit 102 and the second electrode 103, and the intermediate conductive layer 112 is separated in each pixel. The same structure and material as those of the intermediate conductive layer 110 can be used for the intermediate conductive layer 112. Alternatively, the intermediate conductive layer 112 may be formed of only the layer generating holes and the layer generating electrons explained for the structure of the intermediate conductive layer 110 in Embodiment Mode 1.

The light-emitting device of this embodiment mode has a structure in which a plurality of light-emitting units including the first light-emitting unit 101 and the second light-emitting unit 102 are included in a light-emitting element. Therefore, the same luminance can be obtained with less current density in comparison with a case of a single light-emitting unit.

Even if the thickness of the intermediate conductive layer 112 is made large, increase in driving voltage of the light-emitting element is small because the intermediate conductive layer 112 has low resistance in comparison with the light-emitting unit. Therefore, by the provision of the intermediate conductive layer 112 with an appropriate thickness, a light path of light emitted from the light-emitting unit to the second electrode 103 can be controlled. The light path to the second electrode 103 can be controlled, whereby an optical design such as control of color purity or view angle dependency of light emission is possible by a microcavity effect with the use of reflected light generated at an interface of the second electrode 103; thus, display quality can be further improved.

The intermediate conductive layer 110 is provided in each pixel, and edges thereof are covered with the first light-emitting unit 101 and the second light-emitting unit 102; therefore, generation of crosstalk between the pixels is suppressed and display quality of the light-emitting device is improved. Accordingly, the light-emitting device of this embodiment mode can have high light emission efficiency and high display quality. In addition, the intermediate conductive layer 110 is covered with the first light-emitting unit 101 and the second light-emitting unit 102; therefore, the second electrode 103 and the intermediate conductive layer 110 are not short-circuited at the edges of the intermediate conductive layer 110, and an initial defect due to the short circuit of the second electrode 103 and the intermediate conductive layer 110 can be eliminated.

It is more preferable that the intermediate conductive layer 110 be formed so that edges thereof are disposed outside edges of a light-emitting region (a portion in which light emission is obtained, as seen from the substrate side) in the light-emitting element. In such a light-emitting element used in the light-emitting device of this embodiment mode, desired light emission is obtained only from a region in which the intermediate conductive layer 110 is formed, as seen from the substrate side, and light emission itself is not obtained from a region where the intermediate conductive layer 110 is not formed, or only light emission with very low luminance is obtained. Or, light emission with desired color cannot be obtained. Therefore, when the intermediate conductive layer 110 is formed to coincide with the light-emitting region, slight misalignment causes defects such as decrease in the light-emitting region and deterioration in display quality when forming the intermediate conductive layer 110. However, when the intermediate conductive layer 110 is formed so that the edges thereof are outside the edges of the light-emitting region, deterioration in display quality can be reduced even if the intermediate conductive layer 110 is formed with a little misalignment. Especially, this is preferably applied to an active matrix light-emitting device or a high-definition passive matrix light-emitting device in which mask alignment has to be carried out very strictly. Thus, deterioration in display quality due to misalignment of a mask or the like can be suppressed.

In a similar manner, it is preferable that the intermediate conductive layer 112 be formed so that edges thereof are disposed outside the edges of the light-emitting region (a portion in which light emission is obtained, as seen from the substrate side) in the light-emitting element. Accordingly, even if the intermediate conductive layer 112 is formed with a little misalignment, deterioration in display quality can be suppressed because the intermediate conductive layer 112 can keep covering the light-emitting region.

FIG. 3B is a view showing an example of an active matrix light-emitting device, in which a thin film transistor including a semiconductor layer 201, a gate insulating film, and a gate electrode 202 is formed over a substrate 200, and a light-emitting element including a first electrode 205, a first light-emitting unit 207, an intermediate conductive layer 250, a second light-emitting unit 208, an intermediate conductive layer 252, and a second electrode 209 is formed over the thin film transistor, with an interlayer insulating film 203 interposed therebetween. Edges of the first electrode 205 of the light-emitting element are covered with a partition layer 206, and the light-emitting element is formed in a portion where the first electrode 205 is exposed from the partition layer 206. The light-emitting element is electrically connected to the thin film transistor through an electrode 204, and light emission is controlled. Since the structure of the light-emitting device shown in FIG. 3B is the same as that of the light-emitting device shown in FIG. 1B except the intermediate conductive layer 252, the explanation of FIG. 1B is used. The intermediate conductive layer 252 is provided between the second light-emitting unit 208 and the second electrode 209, edges thereof are covered with the second light-emitting unit 208 and the second electrode 209, and the intermediate conductive layer 252 is separated in each pixel. The same structure and material as those of the intermediate conductive layer 250 can be used for the intermediate conductive layer 252. Alternatively, the intermediate conductive layer 252 may be formed of only the layer generating holes and the layer generating electrons explained for the structure of the intermediate conductive layer 110 in Embodiment Mode 1.

Even if the thickness of the intermediate conductive layer 252 is made large, increase in driving voltage of the light-emitting element is small because the intermediate conductive layer 252 has low resistance in comparison with the light-emitting unit. Therefore, by the provision of the intermediate conductive layer 252 with an appropriate thickness, a light path of light emitted from the light-emitting unit to the second electrode 209 can be controlled. The light path to the second electrode 209 can be controlled, whereby an optical design such as control of color purity or view angle dependency of light emission is possible by a microcavity effect with the use of reflected light generated at an interface of the second electrode 209; thus, display quality can be further improved.

In the light-emitting device of this embodiment mode as shown in FIG. 3B, the intermediate conductive layer 250 in the light-emitting element is provided in each pixel, and edges thereof are covered with the first light-emitting unit 207 and the second light-emitting unit 208; therefore, generation of crosstalk between pixels is suppressed and display quality of the light-emitting device is improved. Accordingly, the light-emitting device of this embodiment mode can have high light emission efficiency and high display quality. In addition, the intermediate conductive layer 250 is covered with the first light-emitting unit 207 and the second light-emitting unit 208; therefore, the second electrode 209 and the intermediate conductive layer 250 are not short-circuited at the edges of the intermediate conductive layer 250, and an initial defect due to the short circuit of the second electrode 209 and the intermediate conductive layer 250 can be eliminated.

It is more preferable that the intermediate conductive layer 250 be formed so that edges thereof are disposed outside edges of a light-emitting region (a portion in which light emission is obtained, as seen from the substrate side) in the light-emitting element. In such a light-emitting element used in the light-emitting device of this embodiment mode, desired light emission is obtained only from a region in which the intermediate conductive layer 250 is formed, as seen from the substrate side, and light emission itself is not obtained from a region where the intermediate conductive layer 250 is not formed, or only light emission with very low luminance is obtained. Or, light emission with desired color cannot be obtained. Therefore, when the intermediate conductive layer 250 is formed to coincide with the light-emitting region, slight misalignment causes defects such as decrease in the light-emitting region and deterioration in display quality when forming the intermediate conductive layer 250. However, when the intermediate conductive layer 250 is formed so that the edges thereof are outside the edges of the light-emitting region, deterioration in display quality can be reduced even if the intermediate conductive layer 250 is formed with a little misalignment. Especially, this is preferably applied to an active matrix light-emitting device or a high-definition passive matrix light-emitting device in which mask alignment has to be carried out very strictly. Thus, deterioration in display quality due to misalignment of a mask or the like can be suppressed.

It is preferable that the intermediate conductive layer 252 be formed so that edges thereof are disposed outside the edges of the light-emitting region (a portion in which light emission is obtained, as seen from the substrate side) in the light-emitting element. Accordingly, even if the intermediate conductive layer 252 is formed with a little misalignment, deterioration in display quality can be suppressed because the intermediate conductive layer 252 can keep covering the light-emitting region.

FIG. 3C is a view showing an example of a passive matrix light-emitting device, in which a light-emitting element including a first electrode 301, a first light-emitting unit 303, an intermediate conductive layer 350, a second light-emitting unit 304, an intermediate conductive layer 352, and a second electrode 305 is formed over a substrate 300. The light-emitting elements each having the same first electrode 301 are separated from each other by partition layers 302. In the light-emitting device shown in FIG. 3C, the structure is the same as that of FIG. 1C except the intermediate conductive layer 352; therefore, the explanation of FIG. 1C is used. The intermediate conductive layer 352 is provided between the second light-emitting unit 304 and the second electrode 305, the edges thereof are covered with the second light-emitting unit 304 and the second electrode 305, and the intermediate conductive layer 352 is separated in each pixel. The same structure and material as those of the intermediate conductive layer 350 can be used for the intermediate conductive layer 352. In addition, the intermediate conductive layer 352 may be formed of only the layer generating holes and the layer generating electrons explained for the structure of the intermediate conductive layer 110 in Embodiment Mode 1.

In the light-emitting device of this embodiment mode as shown in FIG. 2C, the intermediate conductive layer 350 in the light-emitting element is provided in each pixel, and edges thereof are covered with the first light-emitting unit 303 and the second light-emitting unit 304; therefore, generation of crosstalk between the pixels is suppressed, and display quality of the light-emitting device is improved. Accordingly, the light-emitting device of this embodiment mode can have high light emission efficiency and high display quality. In addition, the intermediate conductive layer 350 is covered with the first light emitting unit 303 and the second light-emitting unit 304; therefore, the second electrode 305 and the intermediate conductive layer 350 are not short-circuited at the edges of the intermediate conductive layer 350, and an initial defect due to the short circuit of the second electrode 305 and the intermediate conductive layer 350 can be eliminated.

It is more preferable that the intermediate conductive layer 350 be formed so that edges thereof are disposed outside edges of a light-emitting region (a portion in which light emission is obtained, as seen from the substrate side) in the light-emitting element. In such a light-emitting element used in the light-emitting device of this embodiment mode, desired light emission is obtained only from a region in which the intermediate conductive layer 350 is formed, as seen from the substrate side, and light emission itself is not obtained from a region where the intermediate conductive layer 350 is not formed, or only light emission with very low luminance is obtained. Or, light emission with desired color cannot be obtained. Therefore, when the intermediate conductive layer 350 is formed to coincide with the light-emitting region, slight misalignment causes defects such as decrease in the light-emitting region and deterioration in display quality when forming the intermediate conductive layer 350. However, when the intermediate conductive layer 350 is formed so that the edges thereof are outside the edges of the light-emitting region, deterioration in display quality can be reduced even if the intermediate conductive layer 350 is formed with a little misalignment. Especially, this is preferably applied to an active matrix light-emitting device or a high-definition passive matrix light-emitting device in which mask alignment has to be carried out very strictly. Thus, deterioration in display quality due to misalignment of a mask or the like can be suppressed.

It is preferable that the intermediate conductive layer 352 be formed so that edges thereof are disposed outside the edges of the light-emitting region (a portion in which light emission is obtained, as seen from the substrate side) in the light-emitting element. Accordingly, even if the intermediate conductive layer 352 is formed with a little misalignment, deterioration in display quality can be suppressed because the intermediate conductive layer 352 can keep covering the light-emitting region.

Embodiment Mode 4

Figure 4A:
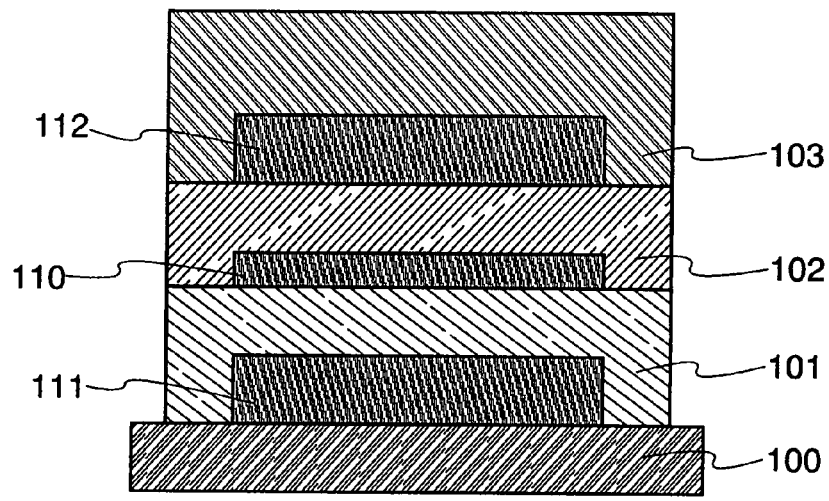
FIGS. 4A to 4C are cross-sectional views of a light-emitting device of the present invention.
Figure 4B:
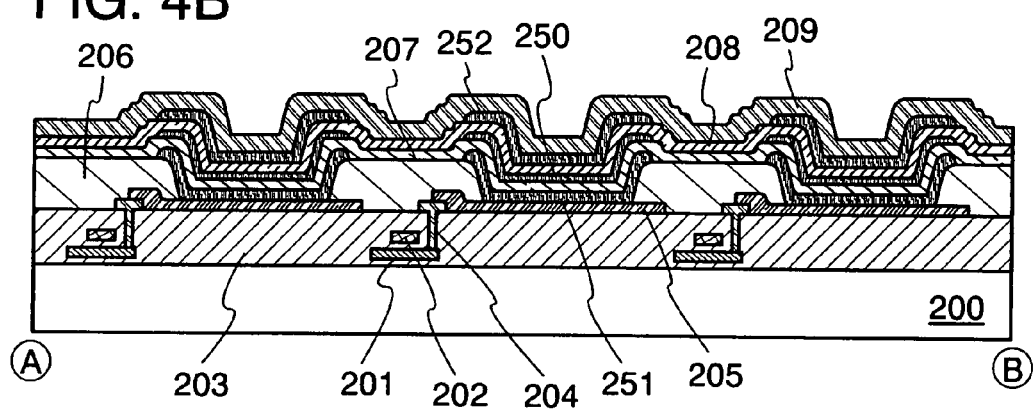
Figure 4C:
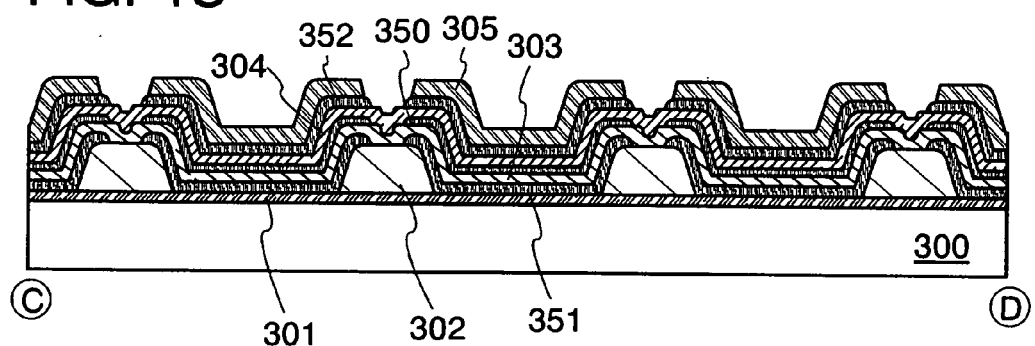

FIGS. 4A to 4C are views each showing a light-emitting device of this embodiment mode. FIG. 4A shows one pixel in the light-emitting device, in which a first electrode 100, a first light-emitting unit 101, a second light-emitting unit 102, a second electrode 103, and intermediate conductive layers 110, 111, and 112 are included. In FIG. 4A, each of the first electrode 100, the first light-emitting unit 101, the second light-emitting unit 102, the second electrode 103, and the intermediate conductive layer 110 has completely the same structure as that of FIG. 1A; therefore, the explanation of FIG. 1A is used. In addition, the explanation of FIG. 2A is used for the intermediate conductive layer 111, and the explanation of FIG. 3A is used for the intermediate conductive layer 112. In the light-emitting device of this embodiment mode, an optical design can be performed at both sides of the light-emitting element by the conductive layers being provided at both sides of the first electrode 100 and the second electrode 103; therefore, more detailed optical design can be performed. In addition, the intermediate conductive layer 111 is provided at the first electrode 100 side, whereby a defect (such as a short circuit) caused by unevenness or a foreign substance on the first electrode 100 can be reduced.

The light-emitting device of this embodiment mode has a structure in which a plurality of light-emitting units including the first light-emitting unit 101 and the second light-emitting unit 102 are included in a light-emitting element. Therefore, the same luminance can be obtained with less current density in comparison with a case of a single light-emitting unit.

The intermediate conductive layer 110 is provided in each pixel, and edges thereof are covered with the first light-emitting unit 101 and the second light-emitting unit 102; therefore, generation of crosstalk between pixels is suppressed and display quality of the light-emitting device is improved. Accordingly, the light-emitting device of this embodiment mode can have high light emission efficiency and high display quality. In addition, the intermediate conductive layer 110 is covered with the first light-emitting unit 101 and the second light-emitting unit 102; therefore, the second electrode 103 and the intermediate conductive layer 110 are not short-circuited at the edges of the intermediate conductive layer 110, and an initial defect due to the short circuit of the second electrode 103 and the intermediate conductive layer 110 can be eliminated.

It is more preferable that the intermediate conductive layer 110 be formed so that edges thereof are disposed outside edges of a light-emitting region (a portion in which light emission is obtained, as seen from the substrate side) in the light-emitting element. In such a light-emitting element used in the light-emitting device of this embodiment mode, desired light emission is obtained only from a region in which the intermediate conductive layer 110 is formed, as seen from the substrate side, and light emission itself is not obtained from a region where the intermediate conductive layer 110 is not formed, or only light emission with very low luminance is obtained. Or, light emission with desired color cannot be obtained. Therefore, when the intermediate conductive layer 110 is formed to coincide with the light-emitting region, slight misalignment causes defects such as decrease in the light-emitting region and deterioration in display quality when forming the intermediate conductive layer 110. However, when the intermediate conductive layer 110 is formed so that the edges of the intermediate conductive layer 110 to be outside the edges of the light-emitting region, deterioration in display quality can be reduced even if the intermediate conductive layer 110 is formed with a little misalignment. Especially, this is preferably applied to an active matrix light-emitting device or a high-definition passive matrix light-emitting device in which mask alignment has to be carried out very strictly. Thus, deterioration in display quality due to misalignment of a mask or the like can be suppressed.

It is preferable that the intermediate conductive layer 111 and the intermediate conductive layer 112 be formed so that edges thereof are disposed outside the edges of the light-emitting region (a portion in which light emission is obtained, as seen from the substrate side) in the light-emitting element. Accordingly, even if the intermediate conductive layer 111 and the intermediate conductive layer 112 are formed with a little misalignment, deterioration in display quality can be suppressed because the intermediate conductive layer 111 and the intermediate conductive layer 112 can keep covering the light-emitting region.

FIG. 4B is a view showing an example of an active matrix light-emitting device, in which a thin film transistor including a semiconductor layer 201, a gate insulating film, and a gate electrode 202 is formed over a substrate 200, and a light-emitting element including a first electrode 205, an intermediate conductive layer 251, a first light-emitting unit 207, an intermediate conductive layer 250, a second light-emitting unit 208, an intermediate conductive layer 252, and a second electrode 209 is formed over the thin film transistor, with an interlayer insulating film 203 interposed therebetween. Edges of the first electrode 205 of the light-emitting element are covered with a partition layer 206, and the light-emitting element is formed in a portion where the first electrode 205 is exposed from the partition layer 206. The light-emitting element is electrically connected to the thin film transistor through an electrode 204, and light emission is controlled. The structure of the light-emitting device shown in FIG. 4B is the same as that of the light-emitting device shown in FIG. 1B except the intermediate conductive layers 251 and 252; therefore, the explanation of FIG. 1B is used. The explanation of FIG. 2B is used for the intermediate conductive layer 251 and the explanation of FIG. 3B is used for the intermediate conductive layer 252. In the light-emitting device of this embodiment mode, an optical design can be performed at both sides of the light-emitting element by the conductive layers being provided at both sides of the first electrode 205 and the second electrode 209; therefore, more detailed optical design can be performed. In addition, the intermediate conductive layer 251 is provided at the first electrode 205 side, whereby a defect (such as a short circuit) caused by unevenness or a foreign substance on the first electrode 205 can be reduced.

In the light-emitting device of this embodiment mode as shown in FIG. 4B, the intermediate conductive layer 250 in the light-emitting element is provided in each pixel, and edges thereof are covered with the first light-emitting unit 207 and the second light-emitting unit 208; therefore, generation of crosstalk between pixels is suppressed and display quality of the light-emitting device is improved. Accordingly, the light-emitting device of this embodiment mode can have high light emission efficiency and high display quality. In addition, the intermediate conductive layer 250 is covered with the first light-emitting unit 207 and the second light-emitting unit 208; therefore, the second electrode 209 and the intermediate conductive layer 250 are not short-circuited at the edges of the intermediate conductive layer 250, and an initial defect due to the short circuit of the second electrode 209 and the intermediate conductive layer 250 can be eliminated.

It is more preferable that the intermediate conductive layer 250 be formed so that edges thereof are disposed outside edges of a light-emitting region (a portion in which light emission is obtained, as seen from the substrate side) in the light-emitting element. In such a light-emitting element used in the light-emitting device of this embodiment mode, desired light emission is obtained only from a region in which the intermediate conductive layer 250 is formed, as seen from the substrate side, and light emission itself is not obtained from a region where the intermediate conductive layer 250 is not formed, or only light emission with very low luminance is obtained. Or, light emission with desired color cannot be obtained. Therefore, when the intermediate conductive layer 250 is formed to coincide with the light-emitting region, slight misalignment causes defects such as decrease in the light-emitting region and deterioration in display quality when forming the intermediate conductive layer 250. However, when the intermediate conductive layer 250 is formed so that the edges thereof are outside the edges of the light-emitting region, deterioration in display quality can be reduced even if the intermediate conductive layer 250 is formed with a little misalignment. Especially, this is preferably applied to an active matrix light-emitting device or a high-definition passive matrix light-emitting device in which mask alignment has to be carried out very strictly. Thus, deterioration in display quality due to misalignment of a mask or the like can be suppressed.

It is preferable that the intermediate conductive layer 251 and the intermediate conductive layer 252 be formed so that edges thereof are disposed outside the edges of the light-emitting region (a portion in which light emission is obtained, as seen from the substrate side) in the light-emitting element. Accordingly, even if the intermediate conductive layer 251 or the intermediate conductive layer 252 is formed with a little misalignment, deterioration of display quality can be suppressed because the intermediate conductive layer 251 or the intermediate conductive layer 252 can keep covering the light-emitting region.

FIG. 4C is a view showing an example of a passive matrix light-emitting device, in which, a light-emitting element including a first electrode 301, an intermediate conductive layer 351, a first light-emitting unit 303, an intermediate conductive layer 350, a second light-emitting unit 304, an intermediate conductive layer 352, and a second electrode 305 is formed over a substrate 300. The light-emitting elements each having the same first electrode 301 are separated by partition layers 302. The structure of the light-emitting device shown in FIG. 4C is the same as that of the light-emitting device shown in FIG. 1C except the intermediate conductive layers 351 and 352; therefore, the explanation of FIG. 1C is used. In addition, the explanation of FIG. 2C is used for the intermediate conductive layer 531 and the explanation of FIG. 3C is used for the intermediate conductive layer 352. In the light-emitting device of this embodiment mode, an optical design can be performed at both sides of the light-emitting element by the conductive layers being provided at both sides of the first electrode 301 and the second electrode 305; therefore, more detailed optical design can be performed. In addition, the intermediate conductive layer 351 is provided at the first electrode 301 side, whereby a defect (such as a short circuit) caused by unevenness or a foreign substance on the first electrode 301 can be reduced.

In the light-emitting device of this embodiment mode as shown in FIG. 4C, the intermediate conductive layer 350 is provided in each pixel, and edges thereof are covered with the first light-emitting unit 303 and the second light-emitting unit 304; therefore, generation of crosstalk between pixels is suppressed, and display quality of the light-emitting device is improved. Accordingly, the light-emitting device of this embodiment mode can have high light emission efficiency and high display quality. In addition, the intermediate conductive layer 350 is covered with the first light emitting unit 303 and the second light-emitting unit 304; therefore, the second electrode 305 and the intermediate conductive layer 350 are not short-circuited at the edges of the intermediate conductive layer 350, and an initial defect due to the short circuit of the second electrode 305 and the intermediate conductive layer 350 can be eliminated.

It is more preferable that the intermediate conductive layer 350 be formed so that edges thereof are disposed outside edges of a light-emitting region (a portion in which light emission is obtained, as seen from the substrate side) in the light-emitting element. In such a light-emitting element used in the light-emitting device of this embodiment mode, desired light emission is obtained only from a region in which the intermediate conductive layer 350 is formed, as seen from the substrate side, and light emission itself is not obtained from a region where the intermediate conductive layer 350 is not formed, or only light emission with very low luminance is obtained. Or, light emission with desired color cannot be obtained. Therefore, when the intermediate conductive layer 350 is formed to coincide with the light-emitting region, slight misalignment causes defects such as decrease in the light-emitting region and deterioration in display quality when forming the intermediate conductive layer 350. However, when the intermediate conductive layer 350 is formed so that the edges thereof are outside the edges of the light-emitting region, deterioration in display quality can be reduced even if the intermediate conductive layer 350 is formed with a little misalignment. Especially, this is preferably applied to an active matrix light-emitting device or a high-definition passive matrix light-emitting device in which mask alignment has to be carried out very strictly. Thus, deterioration in display quality due to misalignment of a mask or the like can be suppressed.

It is preferable that the intermediate conductive layer 351 and the intermediate conductive layer 352 be formed so that edges thereof are disposed outside the edges of the light-emitting region (a portion in which light emission is obtained, as seen from the substrate side) in the light-emitting element. Accordingly, even if the intermediate conductive layer 351 or the intermediate conductive layer 352 is formed with a little misalignment, deterioration in display quality can be suppressed because the intermediate conductive layer 351 or the intermediate conductive layer 352 can keep covering the light-emitting region.

Embodiment Mode 5

Figure 5A:
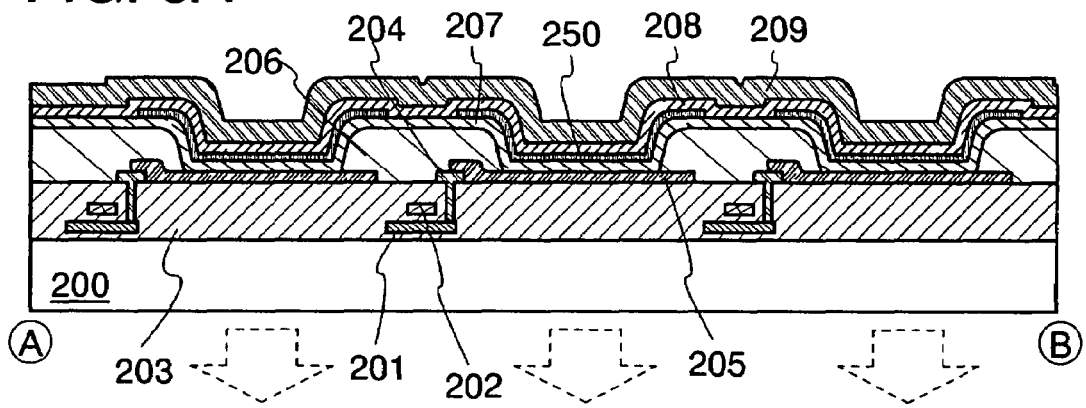
FIGS. 5A to 5C are cross-sectional views of a light-emitting device of the present invention.
Figure 5B:
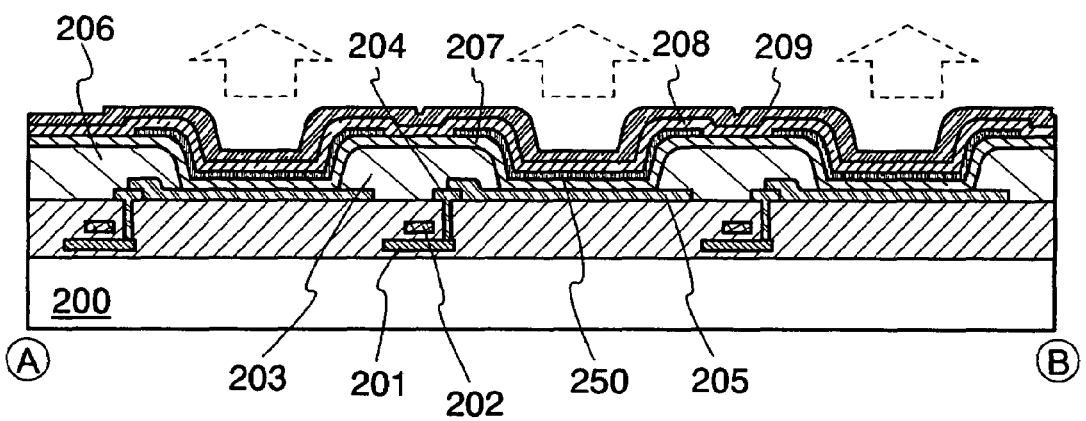
Figure 5C:
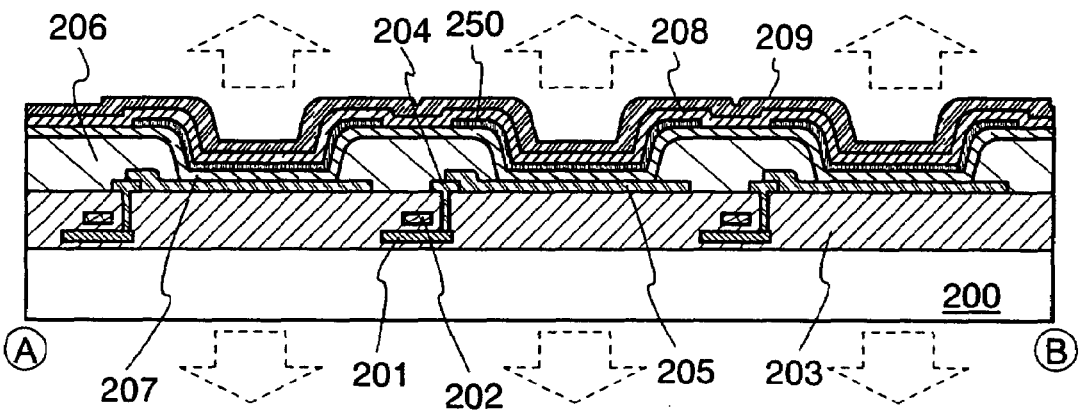

FIGS. 5A to 5C each show an example of an active matrix light-emitting device in which a direction of light emission from a light-emitting element is different. It is to be noted that FIGS. 5A to 5C are views for the explanation of the light emission direction of the light-emitting device, the light-emitting device of this embodiment mode is not limited to the structure explained here, and a shape or the like of a thin film transistor can be appropriately selected. In addition, reference numerals follow the reference numerals of Embodiment Modes 1 to 4. FIG. 5A shows a structure in which light emission of the light-emitting element is extracted to a substrate side where a thin film transistor is formed. In this case, light is extracted through a first electrode 205; therefore, the first electrode 205 is formed of a light-transmitting material. FIG. 5B shows a structure in which light emission of the light-emitting element is extracted in a direction opposite to the direction where the thin film transistor is formed. In this case, a second electrode 209 is formed of a light-transmitting material. FIG. 5C shows a structure in which light emission is extracted from both sides. In this case, both the first electrode 205 and the second electrode 209 are formed of light-transmitting materials. It is to be noted that a light-transmitting material typified by ITO in the materials explained as the material of the first electrode 100 and the second electrode 103 in Embodiment Mode 1 may be selected for a material of the first electrode 205 and the second electrode 209.

This embodiment mode can be implemented by being freely combined with Embodiment Modes 1 to 4.

Embodiment Mode 6

Figure 6A:
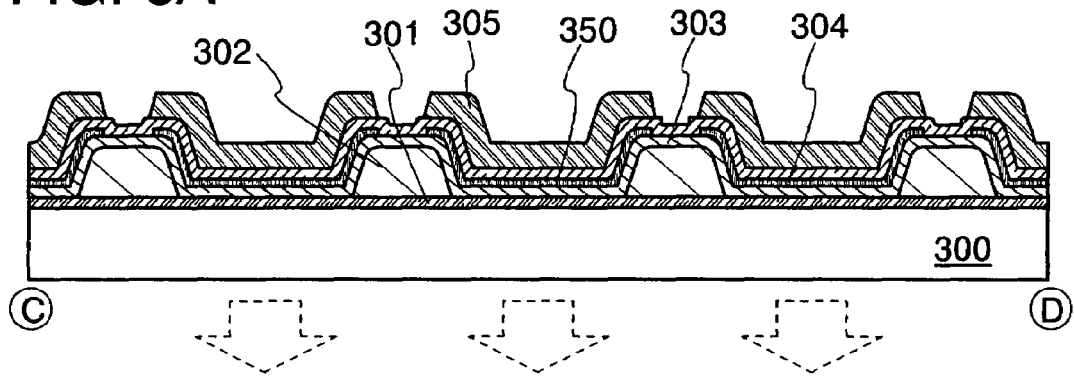
FIGS. 6A to 6C are cross-sectional views of a light-emitting device of the present invention.
Figure 6B:
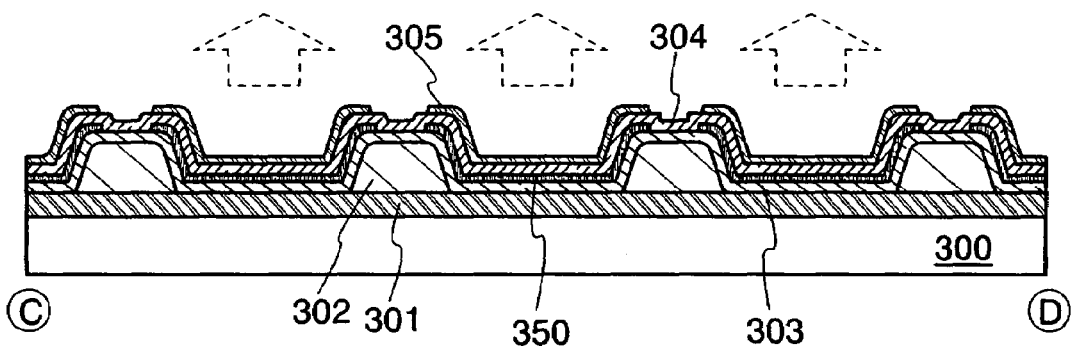
Figure 6C:
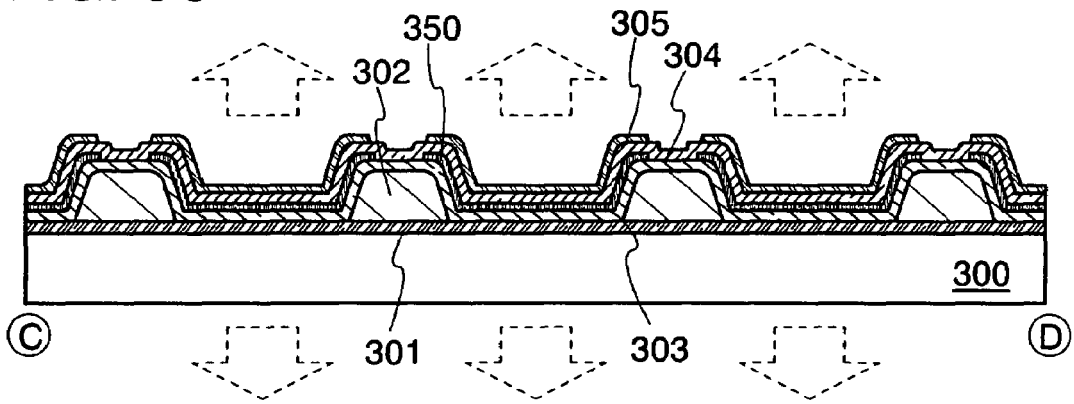

FIGS. 6A to 6C each show an example of a passive matrix light-emitting device in which a direction of light emission from a light-emitting element is different. It is to be noted that FIGS. 6A to 6C are views for the explanation of the light emission direction, the light-emitting device of this embodiment mode is not limited to the structure explained here, and a shape or the like of a thin film transistor can be appropriately selected. In addition, reference numerals follow the reference numerals of Embodiment Modes 1 to 4. FIG. 6A shows a structure in which light emission of the light-emitting element is extracted to a substrate side where a first electrode 301 is formed. In this case, light is extracted through the first electrode 301; therefore, the first electrode 301 is formed of a light-transmitting material. FIG. 6B shows a structure in which light emission of the light-emitting element is extracted to a direction opposite to the direction where the first electrode 301 is formed. In this case, a second electrode 305 is formed of a light-transmitting material. FIG. 6C shows a structure in which light emission of the light-emitting element is extracted from both sides. In this case, both of the first electrode 301 and the second electrode 305 are formed of light-transmitting materials. It is to be noted that a light-transmitting material typified by ITO in the materials which are explained as the material of the first electrode 301 and the second electrode 305 in Embodiment Mode 1 may be selected for a material of the first electrode 301 and the second electrode 305.

This embodiment mode can be implemented by being freely combined with Embodiment Modes 1 to 4.

Embodiment Mode 7

In this embodiment mode, a light-emitting device of this embodiment mode will be explained with reference to FIGS. 7A to 7E and FIGS. 8A to 8C while describing a manufacturing method thereof. It is to be noted that, in this embodiment mode, an example of manufacturing an active matrix light-emitting device will be shown.

Figure 7A:
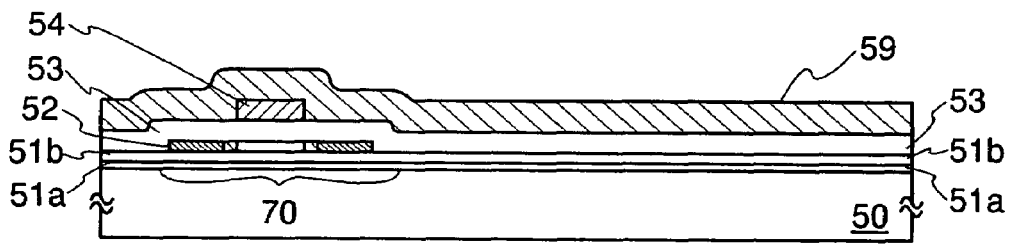
FIGS. 7A to 7E are cross-sectional views each explaining a manufacturing method of an active matrix light-emitting device of the present invention.
Figure 7B:
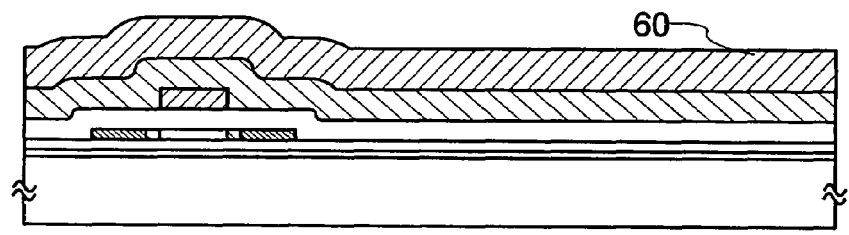
Figure 7C:
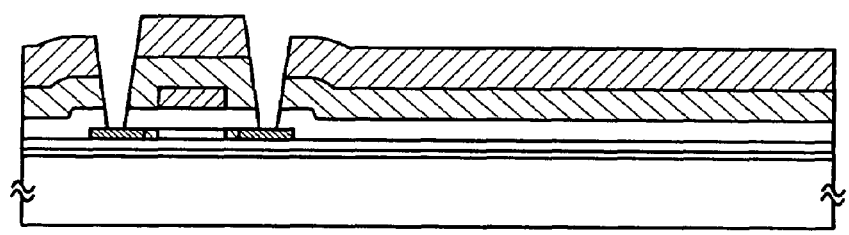
Figure 7D:
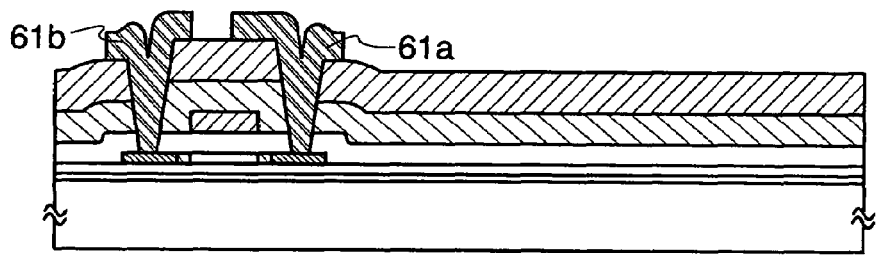
Figure 7E:
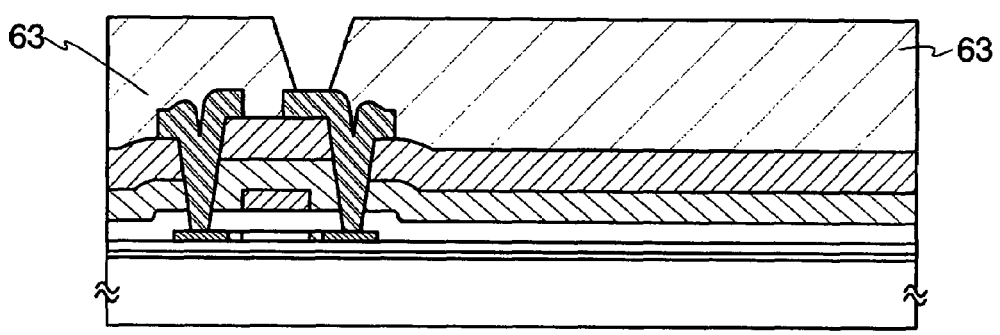
Figure 8A:
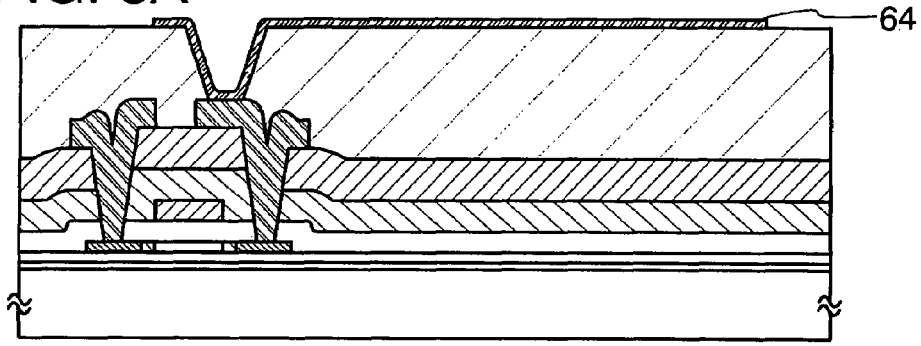
FIGS. 8A to 8C are cross-sectional views each explaining a manufacturing method of an active matrix light-emitting device of the present invention.
Figure 8B:
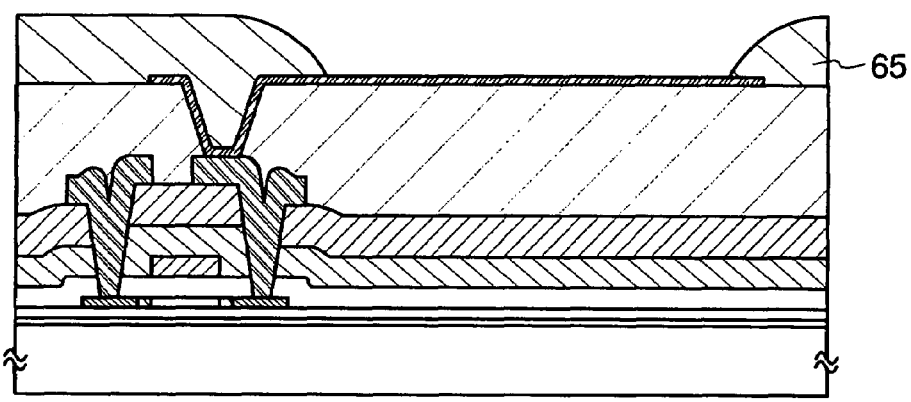
Figure 8C:
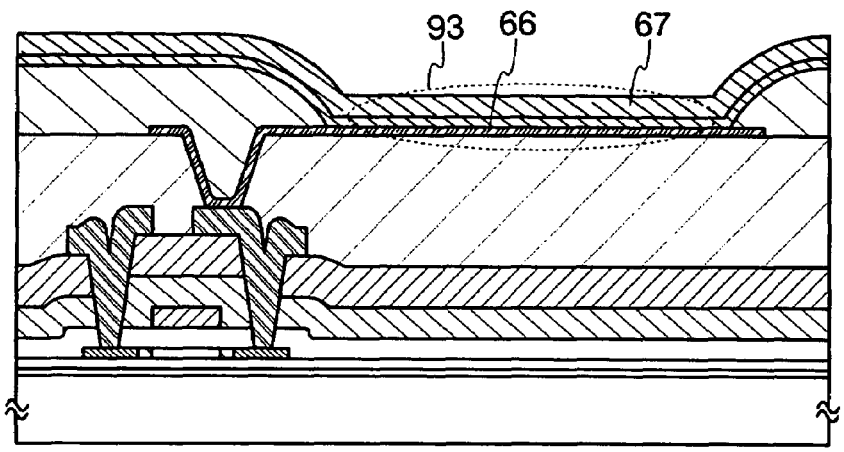

A first base insulating layer 51a and a second base insulating layer 51b are formed over a substrate 50, and thereafter, a semiconductor layer is formed over the second base insulating layer 51b (see FIG. 7A).

As a material of the substrate 50, glass, quartz, plastic (such as polyimide, acrylic, polyethylene terephthalate, polycarbonate, polyacrylate, polyether sulfone), or the like can be used. In this embodiment mode, a glass substrate is used.

The first base insulating layer 51a and the second base insulating layer 51b are formed in order to prevent an element which adversely affects characteristics of a semiconductor film, such as an alkali metal, an alkaline earth metal, or the like from dispersing in the semiconductor layer. As a material, silicon oxide, silicon nitride, silicon oxide containing nitrogen, silicon nitride containing oxygen, or the like can be used. In this embodiment mode, the first base insulating layer 51a is formed from silicon nitride and the second base insulating layer 51b is formed from silicon oxide. In this embodiment mode, although the base insulating layer is formed of two layers including the first base insulating layer 51a and the second base insulating layer 51b, the base insulating layer may be formed of a single layer or a multilayer including two or more layers.

The semiconductor layer subsequently formed is obtained by crystallization of an amorphous silicon film by laser. The amorphous silicon film is formed with a thickness of 25 to 100 nm (preferably, 30 to 60 nm) over the second base insulating layer 51b. As a formation method, a sputtering method, a low pressure CVD method, a plasma CVD method, or the like can be used. Thereafter, heat treatment is performed at 500° C. for an hour to perform dehydrogenation.

Subsequently, the amorphous silicon film is crystallized with the use of a laser irradiation apparatus to form a crystalline silicon film. The crystalline silicon film is formed in such a manner that an excimer laser is used for laser crystallization in this embodiment mode, an oscillated laser beam is processed into a linear beam spot with the use of an optical system, and the beam is emitted to the amorphous silicon film.

As another crystallization method of the amorphous silicon film, there is also a crystallization method only by heat treatment or a crystallization method by heat treatment with the use of a catalyst element which promotes crystallization. As an element which promotes crystallization, there is nickel, iron, palladium, tin, lead, cobalt, platinum, copper, gold, or the like. Crystallization is performed at a low temperature and for a short time with the use of such an element, in comparison with a case of performing crystallization only by heat treatment; accordingly, little damage is given to a glass substrate or the like. In the case where crystallization is performed only by heat treatment, the substrate 50 may be a quartz substrate or the like which is resistant to heat.

Subsequently, according to need, a small amount of impurity is added to the semiconductor layer, so-called channel doping is performed in order to control threshold. In order to obtain a required threshold, an impurity (such as phosphorus or boron) imparting n-type or p-type is added by an ion doping method or the like.

Thereafter, the semiconductor layer is processed into a predetermined shape by etching as shown in FIG. 7A to obtain an island-shaped semiconductor layer 52. This processing is performed as follows: photoresist is applied onto the semiconductor layer, the predetermined mask shape is exposed, and baking is performed to form a resist mask over the semiconductor layer, and etching is performed with the use of this mask.

Then, a gate insulating layer 53 is formed so as to cover the semiconductor layer 52. The gate insulating layer 53 is formed of an insulating layer containing silicon to have a thickness of 40 to 150 nm by a plasma CVD method or a sputtering method. In this embodiment mode, the gate insulating layer 53 is formed using silicon oxide.

Next, a gate electrode 54 is formed over the gate insulating layer 53. The gate electrode 54 may be formed of an element selected from tantalum, tungsten, titanium, molybdenum, aluminum, copper, chromium, or niobium; an alloy material or compound material containing the element as its main component. Alternatively, a semiconductor film typified by a polycrystalline silicon film doped with an impurity element such as phosphorus may be used. Alternatively, an AgPdCu alloy may be used.

In this embodiment mode, although the gate electrode 54 is formed of a single layer, the gate electrode 54 may have a stacked-layer structure including two or more layers, for example, a stacked-layer structure including tungsten for a lower layer and molybdenum for an upper layer. Even in the case where the gate electrode is formed as the stacked-layer structure, the material described in the former clause may be used. In addition, the combination may be appropriately selected. The gate electrode 54 is processed by etching with the use of a mask which uses photoresist.

Subsequently, an impurity is added to the semiconductor layer 52 at high concentration by using the gate electrode 54 as a mask. Accordingly, a thin film transistor 70 including the semiconductor layer 52, the gate insulating layer 53, and the gate electrode 54 can be manufactured.

It is to be noted that manufacturing steps of the thin film transistor are not particularly limited, and the manufacturing steps may be appropriately changed so that a transistor with a desired structure is formed.

In this embodiment mode, although a top gate thin film transistor using the crystalline silicon film which is crystallized by laser crystallization is used, a bottom gate thin film transistor using an amorphous semiconductor film can be used for a pixel portion. As an amorphous semiconductor, not only silicon but also silicon germanium can be used. In the case of using silicon germanium, the concentration thereof is preferably approximately 0.01 to 4.5 atomic %.

An insulating film 59 is formed of silicon nitride so as to cover the gate electrode 54 and the gate insulating layer 53. After the insulating film 59 is formed, heating is performed at 480° C. for about an hour to activate the impurity element and hydrogenate the semiconductor layer 52.

A first interlayer insulating layer 60 that covers the insulating film 59 is formed. The first interlayer insulating layer 60 may be formed of silicon oxide, acrylic, polyimide, siloxane, a low-k material, or the like. In this embodiment mode, a silicon oxide film is formed as the first interlayer insulating layer 60 (see FIG. 7B).

Next, a contact hole reaching the semiconductor layer 52 is opened. The contact hole can be formed by etching until the semiconductor layer 52 is exposed with the use of a resist mask, and it can be formed by either wet etching or dry etching. Further, depending on a condition, etching may be performed once or multiple times. In addition, when etching is performed multiple times, both wet etching and dry etching may be used (see FIG. 7C).

Then, a conductive layer that covers the contact hole or the first interlayer insulating layer 60 is formed. The conductive layer is processed into a desired shape to form a connection portion 61*a*, a wiring 61*b*, or the like. Although this wiring may be a single layer of aluminum; copper; an alloy of aluminum, carbon, and nickel; an alloy of aluminum, carbon, and molybdenum; or the like, this wiring may also be a stacked structure of molybdenum, aluminum, and molybdenum; titanium, aluminum, and titanium; or titanium, titanium nitride, aluminum, and titanium from the substrate side (see FIG. 7D).

Thereafter, a second interlayer insulating layer 63 is formed so as to cover the connection portion 61*a*, the wiring 61*b*, and the first interlayer insulating layer 60. As a material of the second interlayer insulating layer 63, a self-planarizing coating film of acrylic, polyimide, siloxane, or the like is preferably used. In this embodiment mode, siloxane is used for the second interlayer insulating layer 63 (see FIG. 7E).

Subsequently, an insulating layer may be formed of silicon nitride over the second interlayer insulating layer 63. The insulating layer is formed in order to prevent the second interlayer insulating layer 63 from being etched more than necessary when a pixel electrode to be formed later is etched. Therefore, the insulating layer is not necessarily formed when the ratio of etching rate between the pixel electrode and the second interlayer insulating layer 63 is high. Then, a contact hole which penetrates the second interlayer insulating layer 63 and reaches the connection portion 61*a* is formed.

Then, a light-transmitting conductive layer is formed so as to cover the contact hole and the second interlayer insulating layer 63 (or the insulating layer). After that, the light-transmitting conductive layer is processed to form a first electrode 64 in a thin film light-emitting element. Here, the first electrode 64 is electrically connected to the connection portion 61*a*.

The first electrode 64 can be formed of a conductive film as shown in Embodiment Mode 1, such as a conductive metal such as aluminum (Al), silver (Ag), platinum (Pt), nickel (Ni), tungsten (W), chromium (Cr), molybdenum (Mo), or titanium (Ti); an alloy thereof such as aluminum-silicon (Al—Si), aluminum-titanium (Al—Ti), or aluminum-silicon-copper (Al—Si—Cu); a nitride of a metal material such as titanium nitride (TiN); a metal compound such as indium oxide-tin oxide (ITO: indium tin oxide), ITO containing silicon; indium oxide-zinc oxide (IZO: indium zinc oxide) in which zinc oxide (ZnO) is mixed with indium oxide; or the like.

In addition, an electrode through which light emission is extracted may be formed of a transparent conductive film, and an extremely thin film of a metal such as Al or Ag is used in addition to the metal compound such as indium oxide-tin oxide (ITO: indium tin oxide), ITO containing silicon, indium oxide-zinc oxide (IZO: indium zinc oxide) in which zinc oxide (ZnO) is mixed with indium oxide. When light emission is extracted through a second electrode, the first electrode can be formed of a highly reflective material (such as Al or Ag). In this embodiment mode, ITO is used for the first electrode 64 (see FIG. 8A).

Next, an insulating layer formed of an organic material or an inorganic material is formed to cover the second interlayer insulating layer 63 (or the insulating layer) and the first electrode 64. Subsequently, the insulating layer is processed so that part of the first electrode 64 is exposed, whereby a partition layer 65 is formed. Although the partition layer 65 is preferably formed of a photosensitive organic material (such as acrylic or polyimide), the partition layer 65 may be formed of a non-photosensitive organic material or inorganic material. The partition layer 65 may be blacked by dispersion of a black colorant or dye such as titanium black or carbon nitride in the material of the partition layer 65 with the use of a dispersant or the like, whereby the partition layer 65 is used as a black matrix. An end surface of the partition layer 65 facing the first electrode preferably has curvature and a tapered shape in which the curvature changes continuously (see FIG. 8B).

Next, an organic-inorganic composite material layer is formed so as to cover the first electrode 64 that is exposed from the partition layer 65. In this embodiment mode, NPB is used as an organic compound, molybdenum oxide is used as a metal compound, and the organic-inorganic composite material layer is formed by co-evaporation so that molybdenum oxide is contained at 33 wt % with respect to NPB. Subsequently, NPB is deposited to have a thickness of 10 nm as a layer which is excellent in a function of transporting holes, coumarin 6 contained in $Alq_3$ at a weight ratio of 1:0.005 is deposited to have a thickness of 35 nm as a light-emitting layer, and $Alq_3$ is deposited to have a thickness of 10 nm as an electron transporting layer. Accordingly, a light-emitting unit 66 including the organic-inorganic composite material layer, the light-emitting layer, and the electron transporting layer is formed over the first electrode 64.

Subsequently, a second electrode 67 that covers the light-emitting unit 66 is formed. Accordingly, a light-emitting element 93 in which an organic layer including the light-emitting layer is interposed between the first electrode 64 and the second electrode 67 can be formed, and light emission can be obtained by application of higher voltage to the first electrode 64 than to the second electrode 67. The second electrode 67 can be formed of an electrode material similar to that of the first electrode 64. In this embodiment mode, aluminum is used for the second electrode 67.

After that, a silicon oxide film containing nitrogen is formed as a second passivation film by a plasma CVD method. In the case of using the silicon oxide film containing nitrogen, a silicon oxynitride film formed by a plasma CVD method using $SiH_4$, $N_2O$, and $NH_3$; using $SiH_4$ and $N_2O$; or using a gas in which $SiH_4$ and $N_2O$ are diluted with Ar may be formed.

In addition, a silicon oxynitride hydride film formed of $SiH_4$, $N_2O$, and $H_2$ may be used as the first passivation film. It is needless to say that a structure of the first passivation film is not limited to a single-layer structure. The first passivation film may have a single-layer structure or a stacked-layer structure including another insulating layer containing silicon. Alternatively, the first passivation film may be formed of a multilayer film including a carbon nitride film and a silicon nitride film, a multilayer film including styrene polymer, a silicon nitride film, or a diamond-like carbon film, instead of the silicon oxide film containing nitrogen.

Subsequently, a display portion is sealed in order to protect the light-emitting element from a substance which promotes deterioration, such as water. In a case of using a counter substrate for sealing, the counter substrate is attached using an insulating sealant so that an external connection portion is exposed. A space between the counter substrate and an element substrate may be filled with an inert gas such as dried nitrogen. Alternatively, the counter substrate may be attached using a sealant applied entirely over the pixel portion. It is preferable to use an ultraviolet curing resin or the like as the sealant. The sealant may be mixed with a drying agent or particles for keeping a constant gap between the substrates. Then, a flexible printed circuit is attached to the external connection portion, whereby a light emitting device is completed.

An example of a structure of the light-emitting device manufactured as described above will be explained with reference to FIGS. 9A and 9B. It is to be noted that portions having similar functions are denoted by the same reference numeral even if they have different shapes, and the explanation thereof may be omitted. In this embodiment mode, a thin film transistor 70 having an LDD structure is connected to the light-emitting element 93 through the connection portion 61a.

Figure 9A:
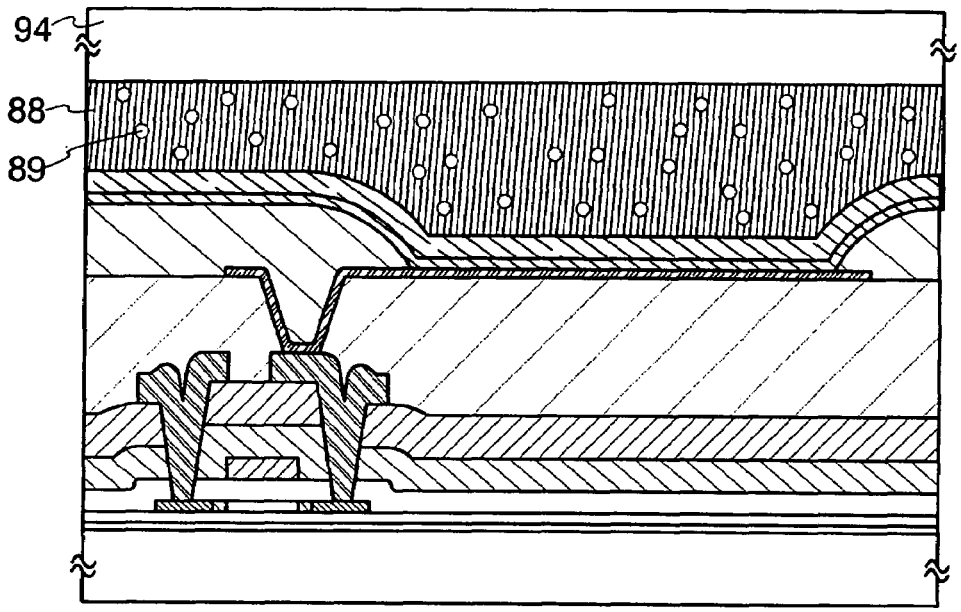
FIGS. 9A and 9B are cross-sectional views of a light-emitting device of the present invention.

FIG. 9A shows a structure in which the first electrode 64 is formed of a light-transmitting conductive film and light emitted from the light-emitting unit 66 is extracted to the substrate 50 side. Further, reference numeral 94 denotes a counter substrate. The counter substrate 94 is firmly fixed to the substrate 50 with a sealant or the like after the light-emitting element 93 is formed. A space between the counter substrate 94 and the element is filled with a light-transmitting resin 88 or the like and sealing is performed, whereby deterioration of the light-emitting element 93 due to moisture can be prevented. The resin 88 is desirably hygroscopic. When a highly light-transmitting drying agent 89 is dispersed in the resin 88, an influence of moisture can be further reduced, which is more desirable.

Figure 9B:
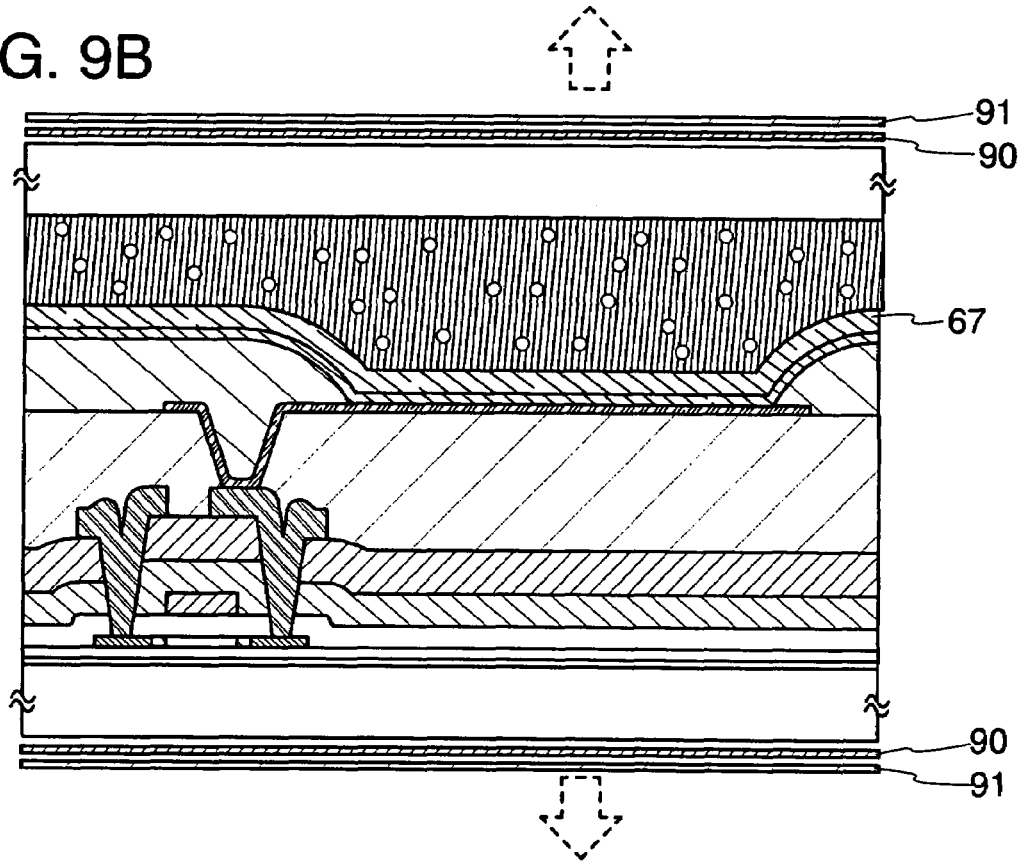

FIG. 9B shows a structure in which both the first electrode 64 and the second electrode 67 are formed of light-transmitting conductive films and light can be extracted to both the substrate 50 and the counter substrate 94. In this structure, a screen can be prevented from being transparent by the provision of a polarizing plate 90 outside of each of the substrate 50 and the counter substrate 94; thus, visibility is improved. A protective film 91 is preferably provided outside the polarizing plate 90.

Either an analog video signal or a digital video signal may be used for the light-emitting device of this embodiment mode having a display function. In a case of using a digital video signal, there are cases where the video signal uses voltage and the video signal uses current. As a video signal which is input to a pixel when a light-emitting element emits light, there are a constant voltage video signal and a constant current video signal. As the constant voltage video signal, there are a signal in which voltage applied to the light-emitting element is constant and a signal in which current flowing to the light-emitting element is constant. As the constant current video signal, there are a signal in which voltage applied to the light-emitting element is constant and a signal in which current flowing to the light-emitting element is constant. Drive with the signal in which voltage applied to a light-emitting element is constant is constant voltage drive, and drive with the signal in which current flowing to a light emitting element is constant is constant current drive. By the constant current drive, constant current flows regardless of a change in resistance of the light emitting element. Any of the above-described driving methods may be employed for the light-emitting device of this embodiment mode and a driving method thereof.

Such a structure makes it possible to obtain a light-emitting device with high light emission efficiency.

This embodiment mode can be implemented by being freely combined with an appropriate structure in Embodiment Modes 1 to 6.

Embodiment Mode 8

In this embodiment mode, a manufacturing method of an active matrix light-emitting device of this embodiment mode will be explained with reference to FIGS. 10A and 10B, FIGS. 11A and 11B, and FIG. 12. It is to be noted that a material or the like of each structure follows that in Embodiment Modes 1 to 7 and the explanation thereof is omitted.

Figure 10A:
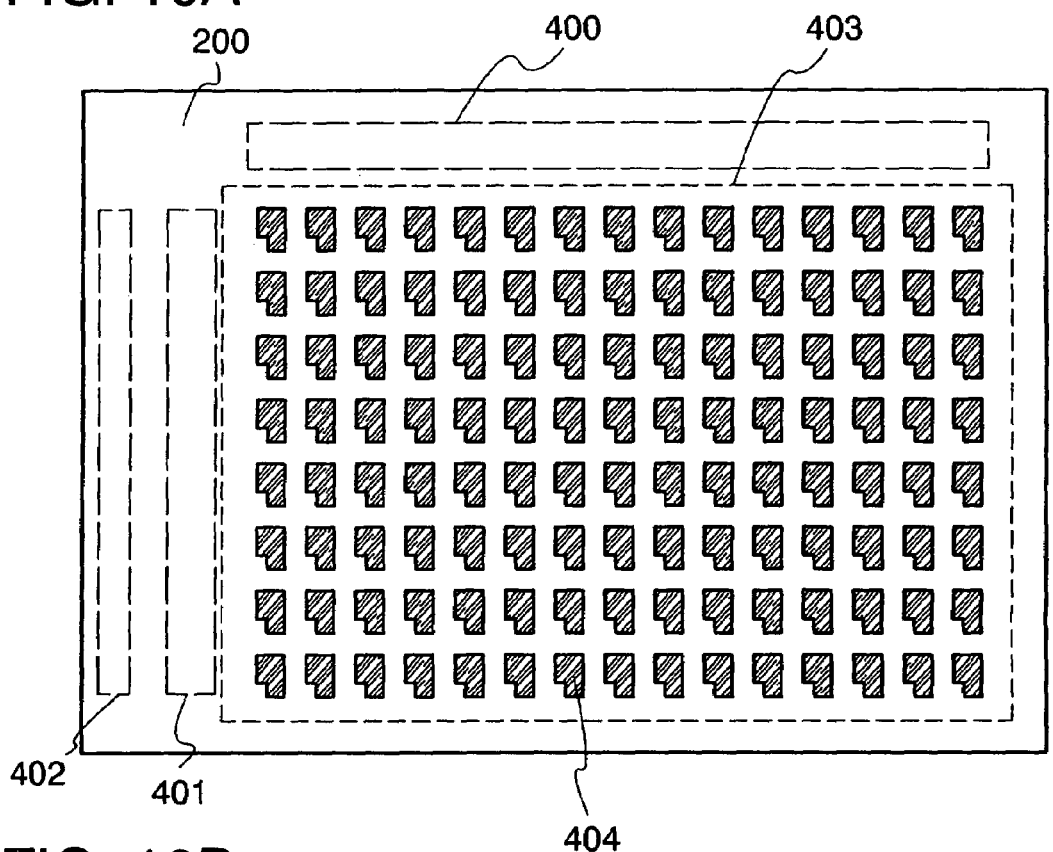
FIGS. 10A and 10B are top views each explaining a manufacturing method of an active matrix light-emitting device of the present invention.

FIG. 10A shows a top view of the light-emitting device up to the formation of the partition layer 65 in Embodiment Mode 7. Each of a scanning line driver circuit formation region 400, a signal line driver circuit formation region 401, an external connection portion formation region 402, and a pixel portion 403 provided over a substrate 200 is denoted by a portion shown by a dotted line. Reference numeral 404 corresponds to an opening of the partition layer 65, where a first electrode 205 provided below is exposed. Further, reference numeral 404 denotes a light-emitting region. In this manner, the light-emitting regions 404 in which part of the first electrode 205 which is electrically connected to each thin film transistor is exposed are arranged in matrix.

Figure 10B:
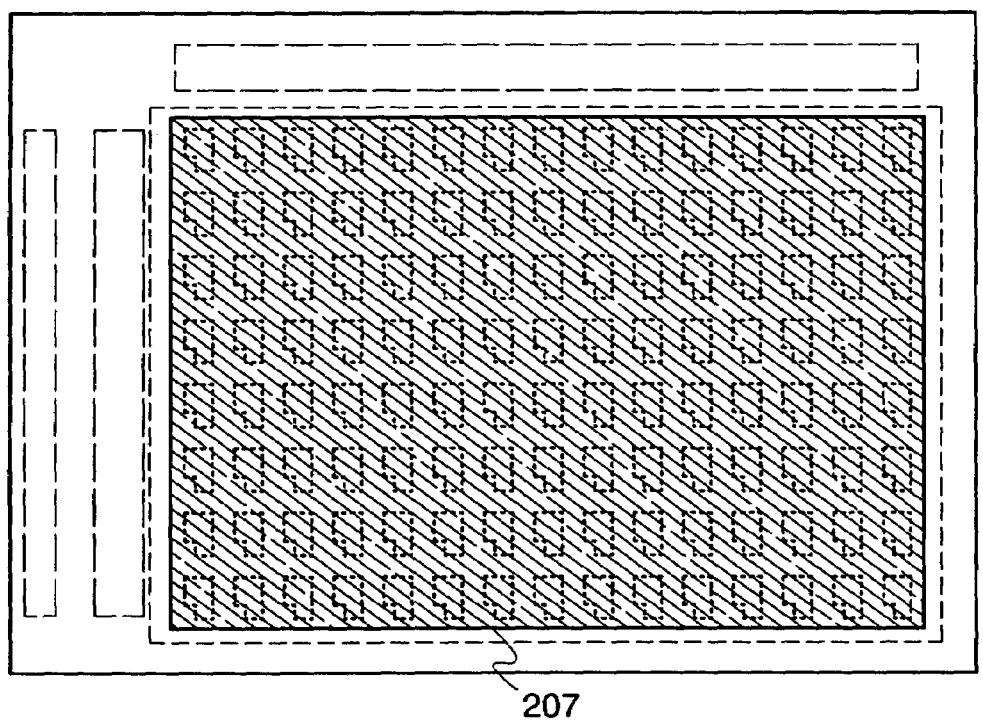

FIG. 10B shows a state in which a first light-emitting unit 207 is formed so as to cover the pixel portion 403. In this embodiment mode, although the same light-emitting unit is formed in the entire pixel, the light-emitting unit may be formed in such a manner that light-emitting units each exhibit different light emissions are divided in each pixel and each specified area of the pixel. It is to be noted that the light-emitting unit basically has high resistance; therefore, there is no crosstalk in adjacent pixels.

Figure 11A:
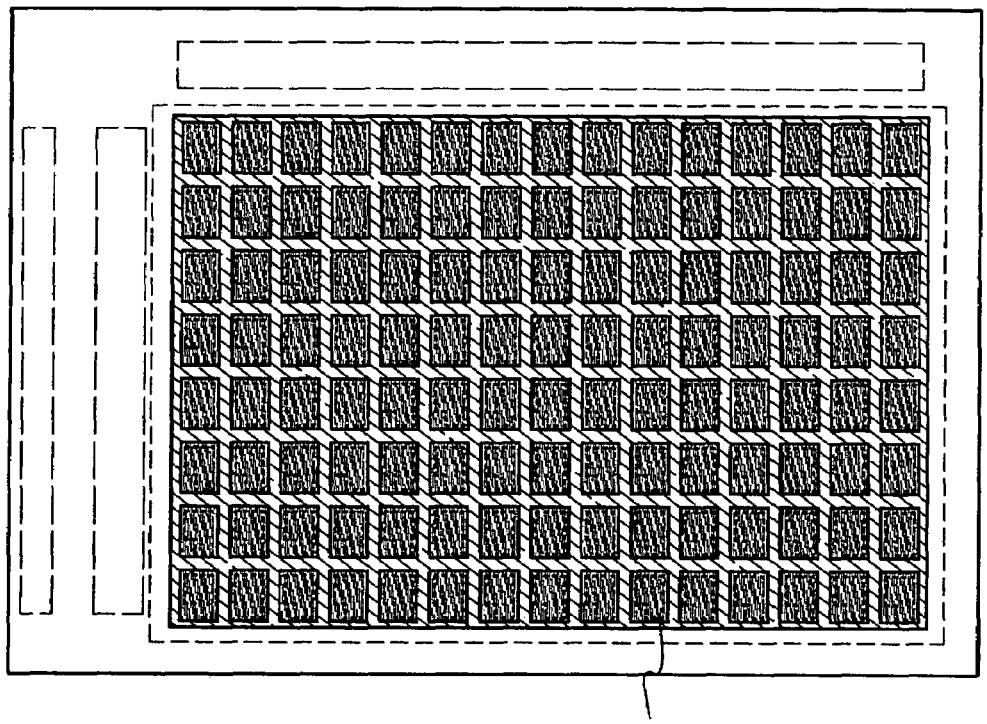
FIGS. 11A and 11B are top views each explaining a manufacturing method of an active matrix light-emitting device of the present invention.

FIG. 11A shows a state in which an intermediate conductive layer 250 is separated in each pixel to be provided. The edges of each intermediate conductive layer 250 are provided outside edges of each light-emitting region 404; therefore, the light-emitting region 404 can be covered with the intermediate conductive layer 250 even if a little misalignment of a mask is caused. Thus, deterioration in display quality is not caused and defects due to the misalignment of the mask can be reduced.

Figure 11B:
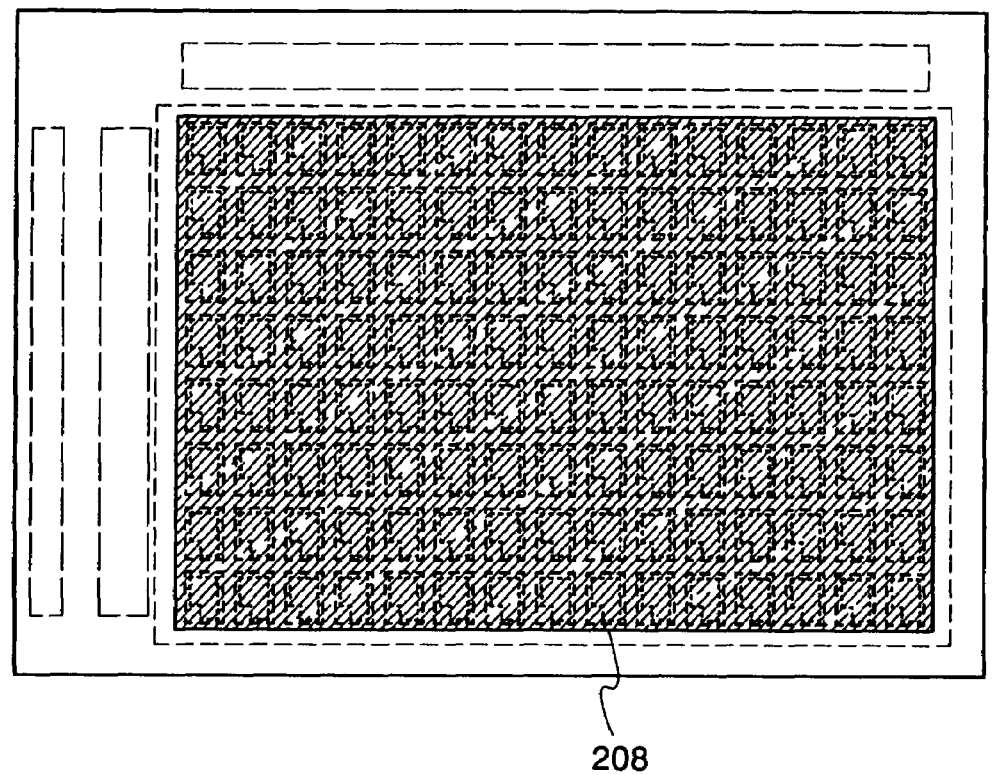

FIG. 11B shows a state in which a second light-emitting unit 208 is formed to cover the pixel portion 403. Accordingly, the edges of the intermediate conductive layer 250 can be covered with the first light-emitting unit 207 and the second light-emitting unit 208, and the intermediate conductive layer 250 is separated in each pixel; thus, crosstalk between adjacent pixels can be adequately reduced. Accordingly, a light-emitting device with high light emission efficiency by light emission from the first light-emitting unit 207 and the second light-emitting unit 208 and the light-emitting device with high display quality in which crosstalk between adjacent pixels is adequately reduced can be obtained.

Figure 12:
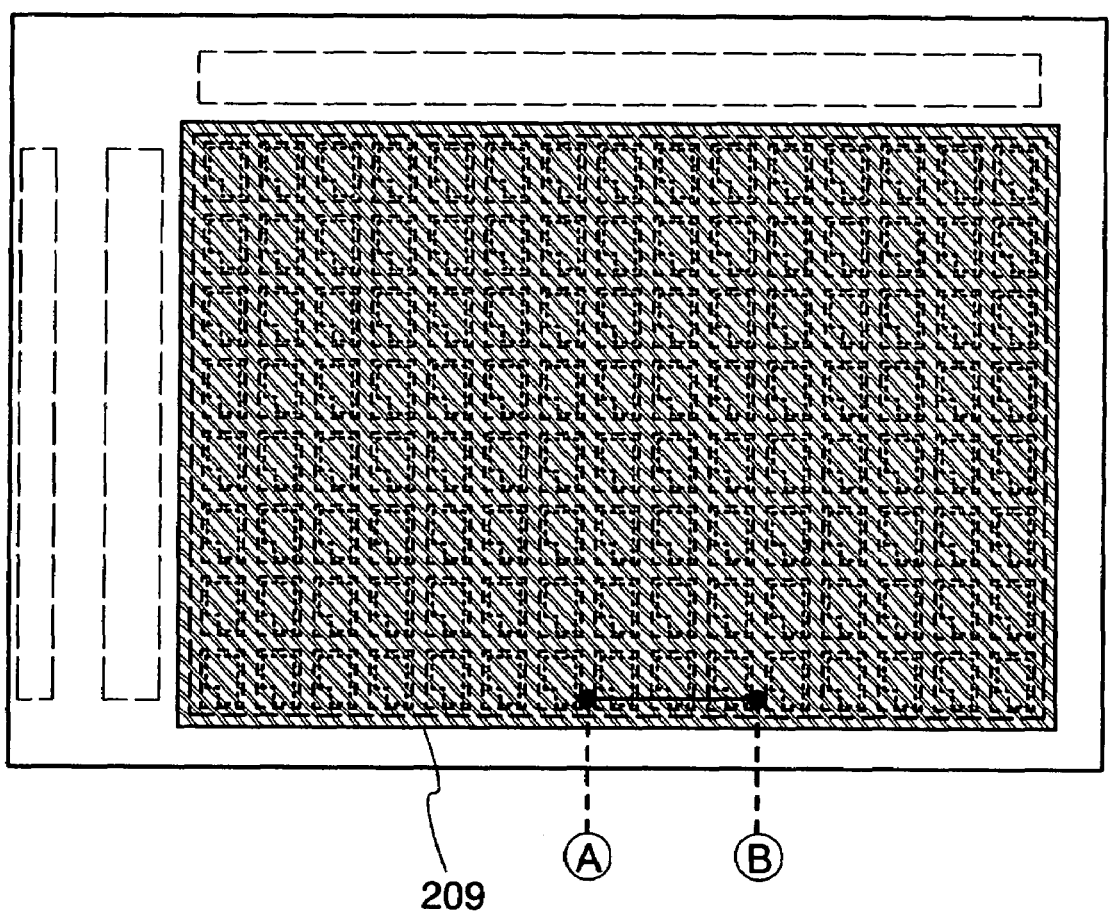
FIG. 12 is a top view explaining a manufacturing method of an active matrix light-emitting device of the present invention.

FIG. 12 shows a state showing up to formation of a second electrode 209. The second electrode 209 may be formed over the entire pixel. It is to be noted that each of the cross-sectional views of the active matrix light-emitting device described in Embodiment Modes 1 to 4 corresponds to a cross section taken along a line A-B of FIG. 12.

This embodiment mode can be implemented by being appropriately combined with Embodiment Modes 1 to 7.

Embodiment Mode 9

Figure 13A:
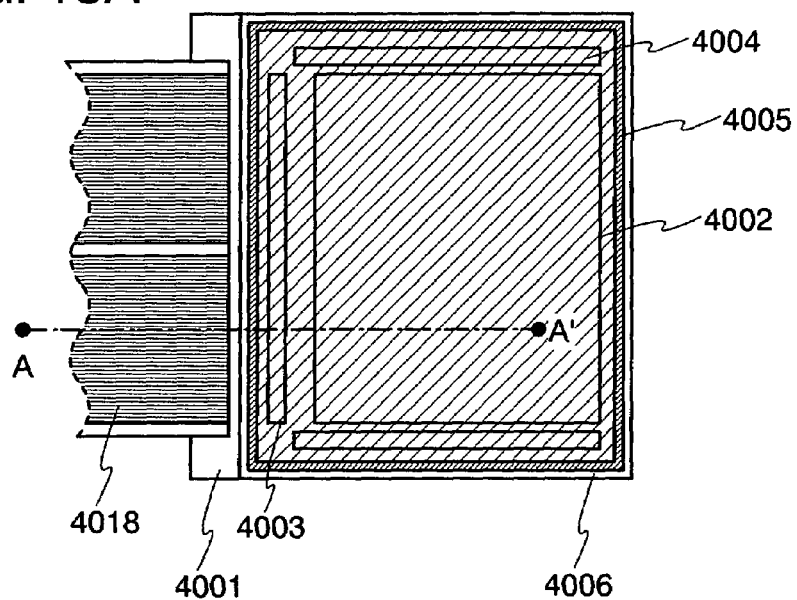
FIGS. 13A and 13B are a top view and a cross-sectional view of a light-emitting device of the present invention, respectively.
Figure 13B:
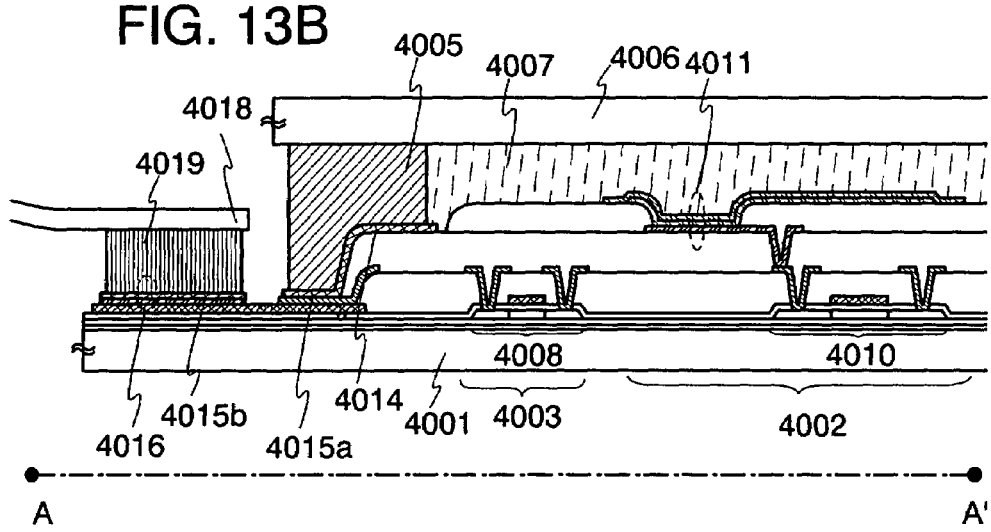

In this embodiment mode, the appearance of a panel which is a light-emitting device of this embodiment mode will be explained with reference to FIGS. 13A and 13B. FIG. 13A is a top view in which a transistor and a light-emitting element formed over a substrate is sealed with a sealant formed between a counter substrate 4006 and the substrate. FIG. 13B corresponds to a cross-sectional view of FIG. 13A. In addition, a structure included in the light-emitting element formed over this panel is similar to that shown in Embodiment Mode 4.

A sealant 4005 is provided so as to cover a pixel portion 4002, a signal line driver circuit 4003, and a scanning line driver circuit 4004 each of which is formed over a substrate 4001. In addition, the counter substrate 4006 is provided over the pixel portion 4002, the signal line driver circuit 4003, and the scanning line driver circuit 4004. Accordingly, the pixel portion 4002, the signal line driver circuit 4003, and the scanning line driver circuit 4004 are sealed with a filler 4007 by the substrate 4001, the sealant 4005, and the counter substrate 4006.

In addition, each of the pixel portion 4002, the signal line driver circuit 4003, and the scanning line driver circuit 4004 provided over the substrate 4001 has a plurality of transistors. In FIG. 13B, a thin film transistor 4008 included in the signal line driver circuit 4003 and a thin film transistor 4010 included in the pixel portion 4002 are shown. A light-emitting element 4011 is electrically connected to the thin film transistor 4010.

A leading wiring 4014 corresponds to a wiring for supplying signals or power supply voltages to the pixel portion 4002, the signal line driver circuit 4003, and the scanning line driver circuit 4004. The leading wiring 4014 is connected to a connection terminal 4016 through leading wirings 4015a and 4015b. The connection terminal 4016 is electrically connected to a terminal included in a flexible printed circuit (FPC) 4018 through an anisotropic conductive film 4019.

As the filler 4007, an ultraviolet curable resin or a heat curable resin such as polyvinyl chloride, acrylic, polyimide, an epoxy resin, a silicon resin, polyvinyl butyral, or ethylene vinylene acetate can be used in addition to an inert gas such as nitrogen or argon.

The light-emitting device of this embodiment mode includes a panel over which a pixel portion including a light-emitting element is formed and a module in which an IC is mounted on the panel in the category. The light-emitting device of this embodiment mode having such a structure has high light emission efficiency and high display quality.

This embodiment mode can be implemented by being appropriately combined with Embodiment Modes 1 to 8.

Embodiment Mode 10

In this embodiment mode, a pixel circuit and a protective circuit included in a panel and a module described in Embodiment Mode 9 and operations of these will be explained. The cross-sectional views each shown in FIGS. 7A to 7E and FIGS. 8A to 8C are cross-sectional views of a driving TFT 1403 and a light-emitting element 1405.

Figure 14A:
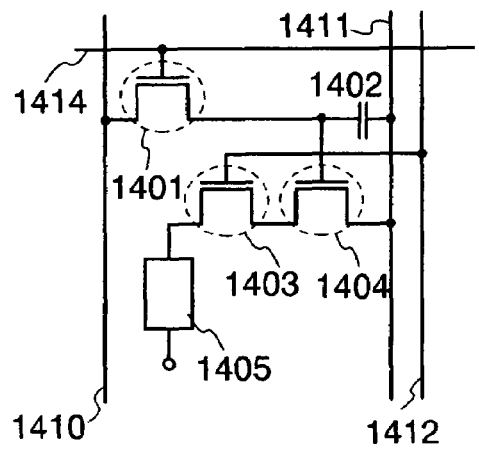
FIGS. 14A to 14F are views each showing an example of a pixel circuit of a light-emitting device of the present invention.

In a pixel shown in FIG. 14A, a signal line 1410 and power supply lines 1411 and 1412 are arranged in columns, and a scanning line 1414 is arranged in a row. In addition, the pixel includes a switching TFT 1401, a driving TFT 1403, a current controlling TFT 1404, a capacitor element 1402, and a light-emitting element 1405.

Figure 14B:
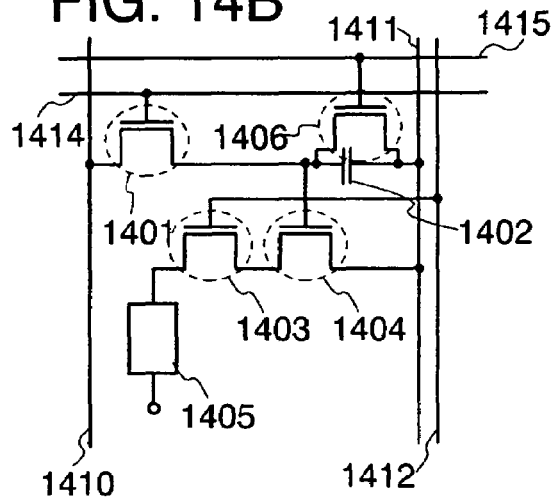
Figure 14C:
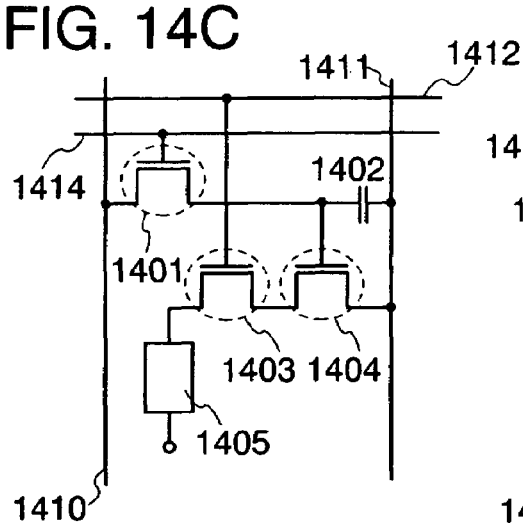
Figure 14D:
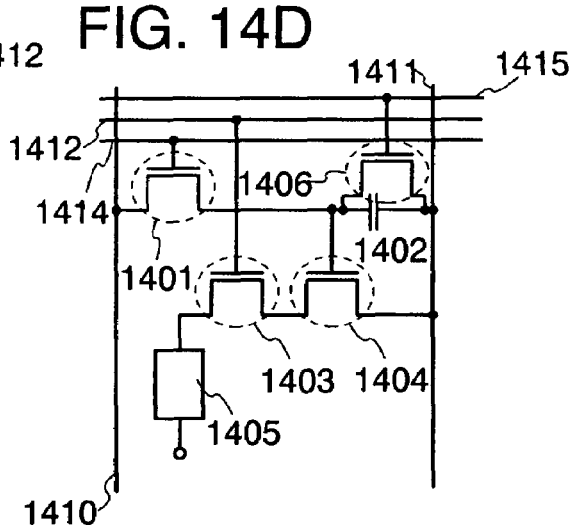

A pixel shown in FIG. 14C is different in that a gate electrode of the driving TFT 1403 is connected to the power supply line 1412 arranged in a row, and other than that, the pixel has the same structure as that of the pixel shown in FIG. 14A. However, the power supply line 1412 is formed of a conductive film of one kind of layer when arranged in a column as shown in FIG. 14A and another kind of layer when arranged in a row as shown in FIG. 14C. Here, a wiring to which the gate electrode of the driving TFT 1403 is connected is noted, and the structure is shown separately in FIGS. 14A to 14C in order to show that the wirings are formed of different layers.

As a feature of the pixel shown in each of FIGS. 14A to 14C, the driving TFT 1403 and the current controlling TFT 1404 are connected in series in the pixel, and a channel length L (1403) and a channel width W (1403) of the driving TFT 1403 and a channel length L (1404) and a channel width W (1404) of the current controlling TFT 1404 may be provided so as to meet the following: L (1403)/W (1403):L (1404)/W (1404)=5 to 6000:1.

The driving TFT 1403 operates in a saturation region and has a role of controlling a value of a current flowing through the light-emitting element 1405. The current controlling TFT 1404 operates in a linear region and has a role of controlling a current supplied to the light-emitting element 1405. If both TFTs have the same conductivity type, it is preferable in terms of a manufacturing process, and the TFTs are formed as n-channel TFTs in this embodiment mode. The driving TFT 1403 may be either an enhancement type TFT or a depletion type TFT. Since the current controlling TFT 1404 operates in the linear region in the light-emitting device of this embodiment mode having the above-described structure, slight fluctuation of a gate-source voltage (Vgs) of the current controlling TFT 1404 does not affect the current value of the light-emitting element 1405. That is to say, the current value of the light-emitting element 1405 can be determined by the driving TFT 1403 operating in the saturation region. With the above-described structure, the variation of the luminance of the light-emitting element due to the variation of the characteristics of the TFT can be remedied, whereby a light-emitting device with improved image quality can be provided.

In each pixel shown in FIGS. 14A to 14D, the switching TFT 1401 controls input of a video signal to the pixel, and the video signal is input to the pixel when the switching TFT 1401 is turned on. Then, a voltage of the video signal is held in the capacitor element 1402. Although FIGS. 14A to 14C show the structure in which the capacitor element 1402 is provided, this embodiment mode is not limited to this structure. When gate capacitor or the like can serve as a capacitor holding the video signal, the capacitor element 1402 is not necessarily provided.

A pixel shown in FIG. 14B has the same pixel structure as that shown in FIG. 14A except that a TFT 1406 and a scanning line 1414 are added. In a similar manner, a pixel shown in FIG. 14D has the same pixel structure as that shown in FIG. 14C except that the TFT 1406 and the scanning line 1414 are added.

ON or OFF of the TFT 1406 is controlled by the additionally provided scanning line 1414. When the TFT 1406 is turned on, charge held in the capacitor element 1402 is discharged, whereby the current controlling TFT 1404 is turned off. That is to say, a state in which a current does not flow through the light-emitting element 1405 can be forcibly made by the arrangement of the TFT 1406. Therefore, the TFT 1406 can be referred to as an erasing TFT. Thus, in the structures shown in FIGS. 14B to 14D, a lighting period can be started at the same time as or right after the start of a writing period before the wiring of the signal into all the pixels; therefore, the duty ratio can be increased.

Figure 14E:
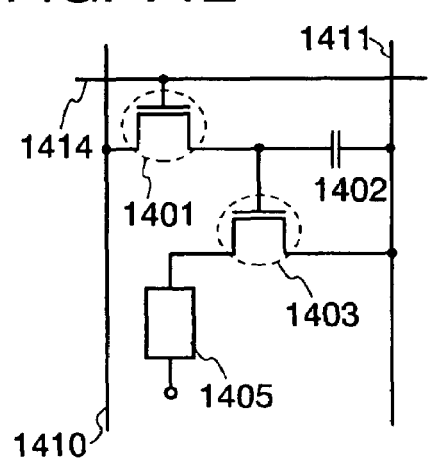
Figure 14F:
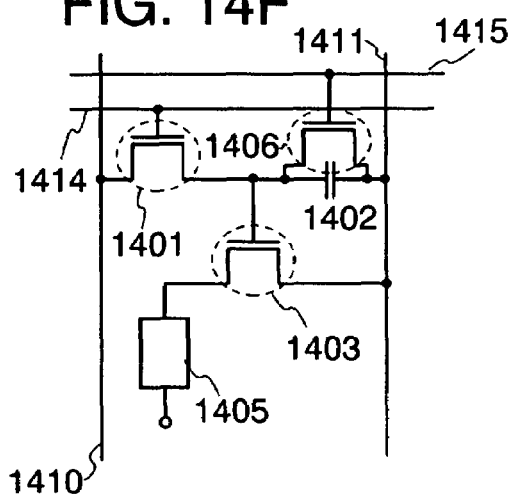

In a pixel shown in FIG. 14E, the signal line 1410 and the power supply line 1411 are arranged in columns and the scanning line 1414 is arranged in a row. In addition, the pixel includes the switching TFT 1401, the driving TFT 1403, the capacitor element 1402, and the light-emitting element 1405. A pixel shown in FIG. 14E has the same structure as that shown in FIG. 14E except that the TFT 1406 and the scanning line 1415 are added. It is to be noted that, in the structure of FIG. 14F, the duty ratio can be improved by the arrangement of the TFT 1406.

Figure 15:
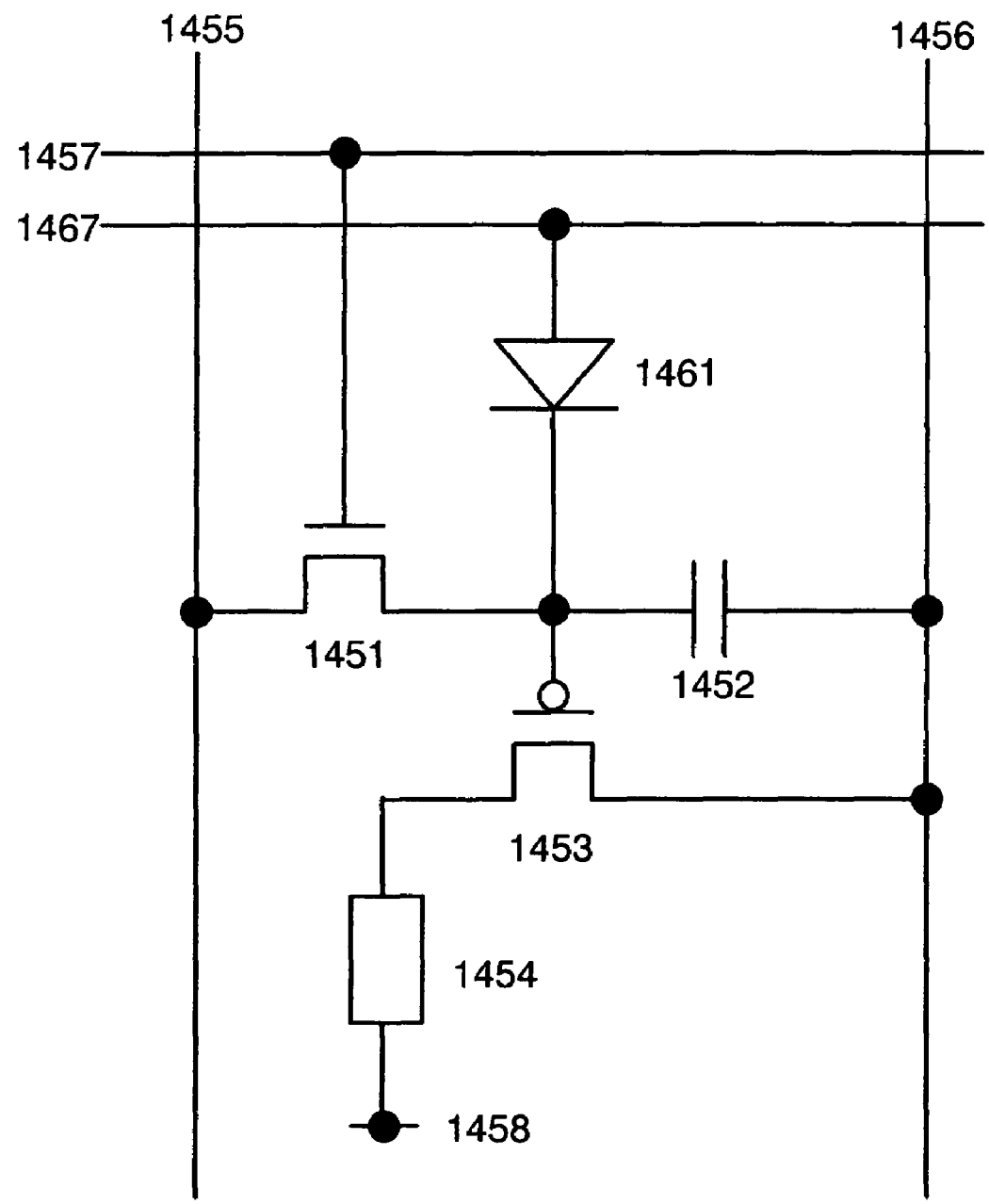
FIG. 15 is a view showing an example of a pixel circuit of a light-emitting device of the present invention.

An example of a pixel structure in a case where the driving TFT 1403 is forcibly turned off is shown in FIG. 15. A selecting TFT 1451, a driving TFT 1453, an erasing diode 1461, and a light-emitting element 1454 are arranged. Each of a source and a drain of the selecting TFT 1451 is connected to each of a signal line 1455 and a gate of the driving TFT 1453. A gate of the selecting TFT 1451 is connected to a first gate line 1457. Each of a source and a drain of the driving TFT 1453 is connected to each of a first power supply line 1456 and the light-emitting element 1454. The erasing diode 1461 is connected to the gate of the driving TFT 1453 and a second gate line 1467.

A capacitor element 1452 has a function of holding gate potential of the driving TFT 1453. Accordingly, the capacitor element 1452 is connected between the gate of the driving TFT 1453 and the first power supply line 1456; however, the present invention is not limited thereto. The capacitor element 1452 may be arranged so as to hold the gate potential of the driving TFT 1453. When the gate potential of the driving TFT 1453 can be held by gate capacitance of the driving TFT 1453, or the like, the capacitor element 1452 may be omitted.

As an operation method, the first gate line 1457 is selected to turn the selecting TFT 1451 on, and a signal is input from the signal line 1455 to the capacitor element 1452. Then, a current flowing through the driving TFT 1453 is controlled depending on the signal, and a current flows from the first power supply line 1456 to a second power supply line 1458 through the light-emitting element 1454.

In order to erase a signal, the second gate line 1467 is selected (supplied with high potential here) to turn the erasing diode 1461 on so that a current flows from the second gate line 1467 to the gate of the driving TFT 1453. Accordingly, the driving TFT 1453 is turned off. Then, no current flows from the first power supply line 1456 to the second power supply line 1458 through the light-emitting element 1454. Consequently, a non-lighting period can be provided and the length of a lighting period can be freely controlled.

In order to hold a signal, the second gate line 1467 is not selected (supplied with low potential here). Then, the erasing diode 1461 is turned off, and thus, the gate potential of the driving TFT 1453 is held.

It is to be noted that the erasing diode 1461 may be any element as long as it has a rectifying property. Various rectifying elements such as a PN diode, a PIN diode, a Schottky diode, and a zener diode can be used.

As described above, various pixel circuits can be adopted. In particular, when a thin film transistor is formed of an amorphous semiconductor film, it is preferable to form the driving TFTs 1403 and 1453 to be large. Therefore, the above-described pixel circuit preferably has a top emission type in which light from a light-emitting unit is emitted through a sealing substrate side.

Such an active matrix light-emitting device is advantageous in that it can be driven at a low voltage when pixel density is increased, because each pixel is provided with a TFT.

In this embodiment mode, although the active matrix light-emitting device in which each pixel is provided with a TFT is described, a passive matrix light-emitting device can also be formed. Since each pixel is not provided with a TFT in the passive matrix light-emitting device, a high aperture ratio is obtained. In a case of a light-emitting device which emits light to both sides of a light-emitting unit, transmittance is increased when the passive matrix light-emitting device is used.

Subsequently, a case where a diode is provided to a scanning line and a signal line as a protective circuit will be explained using the equivalent circuit shown in FIG. 14E.

Figure 16:
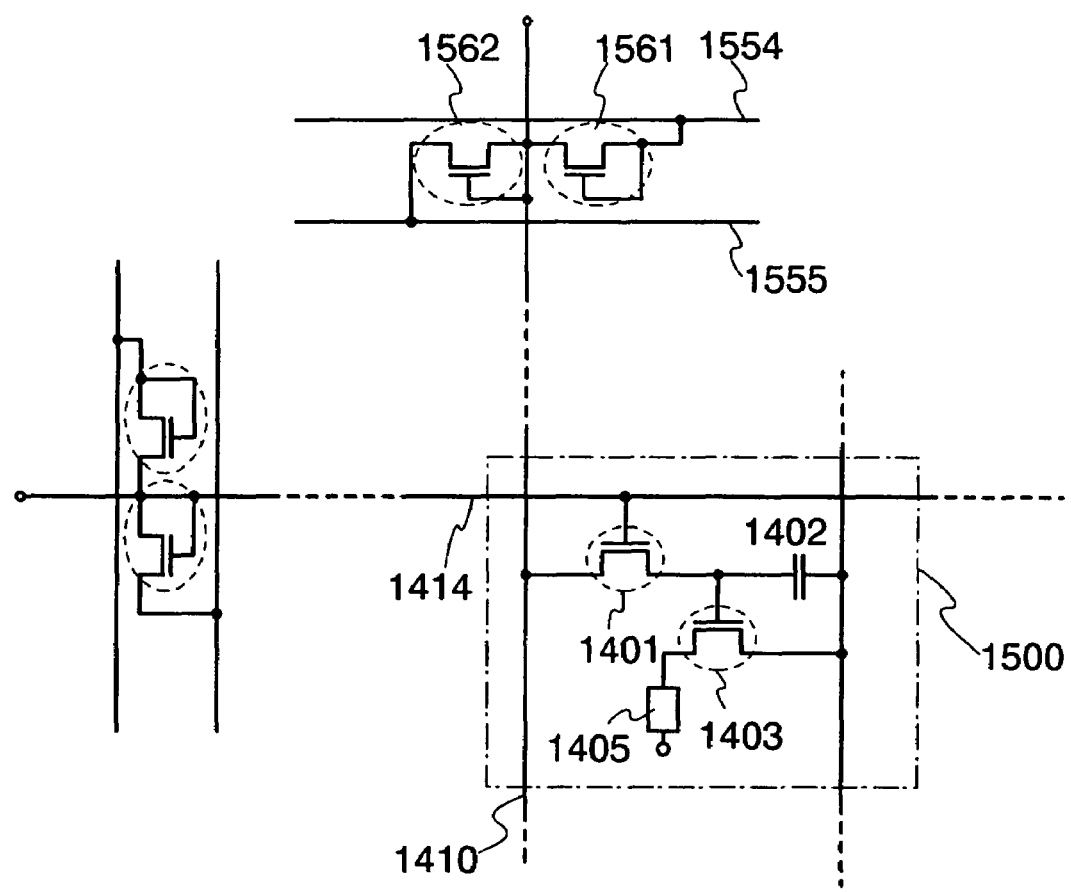
FIG. 16 is a view showing an example of a protective circuit of a light-emitting device of the present invention.

In FIG. 16, a pixel portion 1500 is provided with the switching TFT 1401 and driving TFT 1403, the capacitor element 1402, and the light-emitting element 1405. The signal line 1410 is provided with diodes 1561 and 1562. Each of the diodes 1561 and 1562 are manufactured according to the above-described embodiment mode as is the case with the switching TFT 1401 or 1403, and each of the diodes includes a gate electrode, a semiconductor layer, a source electrode, a drain electrode, and the like. Each of the diodes 1561 and 1562 connects the gate electrode to the drain electrode or source electrode, thereby operating as a diode.

Common potential lines 1554 and 1555 each connected to the diode are formed using the same layer as that of the gate electrode. Therefore, in order to connect the common potential lines 1554 and 1555 to the source electrode or drain electrode of the diode, it is necessary to form a contact hole in a gate insulating layer. A diode provided to the scanning line 1414 has a similar structure.

As described above, according to this embodiment mode, a protective diode provided at an input stage can be formed at the same time. It is to be noted that the position where the protective diode is formed is not limited thereto. The protective diode can also be provided between a driver circuit and a pixel.

The light-emitting device of this embodiment mode including such a protective circuit has high light emission efficiency and high display quality. In addition, with the above-described structure, reliability as the light-emitting device can be further increased.

Embodiment Mode 11

In this embodiment mode, a manufacturing method of a passive matrix light-emitting device of this embodiment mode will be explained with reference to top views of FIGS. 17A and 17B, FIGS. 18A and 18B, and FIGS. 19A and 19B. It is to be noted that a material or the like of each structure follows that in Embodiment Modes 1 to 4, and the explanation thereof may be omitted.

A first electrode 301 extending in one direction and a terminal 500 for forming an input terminal portion are formed of the same material over a main surface of a substrate 300. A composition and a manufacturing method of the first electrode 301 are as described above. For example, the substrate 300 can be a glass substrate of barium borosilicate glass, alumino borosilicate glass, or the like, a quartz substrate, or the like. Further, in FIG. 17A, a light-emitting element in which light is extracted through the first electrode 301 is used; therefore, the substrate 300 is formed of a light-transmitting material. However, in a case where light is extracted through a second electrode 305, for example, a metal substrate including a stainless steel substrate, a substrate obtained by formation of an insulating film over a surface of a silicon substrate, a ceramic substrate, or the like may also be used in addition to the above-described substrate. In general, a substrate formed of a synthetic resin with flexibility such as plastic tends to have lower heat-resistance temperature than the above-described substrate; however, such a substrate can be used as long as it can withstand a processing temperature in a manufacturing process.

Figure 17A:
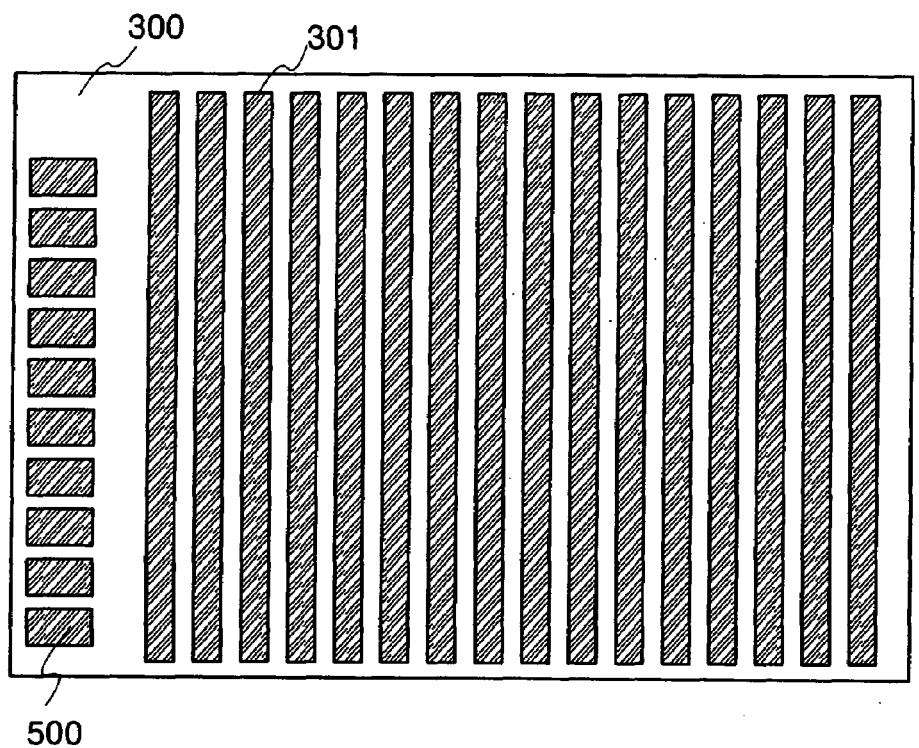
FIGS. 17A and 17B are top views each explaining a manufacturing method of a passive matrix light-emitting device of the present invention.
Figure 17B:
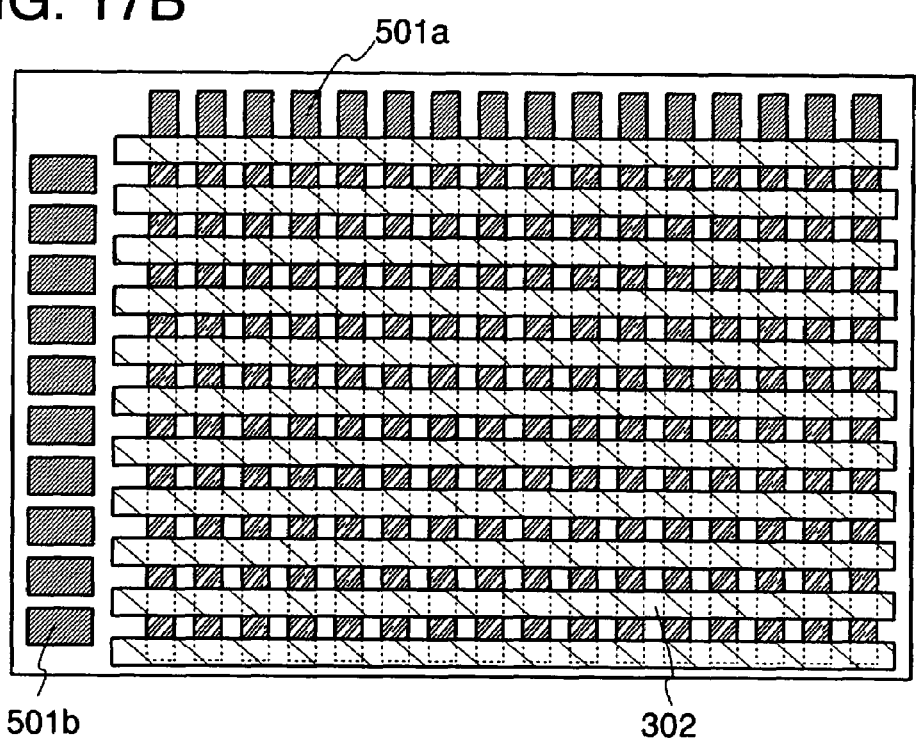

Next, as shown in FIG. 17B, auxiliary electrodes 501a and 501b are formed in an input terminal portion formation region of the first electrode 301 and a connection portion and input terminal portion formation region of the second electrode 305. When the auxiliary electrode is connected to an external circuit, the auxiliary electrode is preferably formed of a conductive material with a good heat-sealing property and the auxiliary electrode may be formed of a metal material containing chromium, nickel, or the like. Then, a partition layer 302 is formed. The partition layer 302 is provided so as to be orthogonal to the first electrode 301. The partition layer 302 can be formed of an inorganic insulating material such as silicon oxide, silicon nitride, silicon oxynitride, aluminum oxide, aluminum nitride, or aluminum oxynitride; acrylic acid; methacrylic acid; a derivative thereof; a heat-resistant high molecular material such as polyimide, aromatic polyamide, or polybenzimidazole; or siloxane.

Figure 18A:
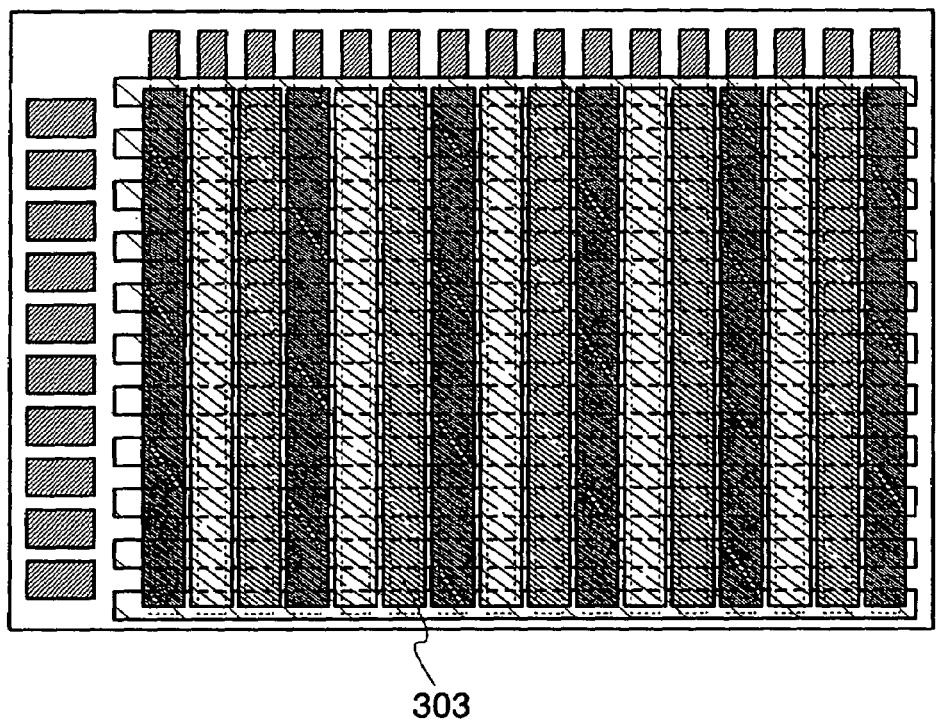
FIGS. 18A and 18B are top views each explaining a manufacturing method of a passive matrix light-emitting device of the present invention.

Thereafter, as shown in FIG. 18A, a first light-emitting unit 303 is formed over the first electrode 301 exposed from the partition layer 302. In this embodiment mode, the light-emitting unit 303 is formed in such a manner that one of three types of light-emitting units each having a light-emitting material exhibiting one of three colors (Red, Green or Blue) is formed every column. It is needless to say that all pixels may be provided with the same light-emitting unit. It is to be noted that, in this embodiment mode, a portion where the first electrode 301 is exposed from the partition layer 302 becomes a light-emitting region.

Figure 18B:
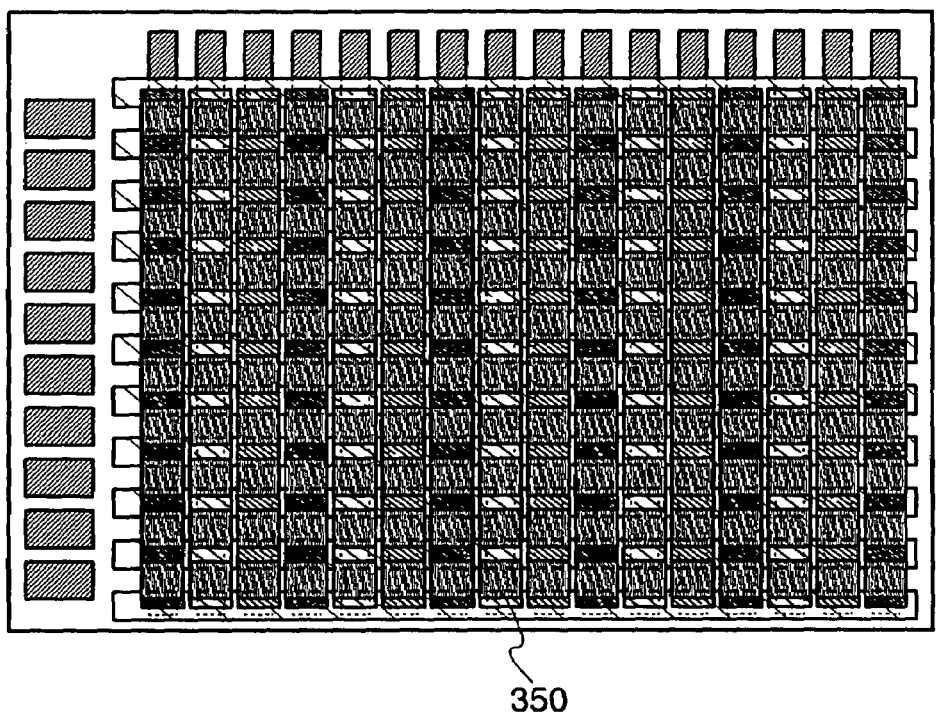

Subsequently, as shown in FIG. 18B, an intermediate conductive layer 350 is separated in each pixel to be provided. In addition, edges of each intermediate conductive layer 350 are provided outside edges of the light-emitting region. Accordingly, the light-emitting region can be covered with the intermediate conductive layer 350 even if a little misalignment of a mask is caused. Thus, deterioration in display quality is not caused and defects due to the misalignment of the mask can be reduced.

Figure 19A:
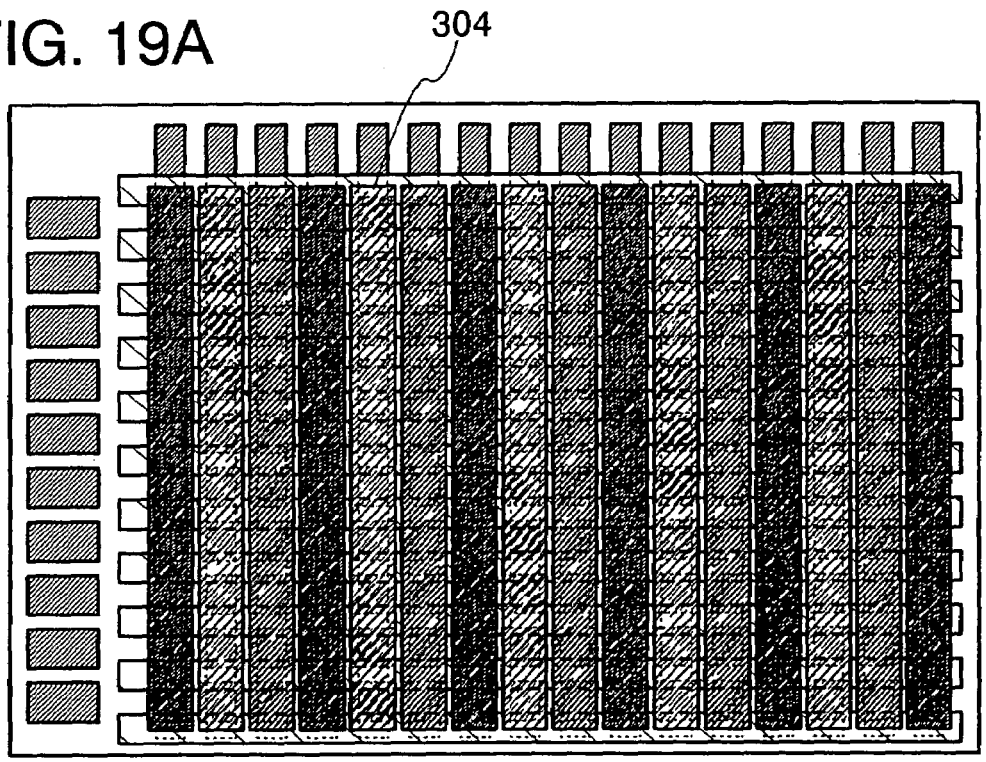
FIGS. 19A and 19B are top views each explaining a manufacturing method of a passive matrix light-emitting device of the present invention.

Next, as shown in FIG. 19A, a second light-emitting unit 304 is formed over the intermediate conductive layer 350. In a similar manner as the first light-emitting unit 303, the second light-emitting unit 304 is formed in such a manner that one of three types of light-emitting units each having a light-emitting material exhibiting one of three colors (Red, Green or Blue) is formed every column. Accordingly, the edges of the intermediate conductive layer 350 can be covered with the first light-emitting unit 303 and the second light-emitting unit 304, and the intermediate conductive layer 350 is separated in each pixel; therefore, crosstalk between adjacent pixels can be adequately reduced. Accordingly, a light-emitting device with high light emission efficiency by the first light-emitting unit 303 and the second light-emitting unit 304, and the light-emitting device with high display quality in which crosstalk between adjacent pixels is adequately reduced can be obtained.

Figure 19B:
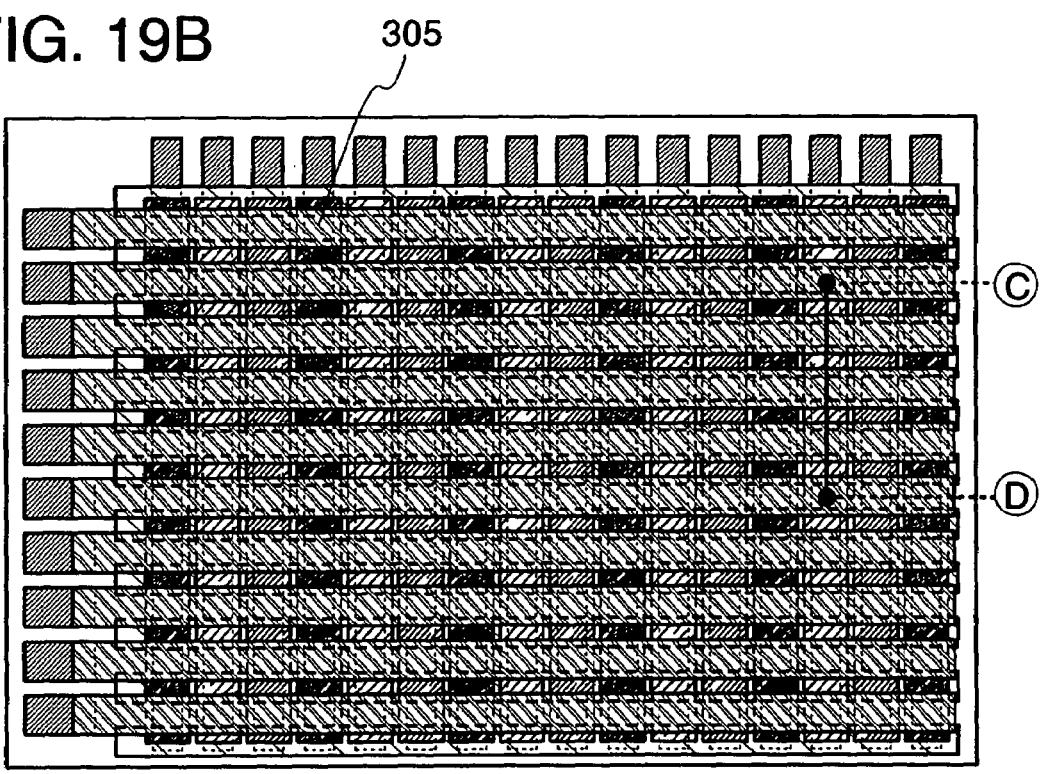

As shown in FIG. 19B, over the first electrode 301, the second electrode 305 extending in a direction which is orthogonal to the first electrode 301 is formed in a region where the first light-emitting unit 303, the intermediate conductive layer 350, and the second light-emitting unit 304 are formed.

As described above, a panel including a pixel portion in which a light-emitting element is formed is formed. It is to be noted that the cross-sectional views of the passive matrix light-emitting device shown in Embodiment Modes 1 to 4 correspond to a cross-sectional view taken along a line C-D of FIG. 19B.

Figure 20A:
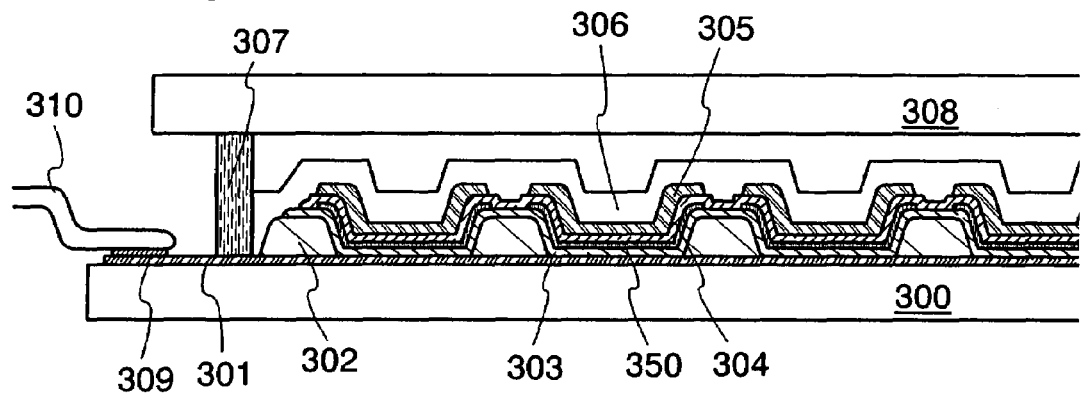
FIGS. 20A and 20B are a cross-sectional view and a plane view of a light-emitting device of the present invention, respectively.

Thereafter, as shown in FIG. 20A, a protective film 306 for preventing moisture from entering is formed, and a sealing substrate 308 formed of a ceramic material such as glass, quartz, or alumina, or a synthetic material is firmly fixed thereto with an adhesive 307 for sealing. In addition, an external input terminal portion is connected to an external circuit with the use of a flexible printed circuit 310 through an anisotropic conductive film 309. The protective film 306 may be formed using silicon nitride, or may be formed of a stacked-layer body including carbon nitride and silicon nitride as a structure for increasing a gas barrier property while reducing stress.

Figure 20B:
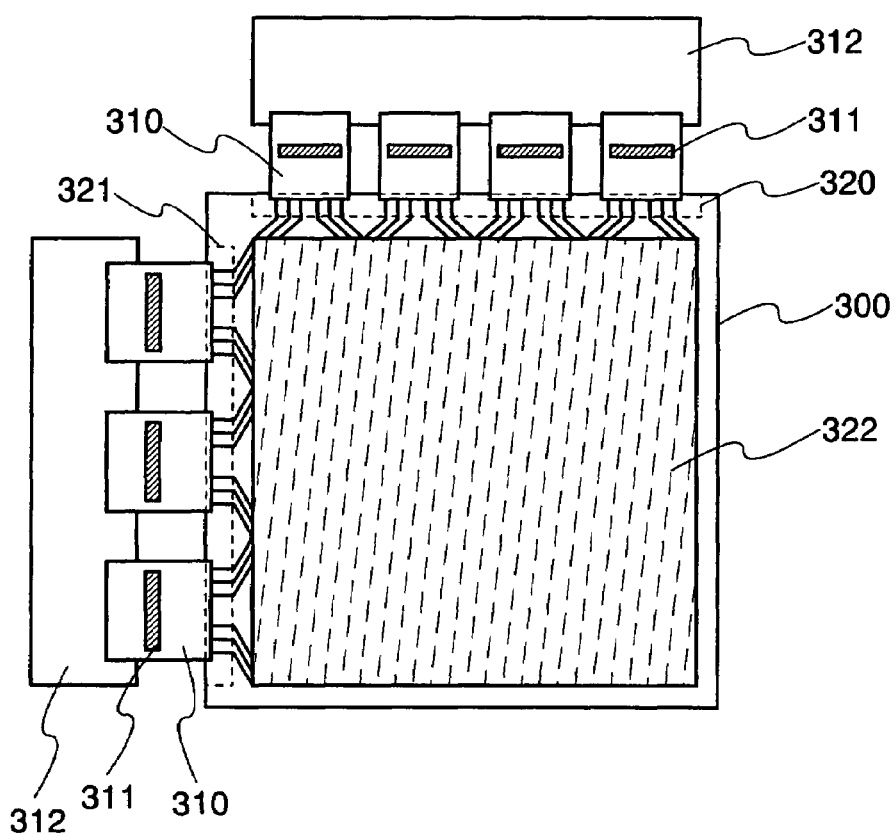

FIG. 20B shows a state of a module which is formed by connecting an external circuit 312 to a panel shown in FIG. 20A. A pixel portion 322 is formed over a substrate 300. Edges of the substrate 300 are provided with external input terminal portions 320 and 321 connected to the external circuits 312. In the module, flexible printed circuits 310 are firmly fixed to the external input terminal portions 320 and 321, and are electrically connected to external circuit substrates provided with power supply circuits or signal processing circuits. A driver IC 311 which is one of the external circuits 312 may be mounted by either a COG method or a TAB method. FIG. 20B shows a state in which the driver IC 311 which is one of the external circuits is mounted by a COG method.

It is to be noted that the panel and the module correspond to one mode of the light-emitting device of this embodiment mode, and both are included in the category of this embodiment mode.

Embodiment Mode 12

As an electronic appliance of this embodiment mode in which a module of this embodiment mode is mounted, the following can be given: a camera such as a video camera or a digital camera; goggle type display (head mounted display); a navigation system; an audio reproducing device (such as a car audio component); a computer, a game machine; mobile information terminal (such as a mobile computer, a mobile phone, a portable game machine, or an electronic book); an image reproducing device provided with a recording medium (specifically, a device for reproducing a recording medium such as a Digital Versatile Disc (DVD) and has a display capable of displaying the reproduced image). Specific examples of these electronic appliances will be shown in FIGS. 23A to 23E.

Figure 23A:
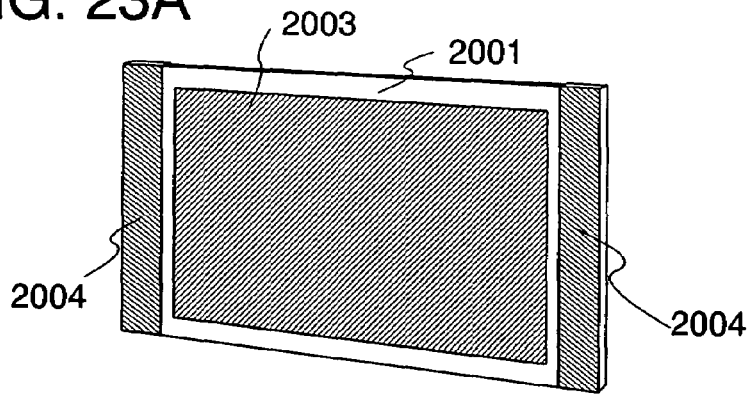
FIGS. 23A to 23E are views each showing an electronic appliance to which the present invention can be applied as an example.

FIG. 23A shows a light-emitting device, and a monitor of a television receiver or a personal computer, or the like corresponds thereto. The light-emitting device includes a housing 2001, a display portion 2003, a speaker portion 2004, and the like. The display portion 2003 of the light-emitting device of this embodiment mode has high display quality. In order to increase contrast, the pixel portion may be provided with a polarizing plate or a circularly polarizing plate. For example, a sealing substrate may be provided with a ¼ λ plate, a ½ λ plate, and a polarizing plate in this order. Furthermore, an antireflection film may be provided on the polarizing plate.

Figure 23B:
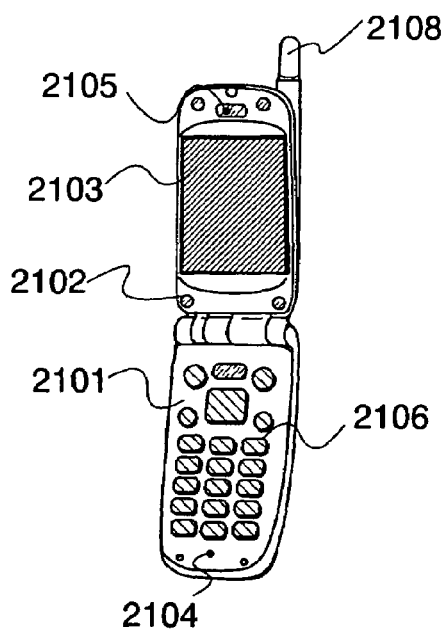

FIG. 23B shows a mobile phone, which includes a main body 2101, a housing 2102, a display portion 2103, a sound input portion 2104, a sound output 2105, operation keys 2106, an antenna 2108, and the like. The display portion 2103 of the mobile phone of this embodiment mode has high display quality.

Figure 23C:
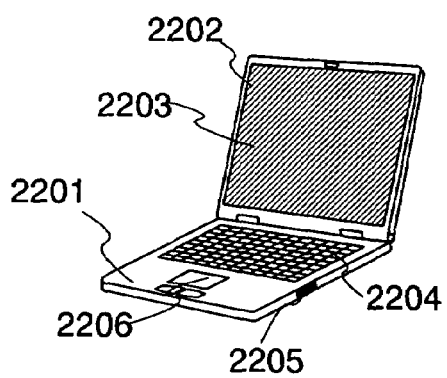

FIG. 23C shows a computer, which includes a main body 2201, a housing 2202, a display portion 2203, a keyboard 2204, an external connection port 2205, a touchpad 2206, and the like. The display portion 2203 of the computer of this embodiment mode has high display quality. Although a laptop computer is exemplified in FIG. 23C, the present invention can also be applied to a desktop computer in which a hard disk and a display portion are combined, or the like.

Figure 23D:
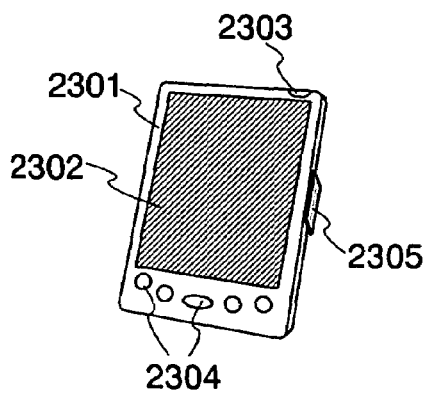

FIG. 23D shows a mobile computer, which includes a main body 2301, a display portion 2302, a switch 2303, operation keys 2304, an infrared port 2305, and the like. The display portion 2303 of the mobile computer of this embodiment mode has high image quality.

Figure 23E:
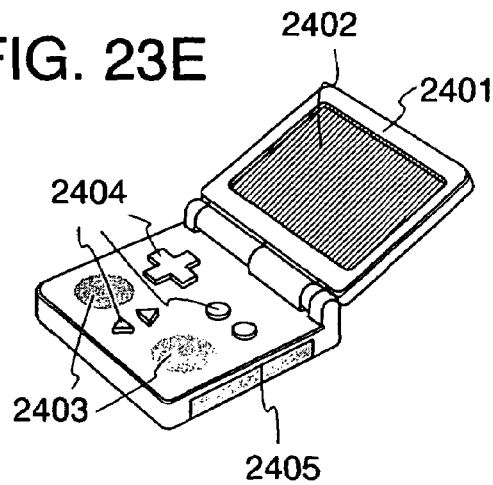

FIG. 23E shows a portable game machine, which includes a housing 2401, a display portion 2402, a speaker portion 2403, operation keys 2404, a recording medium insertion portion 2405, and the like. The display portion 2402 of the portable game machine of this embodiment mode has high display quality.

As described above, the application range of the present invention is extremely wide, and the present invention can be used for electronic appliances in all fields.

This application is based on Japanese Patent Application serial no. 2006-049322 filed in Japan Patent Office on Feb. 24, 2006, the entire contents of which are hereby incorporated by reference.

What is claimed is:

1. A light-emitting device comprising:
    a light-emitting element comprising a plurality of light-emitting units and an intermediate conductive layer between a pair of electrodes,
    wherein each of the plurality of light-emitting units comprises a light-emitting layer including a base material which is an impurity element and a compound containing an element belonging to group 2 and an element belonging to group 16, and
    wherein the plurality of light-emitting units are connected in series with the intermediate conductive layer interposed therebetween.

2. A light-emitting device comprising:
    a light-emitting element comprising a plurality of light-emitting units and an intermediate conductive layer between a pair of electrodes,
    wherein each of the plurality of light-emitting units comprises a light-emitting layer including a base material which is an impurity element and a compound containing an element belonging to group 12 and an element belonging to group 16, and
    wherein the plurality of light-emitting units are connected in series with the intermediate conductive layer interposed therebetween.

3. A light-emitting device comprising:
    a pixel portion including a plurality of light-emitting elements, each of the plurality of light-emitting elements comprising:
        a plurality of light-emitting units and an intermediate conductive layer between a pair of electrodes, wherein each of the plurality of light-emitting units comprises a light-emitting layer including a base material which is an impurity element and a compound containing an element belonging to group 2 and an element belonging to group 16, wherein the plurality of light-emitting units are connected in series with the intermediate conductive layer interposed therebetween, and wherein the intermediate conductive layer provided for each of the plurality of light-emitting elements is separate from each other.

4. A light-emitting device comprising:

a pixel portion including a plurality of light-emitting elements, each of the plurality of light-emitting elements comprising:

a plurality of light-emitting units and an intermediate conductive layer between a pair of electrodes, wherein each of the plurality of light-emitting units comprises a light-emitting layer including a base material which is an impurity element and a compound containing an element belonging to group 12 and an element belonging to group 16, wherein the plurality of light-emitting units are connected in series with the intermediate conductive layer interposed therebetween, and wherein the intermediate conductive layer provided for each of the plurality of light-emitting elements is separate from each other.

5. A light-emitting device comprising:

a pixel portion including a plurality of light-emitting elements and a plurality of partition layers, each of the plurality of light-emitting elements comprising:

a plurality of light-emitting units and an intermediate conductive layer between a pair of electrodes, wherein each of the plurality of light-emitting units comprises a light-emitting layer including a base material which is an impurity element and a compound containing an element belonging to group 2 and an element belonging to group 16, wherein the plurality of light-emitting units are connected in series with the intermediate conductive layer interposed therebetween, wherein the intermediate conductive layer provided for each of the plurality of light-emitting elements is separate from each other, and wherein edges of the intermediate conductive layer are positioned over the plurality of partition layers.

6. A light-emitting device comprising:

a pixel portion including a plurality of light-emitting elements and a plurality of partition layers, each of the plurality of light-emitting elements comprising:

a plurality of light-emitting units and an intermediate conductive layer between a pair of electrodes, wherein each of the plurality of light-emitting units comprises a light-emitting layer including a base material which is an impurity element and a compound containing an element belonging to group 12 and an element belonging to group 16, wherein the plurality of light-emitting units are connected in series with the intermediate conductive layer interposed therebetween, wherein the intermediate conductive layer provided for each of the plurality of light-emitting elements is separate from each other, and wherein edges of the intermediate conductive layer are positioned over the plurality of partition layers.

7. A light-emitting device according to claim 1, wherein the base material is a material selected from the group consisting of zinc sulfide, cadmium sulfide, calcium sulfide, yttrium sulfide, gallium sulfide, strontium sulfide, barium sulfide, zinc oxide, yttrium oxide, aluminum nitride, gallium nitride, indium nitride, zinc selenide, zinc telluride, calcium gallium sulfide, strontium gallium sulfide, and barium gallium sulfide.

8. A light-emitting device according to claim 2, wherein the base material is a material selected from the group consisting of zinc sulfide, cadmium sulfide, calcium sulfide, yttrium sulfide, gallium sulfide, strontium sulfide, barium sulfide, zinc oxide, yttrium oxide, aluminum nitride, gallium nitride, indium nitride, zinc selenide, zinc telluride, calcium gallium sulfide, strontium gallium sulfide, and barium gallium sulfide.

9. A light-emitting device according to claim 3, wherein the base material is a material selected from the group consisting of zinc sulfide, cadmium sulfide, calcium sulfide, yttrium sulfide, gallium sulfide, strontium sulfide, barium sulfide, zinc oxide, yttrium oxide, aluminum nitride, gallium nitride, indium nitride, zinc selenide, zinc telluride, calcium gallium sulfide, strontium gallium sulfide, and barium gallium sulfide.

10. A light-emitting device according to claim 4, wherein the base material is a material selected from the group consisting of zinc sulfide, cadmium sulfide, calcium sulfide, yttrium sulfide, gallium sulfide, strontium sulfide, barium sulfide, zinc oxide, yttrium oxide, aluminum nitride, gallium nitride, indium nitride, zinc selenide, zinc telluride, calcium gallium sulfide, strontium gallium sulfide, and barium gallium sulfide.

11. A light-emitting device according to claim 5, wherein the base material is a material selected from the group consisting of zinc sulfide, cadmium sulfide, calcium sulfide, yttrium sulfide, gallium sulfide, strontium sulfide, barium sulfide, zinc oxide, yttrium oxide, aluminum nitride, gallium nitride, indium nitride, zinc selenide, zinc telluride, calcium gallium sulfide, strontium gallium sulfide, and barium gallium sulfide.

12. A light-emitting device according to claim 6, wherein the base material is a material selected from the group consisting of zinc sulfide, cadmium sulfide, calcium sulfide, yttrium sulfide, gallium sulfide, strontium sulfide, barium sulfide, zinc oxide, yttrium oxide, aluminum nitride, gallium nitride, indium nitride, zinc selenide, zinc telluride, calcium gallium sulfide, strontium gallium sulfide, and barium gallium sulfide.

13. A light-emitting device according to claim 1, wherein the impurity element comprises a metal element which is an emission center.

14. A light-emitting device according to claim 2, wherein the impurity element comprises a metal element which is an emission center.

15. A light-emitting device according to claim 3, wherein the impurity element comprises a metal element which is an emission center.

16. A light-emitting device according to claim 4, wherein the impurity element comprises a metal element which is an emission center.

17. A light-emitting device according to claim 5, wherein the impurity element comprises a metal element which is an emission center.

18. A light-emitting device according to claim 6, wherein the impurity element comprises a metal element which is an emission center.

19. A light-emitting device according to claim 13, wherein the metal element comprises an element selected from the group consisting of fluorine (F), chlorine (Cl), bromine (Br), iodine (I), boron (B), aluminum (Al), gallium (Ga), indium (In) and thallium (Tl), and an element selected from the group consisting of lithium (Li), sodium (Na), potassium (K), rubidium (Rb), cesium (Cs), nitrogen (N), phosphorus (P), arsenic (As), antimony (Sb) and bismuth (Bi).

20. A light-emitting device according to claim 14, wherein the metal element comprises an element selected from the group consisting of fluorine (F), chlorine (Cl), bromine (Br), iodine (I), boron (B), aluminum (Al), gallium (Ga), indium (In) and thallium (Tl), and an element selected from the group consisting of lithium (Li), sodium (Na), potassium (K), rubidium (Rb), cesium (Cs), nitrogen (N), phosphorus (P), arsenic (As), antimony (Sb) and bismuth (Bi).

21. A light-emitting device according to claim 15, wherein the metal element comprises an element selected from the group consisting of fluorine (F), chlorine (Cl), bromine (Br), iodine (I), boron (B), aluminum (Al), gallium (Ga), indium (In) and thallium (Tl), and an element selected from the group consisting of lithium (Li), sodium (Na), potassium (K), rubidium (Rb), cesium (Cs), nitrogen (N), phosphorus (P), arsenic (As), antimony (Sb) and bismuth (Bi).

22. A light-emitting device according to claim 16, wherein the metal element comprises an element selected from the group consisting of fluorine (F), chlorine (Cl), bromine (Br), iodine (I), boron (B), aluminum (Al), gallium (Ga), indium (In) and thallium (Tl), and an element selected from the group consisting of lithium (Li), sodium (Na), potassium (K), rubidium (Rb), cesium (Cs), nitrogen (N), phosphorus (P), arsenic (As), antimony (Sb) and bismuth (Bi).

23. A light-emitting device according to claim 17, wherein the metal element comprises an element selected from the group consisting of fluorine (F), chlorine (Cl), bromine (Br), iodine (I), boron (B), aluminum (Al), gallium (Ga), indium (In) and thallium (Tl), and an element selected from the group consisting of lithium (Li), sodium (Na), potassium (K), rubidium (Rb), cesium (Cs), nitrogen (N), phosphorus (P), arsenic (As), antimony (Sb) and bismuth (Bi).

24. A light-emitting device according to claim 18, wherein the metal element comprises an element selected from the group consisting of fluorine (F), chlorine (Cl), bromine (Br), iodine (I), boron (B), aluminum (Al), gallium (Ga), indium (In) and thallium (Tl), and an element selected from the group consisting of lithium (Li), sodium (Na), potassium (K), rubidium (Rb), cesium (Cs), nitrogen (N), phosphorus (P), arsenic (As), antimony (Sb) and bismuth (Bi).

25. A light-emitting device according to claim 13, wherein the metal element is contained at a concentration of 0.05 to 5 atomic % with respect to the base material.

26. A light-emitting device according to claim 14, wherein the metal element is contained at a concentration of 0.05 to 5 atomic % with respect to the base material.

27. A light-emitting device according to claim 15, wherein the metal element is contained at a concentration of 0.05 to 5 atomic % with respect to the base material.

28. A light-emitting device according to claim 16, wherein the metal element is contained at a concentration of 0.05 to 5 atomic % with respect to the base material.

29. A light-emitting device according to claim 17, wherein the metal element is contained at a concentration of 0.05 to 5 atomic % with respect to the base material.

30. A light-emitting device according to claim 18, wherein the metal element is contained at a concentration of 0.05 to 5 atomic % with respect to the base material.

31. An electronic appliance having the light-emitting device according to claim 1, wherein the electronic appliance is one selected from the group consisting of a camera such as a video camera and a digital camera, goggle type display, a navigation system, an audio reproducing device, a computer, a game machine, mobile information terminal and an image reproducing device provided with a recording medium.

32. An electronic appliance having the light-emitting device according to claim 2, wherein the electronic appliance is one selected from the group consisting of a camera such as a video camera and a digital camera, goggle type display, a navigation system, an audio reproducing device, a computer, a game machine, mobile information terminal and an image reproducing device provided with a recording medium.

33. An electronic appliance having the light-emitting device according to claim 3, wherein the electronic appliance is one selected from the group consisting of a camera such as a video camera and a digital camera, goggle type display, a navigation system, an audio reproducing device, a computer, a game machine, mobile information terminal and an image reproducing device provided with a recording medium.

34. An electronic appliance having the light-emitting device according to claim 4, wherein the electronic appliance is one selected from the group consisting of a camera such as a video camera and a digital camera, goggle type display, a navigation system, an audio reproducing device, a computer, a game machine, mobile information terminal and an image reproducing device provided with a recording medium.

35. An electronic appliance having the light-emitting device according to claim 5, wherein the electronic appliance is one selected from the group consisting of a camera such as a video camera and a digital camera, goggle type display, a navigation system, an audio reproducing device, a computer, a game machine, mobile information terminal and an image reproducing device provided with a recording medium.

36. An electronic appliance having the light-emitting device according to claim 6, wherein the electronic appliance is one selected from the group consisting of a camera such as a video camera and a digital camera, goggle type display, a navigation system, an audio reproducing device, a computer, a game machine, mobile information terminal and an image reproducing device provided with a recording medium.

37. A light-emitting device according to claim 1, wherein the light-emitting device is an inorganic light-emitting device.

38. A light-emitting device according to claim 2, wherein the light-emitting device is an inorganic light-emitting device.

39. A light-emitting device according to claim 3, wherein the light-emitting device is an inorganic light-emitting device.

40. A light-emitting device according to claim 4, wherein the light-emitting device is an inorganic light-emitting device.

41. A light-emitting device according to claim 5, wherein the light-emitting device is an inorganic light-emitting device.

42. A light-emitting device according to claim 6, wherein the light-emitting device is an inorganic light-emitting device.

43. A light-emitting device comprising:
a first light-emitting unit comprising a first light-emitting layer formed over a first electrode;
an intermediate conductive layer formed over the first light-emitting unit;

a second light-emitting unit comprising a second light-emitting layer formed over the intermediate conductive layer; and a second electrode formed over the second light-emitting unit, wherein each of the first light-emitting layer and the second light-emitting layer comprises a base material which is a compound containing an element belonging to group 2 and an element belonging to group 16 and an impurity element, and wherein the first light-emitting unit is in contact with the second light-emitting unit.

44. A light-emitting device according to claim 43, wherein the base material is a material selected from the group consisting of zinc sulfide, cadmium sulfide, calcium sulfide, yttrium sulfide, gallium sulfide, strontium sulfide, barium sulfide, zinc oxide, yttrium oxide, aluminum nitride, gallium nitride, indium nitride, zinc selenide, zinc telluride, calcium gallium sulfide, strontium gallium sulfide, and barium gallium sulfide.

45. A light-emitting device according to claim 43, wherein the impurity element comprises a metal element which is an emission center.

46. A light-emitting device according to claim 45, wherein the metal element comprises an element selected from the group consisting of fluorine (F), chlorine (Cl), bromine (Br), iodine (I), boron (B), aluminum (Al), gallium (Ga), indium (In) and thallium (Tl), and an element selected from the group consisting of lithium (Li), sodium (Na), potassium (K), rubidium (Rb), cesium (Cs), nitrogen (N), phosphorus (P), arsenic (As), antimony (Sb) and bismuth (Bi).

47. A light-emitting device according to claim 45, wherein the metal element is contained at a concentration of 0.05 to 5 atomic % with respect to the base material.

48. An electronic appliance having the light-emitting device according to claim 43, wherein the electronic appliance is one selected from the group consisting of a camera such as a video camera and a digital camera, goggle type display, a navigation system, an audio reproducing device, a computer, a game machine, mobile information terminal and an image reproducing device provided with a recording medium.

49. A light-emitting device according to claim 43, wherein the light-emitting device is an inorganic light-emitting device.

* * * * *